US012784797B2

(12) United States Patent
Reohr

(10) Patent No.: US 12,784,797 B2
(45) Date of Patent: Nov. 3, 2026

(54) METHODS AND CIRCUITS FOR READING AND WRITING PI-STATE-INDUCED CIRCULATING CURRENTS INTO SUPERCONDUCTING CIRCUITS CONTAINING MAGNETIC JOSEPHSON JUNCTIONS

(71) Applicant: William Robert Reohr, Severna Park, MD (US)

(72) Inventor: William Robert Reohr, Severna Park, MD (US)

( * ) Notice: Subject to any disclaimer, the term of this patent is extended or adjusted under 35 U.S.C. 154(b) by 391 days.

(21) Appl. No.: 18/478,140

(22) Filed: Sep. 29, 2023

(65) Prior Publication Data

US 2024/0212733 A1 Jun. 27, 2024

Related U.S. Application Data

(60) Provisional application No. 63/434,654, filed on Dec. 22, 2022.

(51) Int. Cl.
*G11C 11/16* (2006.01)
*G11C 11/44* (2006.01)

(52) U.S. Cl.
CPC ........ *G11C 11/1675* (2013.01); *G11C 11/161* (2013.01); *G11C 11/1653* (2013.01); *G11C 11/1673* (2013.01); *G11C 11/44* (2013.01)

(58) Field of Classification Search
CPC ............................................ G11C 11/16–1697
See application file for complete search history.

(56) References Cited

U.S. PATENT DOCUMENTS 9,174,840 B2 11/2015 Herr et al.
9,520,181 B1 12/2016 Miller et al.
(Continued)

FOREIGN PATENT DOCUMENTS

JP 2016535383 A 11/2016
JP 2018514893 A 6/2018
(Continued)

OTHER PUBLICATIONS

International Search Report and Written Opinion for PCT/US2023/085625 mailed May 24, 2024, 14 pages.
(Continued)

*Primary Examiner* — Alfredo Bermudez Lozada
(74) *Attorney, Agent, or Firm* — Myers Bigel, P.A.

(57) ABSTRACT

A write circuit for an MJJ-based memory circuit includes first and second current sources configured to generate first and second currents, respectively. The first current imparting an easy axis magnetic field component on an MJJ in a selected memory cell during a write operation. The second current inducing a third current in the selected memory cell that passes through the MJJ, the third current being a seed current for setting a π-state current of the MJJ in a superconducting loop of the selected memory cell. The first current source is configured such that, during the write operation, the MJJ cell transitions: (i) from a π-state, in which a clockwise or counter-clockwise current circulates in the superconducting loop, to a zero-state, in which no current circulates in the superconducting loop, back to the π-state; or (ii) from the zero-state to the π-state; or (iii) from the π-state to the zero-state.

20 Claims, 29 Drawing Sheets

(56) References Cited

U.S. PATENT DOCUMENTS

| | | | |
|---|---|---|---|
| 9,595,970 B1 | 3/2017 | Reohr et al. | |
| 10,204,677 B1 * | 2/2019 | Luo ......................... | G11C 11/44 |
| 11,476,842 B1 | 10/2022 | Bhattacharya et al. | |
| 2020/0028512 A1 | 1/2020 | Reohr et al. | |
| 2020/0075093 A1 | 3/2020 | Naaman | |
| 2020/0295249 A1 | 9/2020 | Ambrose et al. | |
| 2024/0005986 A1 | 1/2024 | Reohr | |

FOREIGN PATENT DOCUMENTS

| | | |
|---|---|---|
| JP | 2018174015 A | 11/2018 |
| JP | 2018536250 A | 12/2018 |
| JP | 2019514255 A | 5/2019 |
| WO | 2023183391 A1 | 9/2023 |

OTHER PUBLICATIONS

Reohr, U.S. Appl. No. 17/993,586, filed Nov. 23, 2022 entitled "Superconducting Distributed Bidirectional Current Driver System".

Japanese Office Action corresponding to Japanese Patent Application No. 2025-510349 (Foreign Text, 4 Pages, English Translation Thereof, 4 Pages) (mailed Sep. 25, 2025).

Examination Report in corresponding Australian Patent Application No. 2023412851 (Apr. 1, 2025).

Dayton et al. "Experimental Demonstration of a Josephson Magnetic Memory Cell With a Programmable π-Junction" IEEE Magnetic Letters, vol. 9 (Feb. 8, 2018).

* cited by examiner

METHODS AND CIRCUITS FOR READING AND WRITING PI-STATE-INDUCED CIRCULATING CURRENTS INTO SUPERCONDUCTING CIRCUITS CONTAINING MAGNETIC JOSEPHSON JUNCTIONS

CROSS-REFERENCE TO RELATED APPLICATION(S)

This application claims the benefit of and priority under 35 U.S.C. § 119 to U.S. provisional patent application No. 63/434,654, filed on Dec. 22, 2022, entitled "Reading and Writing Memory Circuits Having Magnetic Josephson Junctions," the disclosure of which is incorporated by reference herein in its entirety for all purposes.

BACKGROUND

The present invention relates generally to quantum and classical digital superconducting circuits and systems, and more particularly to enhanced techniques for reading and writing magnetic Josephson junctions which store state within superconducting memory circuits.

Superconducting Josephson junctions with magnetic barriers, also referred to as magnetic Josephson junctions (MJJs), can serve as the basis for Josephson magnetic random-access memory (JMRAM). JMRAM relies on the oscillation of a relative Cooper pair phase with magnetic layer thickness to produce junctions that exhibit a Josephson phase of either zero or π, depending on the relative magnetic layer orientation. This binary phase switching characteristic of an MJJ can be exploited to create superconducting memory elements capable of storing a logical "0" or logical "1" state indicative of the zero or π Josephson phase, respectively. Memory unit elements can be arranged in arrays with read and write lines to create an addressable memory fabricated, for example, on an integrated circuit (IC) chip that can be cooled to cryogenic temperatures (e.g., around four degrees Kelvin).

More broadly speaking, it is important to note that, in addition to random-access memory (RAM), the term "superconducting memory" (or "memory") can refer to read-only memories (ROMs), content-addressable memories (CAMs), programmable logic array (PLAs), and field-programmable gate arrays (FPGAs). For ROMs, PLAs and FPGAs, the underlying "state" memory defines output or logic function.

JMRAM appears to be an important approach to making cost-sensitive memory (i.e., highly dense, high-capacity memory) for superconducting systems commercially viable and is thus being actively developed. Unfortunately, conventional attempts to successfully implement MJJ-based memory circuits are currently speculative at best. It is thus evident that cost and reliability issues, like manufacturing complexity (e.g., levels of metal, etc.), remain that prevent such a superconducting memory from being viably fabricated and commercialized.

SUMMARY

The present invention, as manifested in one or more embodiments, some of which are disclosed herein, provides a system, circuits, device and/or methods that enable the reliable writing of magnetic Josephson Junctions (MJJs) which may form underlying memory elements (configuration memory elements) for setting the phase (e.g., Boolean state) of, for example, superconducting programmable logic arrays (PLAs), field-programmable gate arrays (FPGAs), read only memories (ROMs), random access memories (RAMs) and π-junction circuits.

According to an embodiment of the invention, a write circuit for writing state into at least one memory cell in an MJJ-based memory circuit includes a first current source configured to generate a first current for imparting an easy axis magnetic field component on an MJJ in at least one selected memory cell among a plurality of memory cells in the memory circuit during a write operation. The write circuit further includes a second current source configured to generate a second current that induces a third current in the at least one selected memory cell that passes through the MJJ in the at least one selected memory cell during the write operation, the third current being a seed current for setting a π-state current of the MJJ in at least one superconducting loop of the at least one selected memory cell for a subsequent read operation. At least the first current source is configured such that, during the write operation, the MJJ in the selected memory cell transitions: (i) from a pi (π)-state, in which a clockwise or counter-clockwise current circulates in a superconducting loop in the at least one memory cell, to a zero-state, in which no current circulates in the superconducting loop, back to the π-state; or (ii) from the zero-state to the π-state; or (iii) from the π-state to the zero-state. In some embodiments, the write circuit further includes a control circuit coupled to at least the first current source, the control circuit being configured to control a direction of the first current to thereby control a direction of the easy axis field component imparted on the MJJ in the at least one selected memory cell.

In accordance with another embodiment, a method for writing state into at least one selected MJJ in a memory cell of an MJJ-based memory circuit includes: applying an easy axis magnetic field oriented in a first direction to the selected MJJ, the selected MJJ comprising a soft layer and a hard layer arranged in a stacked structure, the selected MJJ being configured in a π-state, in which a clockwise or counter-clockwise current circulates in a superconducting loop including the selected MJJ, wherein magnetic domain orientations of the soft and hard layers are parallel with respect to one another; increasing a magnitude of the applied easy axis magnetic field in the first direction such that the selected MJJ transitions to a zero-state, in which no current circulates in the superconducting loop, wherein the respective magnetic domain orientations of the soft and hard layers are anti-parallel with respect to each other; increasing the magnitude of the applied easy axis magnetic field further in the first direction while concurrently coupling into the superconducting loop including the selected MJJ a clockwise or counter-clockwise seed current, such that the selected MJJ transitions back to the π-state, wherein the respective magnetic domain orientations of the soft and hard layers are parallel with respect to each other; and removing the applied easy axis magnetic field such that the selected MJJ remains configured in the π-state, wherein the magnetic domain orientations of the soft and hard layers are aligned with one another, wherein a circulating current is trapped in the superconducting loop including the selected MJJ, a direction of the circulating current being a function of a direction of the seed current coupled into the superconducting loop.

In accordance with yet another embodiment, an MJJ circuit having ternary circulating currents for controlling circuit function of an analog circuit and/or digital circuit is provided. The MJJ circuit includes a first superconducting loop, comprising at least one MJJ and at least a first inductor. The MJJ circuit further includes a second superconducting loop, comprising at least one Josephson junction and at least a second inductor. A clockwise current, counter-clockwise current, and/or a zero-current in the first superconducting loop is configured to control a circulating current in the second superconducting loop. In some embodiments, the first and second inductors are included in a transformer configured such that there is a mutual inductance between the first and second inductors.

As the term may be used herein, "facilitating" an action includes performing the action, making the action easier, helping to carry the action out, or causing the action to be performed. Thus, by way of example only and without limitation, in the context of a processor-implemented method, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and configured to perform the exemplary method steps.

Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques, or elements thereof, set forth herein.

Techniques of the present invention can provide substantial beneficial technical effects. By way of example only and without limitation, techniques for enhanced reading and writing of MJJs in an array of superconducting MJJs and for reducing the area of a plurality of such MJJs and their support circuitry according to one or more embodiments of the invention may provide one or more of the following advantages, among other benefits:

- provides a write architecture for use in an MJJ-based system(s)/circuit(s) (e.g. superconducting PLAs, FPGAs, ROMs, RAMs and T-junction circuits) that allows individual selection of MJJs for a write/program operation in the system(s)/circuit(s) (e.g. can be an array of logic gates; array of memory cells) without adversely disturbing unselected MJJs, thereby increasing an integrity of the data in the system(s)/circuit(s);
- provides an improved write selection architecture and methodology for superconducting magnetic random access memories;
- provides a write selection architecture for MJJ-based system(s)/circuit(s) that has a substantially increased acceptable write disturb margin, thereby reducing a sensitivity of the MJJ-based system(s)/circuit(s) to MJJ device mismatches, process variations, and/or other environmental factors within an MJJ-based system(s)/circuit(s);
- revolutionizes the field of MJJ-based system(s)/circuit(s) by providing an improved write selection architecture and methodology for use with MJJ-based system(s)/circuit(s) that not only allows selection of individual MJJs without adversely disturbing unselected MJJs, but also reduces the overall sensitivity of the circuit to device mismatches, process variations and other environmental factors and can reduce the power consumed in the write operation; and
- supports operation as a ternary state (i.e., having three logical states) memory element for digital or analog circuits.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 1), according to one or more embodiments of the present invention;

FIG. 1), according to one or more embodiments of the present invention;

FIG. 1), according to one or more embodiments of the present invention;

FIG. 1), according to one or more embodiments of the present invention;

Figure 1:
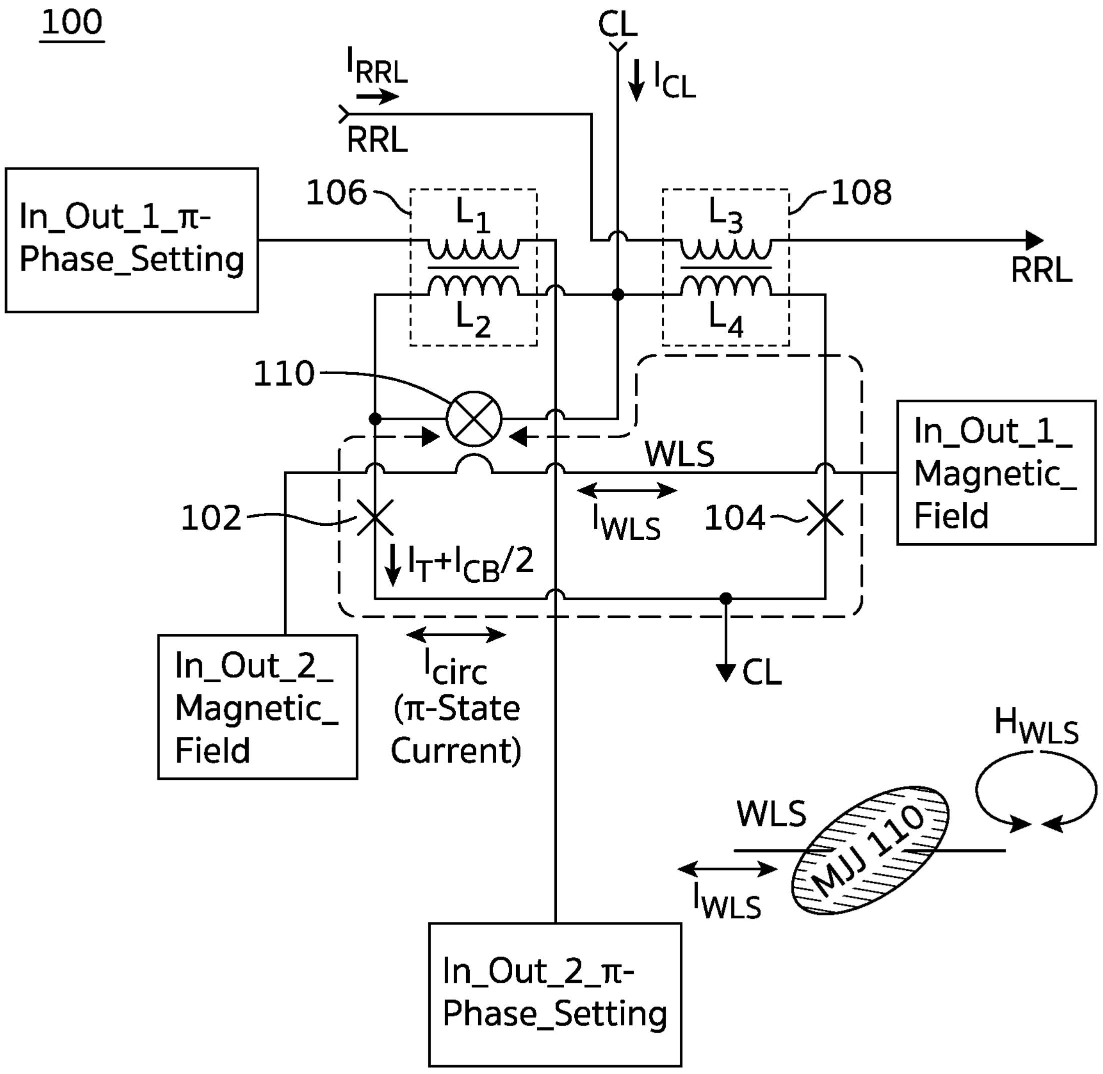
FIG. 1 is a schematic diagram depicting an exemplary MJJ-based memory circuit, according to one or more embodiments of the present invention.

It is to be appreciated that elements in the figures are illustrated for simplicity and clarity. Common but well-understood elements that may be useful or necessary in a commercially feasible embodiment are not necessarily shown in order to facilitate a less hindered view of the illustrated embodiments.

DETAILED DESCRIPTION

Principles of the present invention, as manifested in one or more embodiments, will be described herein in the context of quantum and classical digital superconducting circuits, and specifically may provide a system, device and/or methods for enabling the reliable writing of magnetic Josephson junctions (MJJs) embedded in a superconducting loop. MJJs can be integrated into superconducting circuits to form superconducting RAMs, superconducting PLAS, FPGAs, and π-junction circuits, among other applications. MJJs can be embedded in analog circuits. Thus, an MJJ is shown to be an extraordinarily flexible circuit element within the context of the present disclosure. Additionally, the possible state space of an MJJ in a superconducting loop may be ternary, as will be discussed with respect to an embodiment of the present invention. It is to be appreciated, however, that the inventive concept is not limited to the specific device(s), circuit(s) and/or method(s) illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

Throughout the present disclosure, the acronym for magnetic Josephson junction, “MJJ,” may be used broadly to define a programmable junction containing a magnetic spin valve (having a free magnetic layer and a fixed magnetic layer, or other combination(s) of layers and/or domains which result in the same or similar behavior), while the term “π-junction” may refer broadly to a junction containing only a single magnetic layer, with a fixed π phase shift. It should be understood that a spin-valve MJJ may be a preferred device for illustrative embodiments of the inventive concept. Sometimes, however, especially in some embodiments of the inventive concept, the term “MJJ” may describe “π-junctions” and other varieties of MJJs different from spin-valve MJJs.

In general, microwave signals, such as, for example, single/multi flux quantum (SFQ/MFQ) pulses, may be used to control the state of a memory cell in a memory array. During read/write operations, word-lines and bit-lines may be selectively activated by SFQ/MFQ pulses, or reciprocal quantum logic (RQL) pulses arriving via an address bus and via independent read and write control signals. These pulses may, in turn, control word-line and bit-line driver circuits adapted to selectively provide respective word-line and bit-line currents to the relevant memory cells in the memory array.

A Josephson magnetic random access memory (JMRAM) system can implement an array of JMRAM memory cells that each includes a phase hysteretic MJJ that can be configured as comprising ferromagnetic materials in an associated barrier. As an example, the MJJ can be configured as a junction switchable between a zero-phase state and a π-phase state (hence forward abbreviated as “zero-state” and “π-state”) that is configured to selectively generate a superconducting phase. The JMRAM memory cells can also each include at least one Josephson junction (e.g., a pair of Josephson junctions in parallel with the MJJ). The basic element in SFQ, RQL, and JMRAM circuits is the Josephson junction, which emits a voltage-time spike(s) with an integrated amplitude equal to an integral multiple of the flux quantum (Po) when the current through the Josephson junction exceeds a critical current, wherein the developed voltage opposes the current flow.

Illustrative embodiments of the present inventive concept may be beneficially suitable for use with conventional MJJs (e.g., of conventional memory circuits) switched/written (i) exclusively with magnetic fields, and (ii) with a combination of a magnetic field selection and phase-based torque.

In a binary application, the MJJ in an inductive loop can be configured to store a digital state corresponding to one of a first binary state (e.g., logic-1) or a second binary state (e.g., logic-0) in response to a write-word current, also known as a write row current, which passes between the terminals "In_Out_2_Magnetic_Field" and "In_Out_1_Magnetic_Field" of memory cell/circuit 100 of FIG. 1) and a write-bit current (also known as a write column current, which passes between the terminals "In_Out_2_π-Phase_Setting" and "In_Out_1_π-Phase_Setting" of memory cell/circuit 100 of FIG. 1) associated with the MJJ. For example, the first binary state can correspond to a positive π-state, in which a superconducting phase is exhibited. As an example, the write-word and write-bit currents can each be provided on an associated (e.g., coupled to the MJJ) write-word line and an associated write-bit line and together can set the logic state of a selected MJJ. As the term is used herein, a "selected" MJJ is defined as an MJJ selected for writing among a plurality of MJJs by activating current flow in its associated write-bit line WBL. Its digital state is written by a positive or negative current flow within its associated write-bit line. Moreover, if it is necessary to prevent the MJJ being set to an undesired negative π-state, the MJJ may include a directional write element that is configured to generate a directional bias current through the MJJ during a data-write operation. Thus, the MJJ can be forced into the positive or negative π-state to provide the superconducting phase in a predetermined direction.

As used herein, the term "MJJ" with respect to state (e.g., "positive π-state") is intended to describe both the phase behavior of the junction and the circulating current state in the superconducting loop. Furthermore, as will be described in further detail below, it is to be understood that the terms "negative" and "positive" as used herein to define particular π-state configurations of the MJJ, can be arbitrarily assigned and are merely used to distinguish one π-state configuration from another π-state configuration (e.g., having clockwise or counter-clockwise circulating currents associated therewith), rather than to indicate a particular polarity associated with the respective π-state configurations of the MJJ.

In addition, the MJJ in each of the JMRAM memory cells in the array may provide an indication of the stored digital state in response to a read-word current and a read-bit current. The superconducting phase can lower an effective critical current associated with at least one Josephson junction of each of the JMRAM memory cells of a row in the array. Therefore, the read-bit current and a derivative of the read-word current (which may be induced by a read-word current flowing through a transformer) can be provided, in combination, (i) to trigger the Josephson junction(s) to produce a voltage on an associated read-bit line if the MJJ stores a digital state corresponding to the first binary state, and (ii) not to trigger if the MJJ stores a digital state corresponding to the second binary state. Thus, the read-bit line can have a voltage present the magnitude of which varies based on whether the digital state of the MJJ corresponds to the binary logic-1 state or the binary logic-0 state (e.g., between a non-zero and a zero amplitude). As used herein, the term "trigger" with respect to Josephson junctions is intended to describe a phenomenon of the Josephson junction generating (a) discrete voltage pulse(s) in response to current flow through the Josephson junction exceeding a prescribed critical current level.

MJJ and Supercurrent Nomenclature

It is important to understand that, induced by the presence of a magnetic device (e.g., magnetic Josephson junction (MJJ)), spontaneous currents can flow (are induced) in opposite directions—clockwise or counter-clockwise—in superconducting loops containing at least one (i) T-junction; (ii) spin-valve MJJ, which is in the π-state; and (iii), in general, multilayered MJJs having a plurality of possible magnetic orientations, which, when set, drive each device in the π-state. These oppositely directed currents may be referred to as "positive π-state currents" and "negative π-state currents" hereafter, with the understanding that these terms can be arbitrarily assigned, as previously stated. Other currents can also be present in the superconducting loops.

As known in the art, magnetic layer material(s), thickness(es), and/or orientation(s) can be chosen to set magnetic devices into the π-state. A point of some confusion arises concerning the MJJ, which can be in a π-state or a zero-state (i.e., 0-state). In the absence of an applied magnetic field, clockwise or counter-clockwise π-state (circulating) currents, each having a stable state (given a double well potential for both in a π-state magnetic device in an appropriate inductive loop), are actually only ever associated with a superconducting loop itself, which contains a magnetic device that is always in the π-state. Therefore, there are two distinct concepts: those that refer to an MJJ state, π-state or a zero-state; and those that refer to the energetically similar states of the clockwise or counter-clockwise π-state (circulating) currents flowing in a superconducting loop containing an MJJ, specifically in a π-state.

The terms "zero-state" and "π-state" as used herein are intended to broadly refer to the respective MJJ layer orientations, relative to one another, and their associated layer properties, but not the state of the memory cell. Circulating and/or non-circulating states of a circuit, which can be used to store a first logical state, a second logical state, and even a third logical state (for ternary storage operation), can be exploited in some combination appropriate to the use and operation of a memory cell incorporating such MJJ device(s). To the degree that such states are intentional/stable states of the circuit, any set of states can be used, for example, to represent the first and second logical states for Boolean state storage (or first, second and third logical states for ternary storage configurations).

As will be known by those skilled in the relevant art, the magnetic layers of MJJs have domains, which have two preferred stable directions in which to point (in the magnetic systems of interest to embodiments of the invention). These directions will be referred to as "left" and "right," with the understanding that these are simply distinct directions arbitrarily chosen for ease of reference in distinguishing the different orientations in the context of a local directional magnetic field. The domains/layers also react to fields along two axes, which may be referred to as "easy" and "hard" axes. When there are multiple magnetic layers in a given device, these magnetic layers may be referred to as "soft" (free) and "hard" (fixed) layers, the terminology borrowed from existing similar structures with the understanding that in the present inventive concept, the terms may be used to describe which of the layers switches earlier (soft/free) rather than later (fixed/hard). Thus, a "fixed" layer as the term may be used herein may not necessarily refer to a layer whose magnetic orientation does not change, but instead may refer to a layer whose magnetic orientation changes later, under the influence of a higher magnetic field, relative to a "free" layer whose magnetic orientation changes earlier.

Memory Circuit Discussion

FIG. 1 is a schematic diagram depicting at least a portion of an exemplary memory circuit 100, according to one or more embodiments of the invention. The exemplary memory circuit 100 may include at least one JJ 102, 104, at least one transformer 106, 108, at least one magnetic device (e.g., a magnetic Josephson junction, abbreviated MJJ) 110, and at least one write line segment WLS, wherein a non-zero angular orientation exists between the write line segment WLS and the MJJ 110, the non-zero angle being indicated in the orientation of a major axis of an elliptical MJJ with respect to the orientation of WLS, to support the generation of at least an easy axis field component for application to MJJ 110. The easy axis field can be a component of an overall magnetic field $H_{WLS}$, noted on FIG. 1. The subscript "WLS" of $H_{WLS}$ indicates the magnetic field originates from a current $I_{WLS}$ conducted by a write line segment WLS. During a write operation, the memory circuit 100 is configured such that the MJJ 110 transitions from a π-state, through a zero-state, and back to a π-state, as the MJJ 110 is written with at least an easy axis magnetic field component in selecting the memory circuit 100 for a write operation, but otherwise remains in a π-state, so that superconducting loops within the memory circuit 100 can retain a clockwise or counter-clockwise (positive or negative) π-state current, $I_{circ}$ (abbreviated as circulating current $I_{circ}$ to indicate that the π-state current circulates within the memory circuit 100 during standby/state retention), for read operations directed to the memory circuit 100 and furthermore for state retention enabled within the memory circuit 100.

The write operations directed to the exemplary memory circuit 100 are different than conventional write operations. For example, in one or more embodiments, a unique coupling of an easy axis field (preferably along with a hard axis field) to select a given MJJ(s) for a write operation via the generation of a magnetic field $H_{WLS}$ by a write line segment current $I_{WLS}$ (or write row line currents $I_{WRL}$) passing through a write line segment WLS is enabled by one or more embodiments of the present invention. In a random access memory (as will be described with reference to FIG. 18), it is important to note that a plurality of series connected write line segments WLSs are referred to as a write row line WRL of its memory array.

At the core of many of the embodiments of the present invention, an easy axis coupling is indicated on the exemplary memory circuit 100 by a non-zero angular orientation of WLS with respect to the MJJ 110 (here indicated in the orientation of a major axis of an elliptical MJJ with respect to the orientation of WLS). It is noteworthy that labels WLS and MJJ 110 appear twice in FIG. 1 to bind the circuit topology of exemplary memory cell 100 to the non-zero-angular-orientation restriction placed on its MJJ 110. Rather complex write circuits and write methods to support the writing of memory circuit 100, having such a unique MJJ orientation, are described, and explained in terms of their physics, in subsequent sections.

In concluding this brief introduction to one aspect of the write operation, it is important to note the bidirectional currents, $I_{WLS}$ and the π-phase setting current are associated with (i) the selection of the memory cell 100 for a write operation and (ii) the setting of the direction of its internal circulating current $I_{circ}$, respectively. These bidirectional currents are driven through pairs of terminals: (i) In_Out_2_Magnetic_Field and In_Out_1_Magnetic_Field; and (2) In_Out_1_π-Phase_Setting current and In_Out_2_π-Phase_Setting current.

The read operation for the exemplary memory circuit 100 has already been disclosed in the prior art where Boolean states of the memory circuit 100 are expressed as clockwise and counter-clockwise (positive and negative) π-state currents, noted as a circulating current $I_{circ}$ on FIG. 1. To provide an understanding of memory cell 100, a brief introduction to its read operation will be provided subsequently. The subsequent discussion will later be augmented with respect to the detailed description of FIG. 15.

During a read operation, the memory circuit 100 of FIG. 1 can be modeled as a two-junction inductive loop with two sources of applied effective flux. As used herein, the term "effective flux" may refer to an applied current, magnetic field, or device configuration which deterministically changes an effective critical current of the inductive loop arrangement. In some embodiments, effective flux can be applied by a coupled-in magnetic field, treated as two superconducting lines coupled-in using superconducting transformers 106, 108. Effective flux may also be applied by driving the MJJ 110 into the π-state, which produces a π phase difference across the MJJ within the inductive loop, in accordance with other embodiments.

In some alternatives described in the prior art, the MJJ in the zero-state provides no additional effective flux to the inductive loop and thus the carefully selected readout flux biasing is not sufficient to generate a signal through its column line (CL) connections. Thus, these memory cell 100 to memory cell connections remain in their superconducting state. In the π-state, the additional effective flux of the MJJ together with the readout flux can be sufficient to drive the effective critical current of the inductive loop as a whole below the level needed to generate a readout signal (i.e., put the inductive loop into a voltage state). Without the effective flux of the MJJ, the effective critical current of the inductive loop may be less than the readout current, and therefore no output signal is generated. In the π-state, the phase difference across the MJJ imparts to the Josephson junctions 102, 104 an effective phase shift, similar to the effect of a current driven through the readout line. Thus, the circuit can be configured to require both the MJJ effective flux and the physical applied flux in order to drive the junctions 102, 104 into a voltage state.

Figure 15:
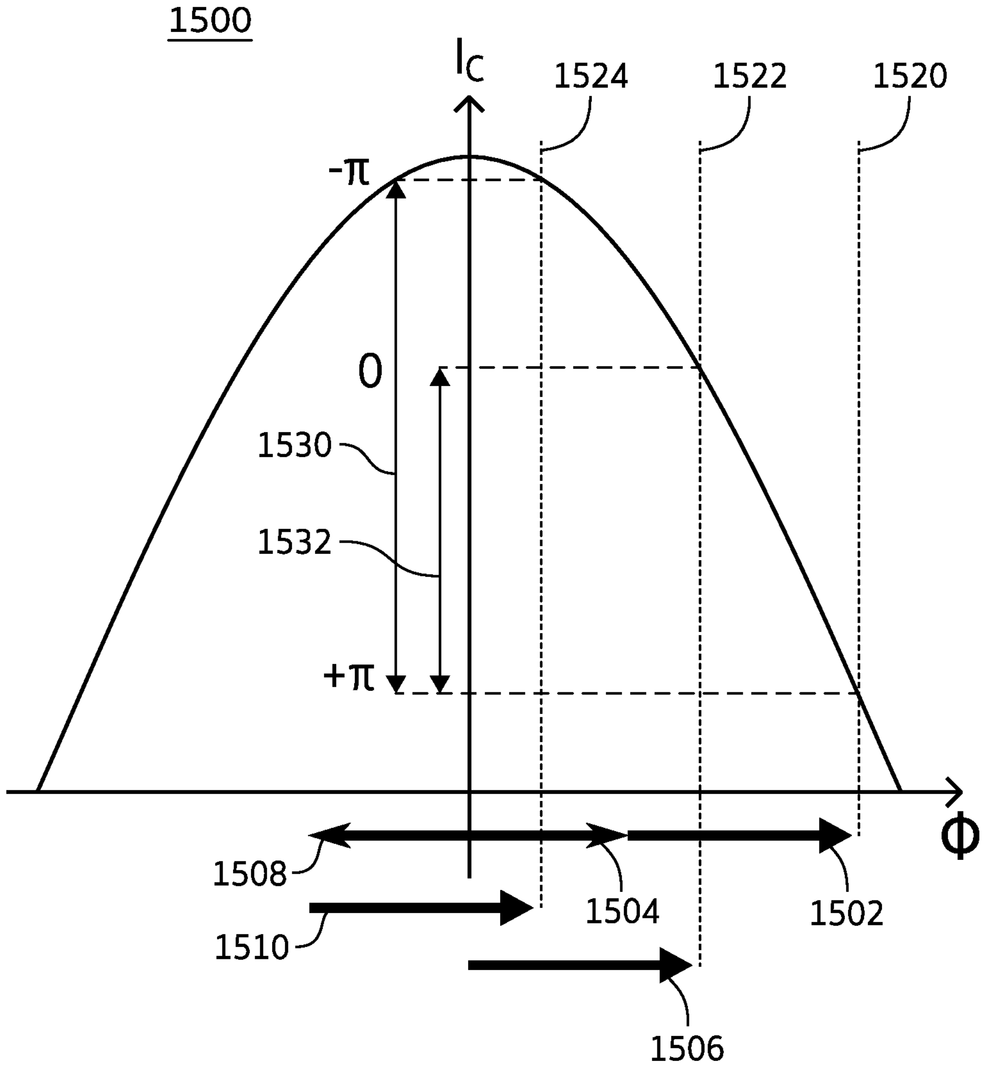
FIG. 15 is a graph depicting the effective critical current of the two Josephson junction superconducting loop (i.e., superconducting quantum interference device (SQUID)), where the effective applied flux is shown for three possible states, according to one or more embodiments of the present invention.

By maintaining a π-state MJJ in both logic states and inducing either a clockwise or counter-clockwise (a positive or negative) π-state current within the memory cell 100, Boolean logic states may now be defined by different circulating current states, which can be associated (without loss of generality) with either a positive or negative flux in the loop. This increases the readout margin budget for the column line CL (bit-line) read current and read-row-line read flux (generated by the read row line current $I_{RRL}$ flowing in the read row line during a read operation) in embodiments of the invention. The readout current may always provide positive effective flux (by convention always positive, and as shown in FIG. 15). In general, programmable circulating currents can be exploited in both digital and analog circuits.

Illustrative Write Method

Figure 2:
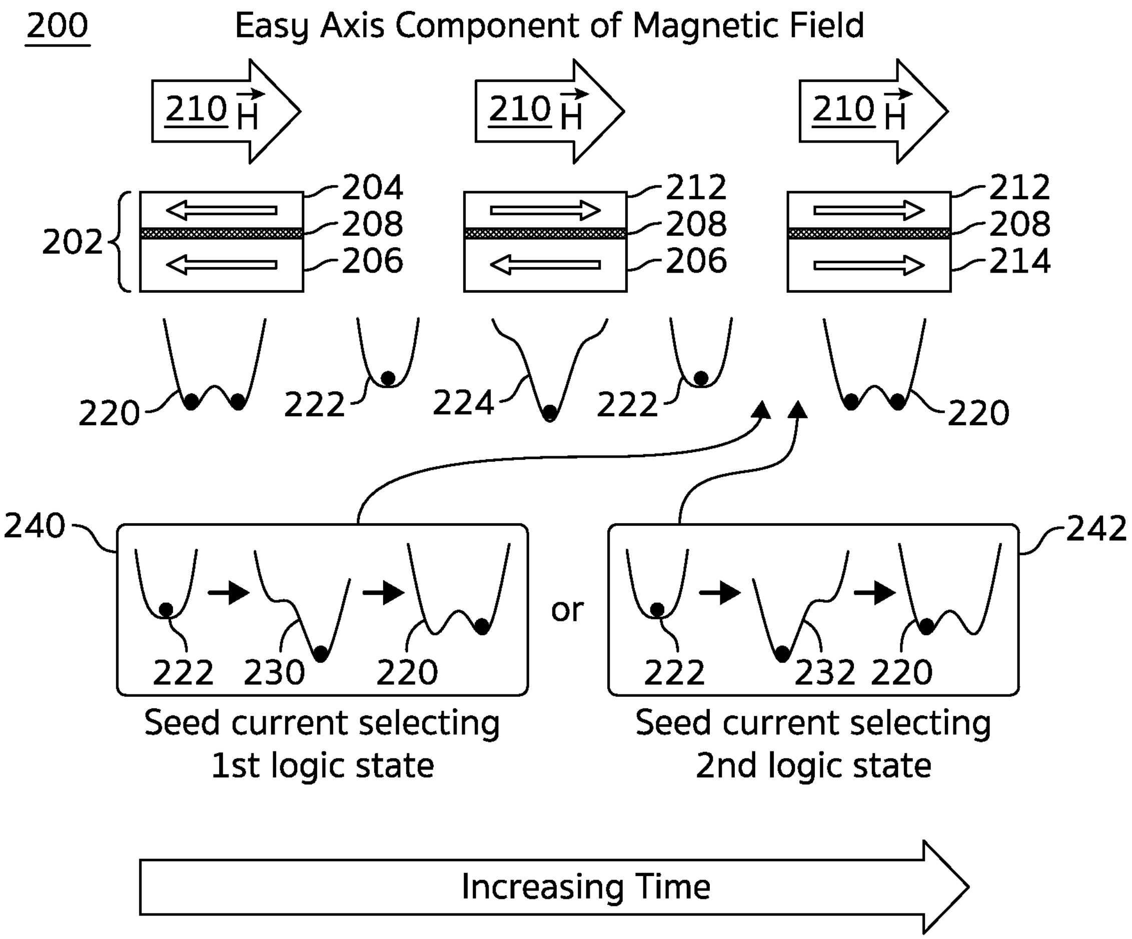
FIG. 2 is a multi-element diagram that describes a first write operation of a first write method for setting a positive or negative π-state current in a superconducting loop having an MJJ, where the sign of the π-state current indicates a state (e.g. Boolean) in a corresponding memory circuit (e.g.

FIG. 2 is a multi-element diagram conceptually describing an exemplary write method of setting a positive or negative π-state current in a superconducting loop having an MJJ 202 (e.g., spin-valve MJJ), according to one or more embodiments. Such a writing approach can provide a more reliable write operation because regardless of what layer (designed-to-be-soft or designed-to-be-hard) switches first, the MJJ transitions from a π-state into the zero-state, where the prior state circulating current(s) associated with the π-state is quashed. As the MJJ transitions into a new π-state, its associated circulating current(s) (e.g., $I_{circ}$) can be set robustly with π-state seed currents.

Before discussing the write method further, it is important to understand what is meant by a "superconducting loop having an MJJ 202." This phrase can describe, for example, either of two superconducting loops, each formed of serial connected components, both part of the exemplary memory cell 100 of FIG. 1, where MJJ 202 is noted as MJJ 110 in FIG. 1: (i) the first "loop" includes transformer 106 and MJJ 110, and (ii) the second "loop" includes transformer 108, MJJ 110, JJ 102, and JJ 104. It is also important to understand that the unique non-zero-angular orientation of MJJ 110 with respect to WLS in FIG. 1—different from the prior art—enables the coupling of an easy axis field into the MJJ 110 to support the write method of FIGS. 2 and 3 and all subsequent ones. All these write methods drive a requirement for inclusion of a memory element (e.g., noted as a first-second-current-direction flip flop 1702 in FIG. 17A or as an MJJ domain(s) orientation attribute(s) in FIG. 20) in write circuits at the "electrical periphery" of the memory cells (e.g., exemplary memory cell 100 of FIG. 1 or exemplary memory cell 2000 of FIG. 20) for tracking the domain orientation of at least one magnetic layer of at least one MJJ, but sometimes both layers, in its (their) π-state(s), depending on the particular write method. (Peripheral circuits could include (Bi)CMOS circuits located in room temperature electronics.) The domain-orientation-tracking-memory element also differentiates embodiments of the present invention from those of the prior art, and thus is central to apparatus claims of the present invention. As will be explained, it informs write circuits of a direction of the easy axis field (or field component) to be applied to the at least one MJJ being written, to switch certain domains of its magnetic layers, according to the requirements of the embodiment of each write method.

FIG. 2 shows an illustrative time progression of the soft (easy) layer, progressing from 204 through 212, and hard (fixed), progressing from 206 through 214, layers and their orientations of an exemplary spin-valve MJJ and the applied magnetic field direction 210 (which can increase in strength (i.e., magnitude) with time). It should be understood that, in the illustrative write processes shown in FIGS. 2, 3, 7 and 8, each view of a two/multilayer MJJ adheres to the following convention: a top layer (e.g., 204) is the soft (easy) layer, and a bottom layer (e.g., 206) is the hard (fixed) layer, with a separating layer 208 therebetween.

In FIG. 2, time notably increases from left to right. Shown below each magnetic field layer configuration is its corresponding lowest associated energy state(s) of an inductive loop containing the MJJ. On the left diagram showing an initial MJJ orientation 202, both layers 204, 206 have magnetic orientations pointing to the left, and a magnetic field 210, which opposes the initial MJJ orientation 202, is starting to be applied. In a stable state, the inductive loop can have two potential wells 220 (represented as grey dots indicating local, degenerate minima), only one of which can be occupied with a circulating current. As the top layer switches, a critical current $I_C$ goes down and results in a poorly localized minima 222, indicated by a single black dot. In the middle diagram, the top layer (e.g., soft layer 212) has a magnetic orientation pointing right while the bottom layer (e.g., fixed layer 206) does not change its magnetic orientation and still points left, indicating that the field strength (i.e., magnitude) of the applied magnetic field 210 is sufficient to switch the soft layer 212 but not the hard layer 206. As indicated between the left and middle configuration/state diagrams, the energy levels 220, 222, 224 of the inductive loop flatten out. With the MJJ in a zero-state (energy diagram 224, with a single global minima), there is no circulating current, and there is only one minima (e.g., 224).

With continued reference to FIG. 2, as the applied field 210 is further increased, the right diagram shows both layers 212, 214 having magnetic orientations pointing to the right. The MJJ is again in a π-state with the superconducting loops having two possible degenerate energy states/wells, as shown by the energy diagram 220 on the right; which well is occupied may be determined by the MJJ-induced clockwise or counter-clockwise (positive or negative) π-state current, $I_{circ}$ of FIG. 1. An applied seed current, driven through transformer 106 and in the loop containing inductor $L_2$ of transformer 106 and MJJ 110 (see FIG. 1), can drive a first state transition/process 240 ending in the first logic state or a second state transition/process 242 ending in the second logic state. An applied π-Phase_Setting current can drive the biasing current ($I_{seed\_\pi\text{-}Phase}$) through the MJJ and may produce the shifts in energy well profiles 230, 232 shown in the respective first and second state transitions 240, 242. (FIG. 6 may provide a more detailed explanation of the process.)

For the first logic state reached by process 240, the flat potential 222 may be split and shifted to energy profile 230, which has a localized minimum at a non-zero phase. As the seed current is removed, the energy profile returns to the double-well potential 220, but now with the state definitively in the right well. The process 242 may be virtually identical, except with a seed current in the opposite direction and the localized state being on the left in energy profile states 232 and 220. Note, that the left and right well pairs in the diagram, associated with the MJJ in the π-state may be similar in energy but different in the circulating current that they support.

In FIG. 2, the writing of the MJJ can be accomplished by: (1) applying a rightward (easy axis) magnetic field when the junction is in a left-left (LL) π-state; (2) increasing the magnetic field such that the easy/soft and hard layers switch to a right-left (RL) configuration corresponding to a zero-state; (3) under increasing field switch the direction of the hard layer to a right-right (RR) configuration, while coupling in a clockwise or counter-clockwise (positive or negative) seed current; (4) removal of the magnetic field, leaving the junction in a π-state; and (5) the concurrent trapping of a circulating current, being concurrent with step (4), set by the "seed" current applied by the transformer 106 of FIG. 1 (forming essentially write bit lines) to the superconducting loops containing the MJJ. Other than the prevailing magnetic field direction, the observable difference between FIGS. 2 and 3 (to be discussed) are the different initial/final arrow directions and first and second fixed and free layer orientations of the MJJ, which in both cases transitions from a π-state through a zero-state, and back into a π-state.

An important step here is the transition of the MJJ into a zero-state before transitioning back to the π-state, which can be accomplished by an anti-parallel arrangement of the magnetic layers. Note, that in FIGS. 2 and 3, the state of the MJJ at the completion of the write operation is the same as the state of the MJJ before the write operation, except that the magnetic domains of the soft and hard layers of the MJJ shown in FIG. 2 are oriented rightward after the write operation and are oriented leftward after the write operation shown in FIG. 3. This novel process can work starting with the sequence depicted in FIG. 3 and then the one depicted in FIG. 2. Two writes to the same MJJ returns the orientations of the layers of the MJJ to their same/original direction. Each individual write results in a stored and readable state in the memory circuit 100 (FIG. 1).

Distinguishable from conventional approaches, one or more embodiments of the present invention may involve a reversal of the magnetic domain orientations of both soft (free) and hard (fixed) layers during each write operation. As used herein, the term "parallel" in the context of the soft and hard layer of the MJJ refers to the respective magnetic domain orientations of the soft and hard layers being aligned (i.e., in the same direction) with respect to each other. Conversely, the term "anti-parallel" as used herein in the contact of the MJJ refers to the respective magnetic domain orientations of the soft and hard layers being in opposite directions with respect to each other.

Figure 3:
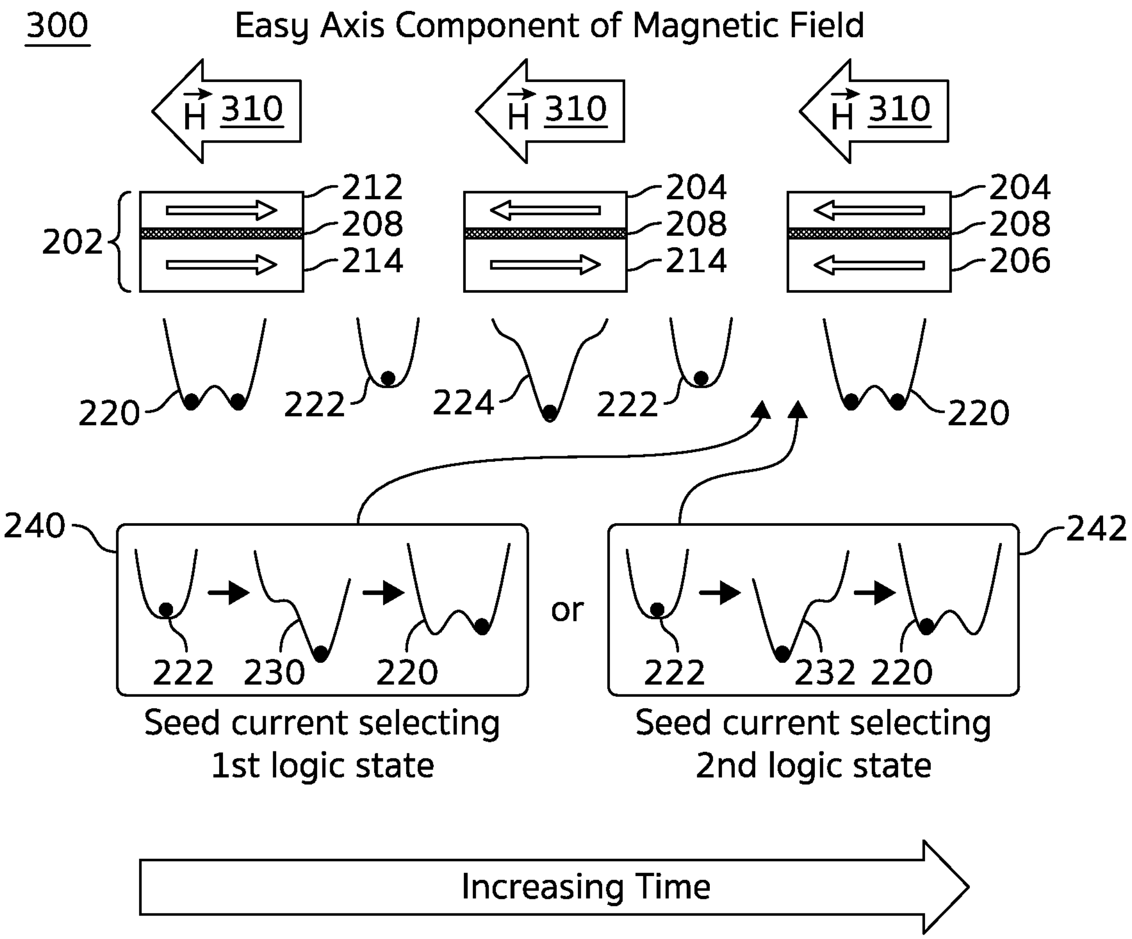
FIG. 3 is a multi-element diagram that describes a second write operation of a first write method for setting a positive or negative π-state current in a superconducting loop having an MJJ, where the sign of the π-state current indicates a state (e.g. Boolean) in a corresponding memory circuit (e.g.

Similar to FIG. 2, FIG. 3 shows a time progression of the soft and fixed layers of an exemplary spin-valve MJJ and the applied magnetic field direction 310 (which preferentially increases in strength with time). In FIG. 3, it is also assumed that time increases from left to right. Shown below each magnetic field layer configuration of the MJJ is its lowest associated energy state(s) 220, 222, 224, 230, 232 of the inductive loop containing the MJJ. On the left diagram describing an initial MJJ orientation 202, both layers 212, 214 have magnetic orientations that point to the right as the magnetic field is first applied. In a stable state, the inductive loop may have two potential wells, only one of which is occupied with a circulating current. In the middle diagram, the top layer (e.g., soft layer 204) switches its magnetic orientation and points left in the presence of an applied magnetic field 310 pointing to the left, while the bottom layer (e.g., fixed layer 214) has a magnetic orientation that remain unchanged and points to the right. This indicates that the field strength of the applied magnetic field 310 is sufficient to switch the soft layer 204 but not the hard layer 214.

As indicated between the right and middle configuration/state diagrams, the energy levels of the inductive loop flatten out. With the MJJ in a zero-state, there is no circulating current and therefore there is only a single minimum. As the applied magnetic field 310 is further increased, the right diagram shows both layers 204, 206 having orientations pointing to the left. The MJJ is again in a π-state with the superconducting loops having two possible degenerate energy states; which one is occupied is determined by the MJJ-induced circulating π-state current.

For the write process shown in FIG. 3, except for the impact of the magnetic field reversal, the steps may be identical to those shown in FIG. 2. Specifically, in one or more embodiments, the writing of the MJJ is accomplished by: (1) applying a leftward (easy axis) magnetic field when the junction is in a right-right (RR) configuration corresponding to a π-state; (2) increasing the applied magnetic field such that the easy/soft and hard layers switch to a left-right (LR) configuration corresponding to a zero-state of the MJJ; (3) under increasing applied field, switching the direction of the hard layer to a left-left (LL) configuration, corresponding to a π-state, while coupling in a positive or negative seed current; (4) removing the applied magnetic field, leaving the junction in a π-state; and (5) concurrently trapping a circulating current ($I_{circ}$ of FIG. 1), being concurrent with step (4), set by the "seed" current applied by the transformer 106 of FIG. 1 (forming essentially write bit lines) to the superconducting loops containing the MJJ.

Other than the prevailing magnetic field direction, an observable difference between FIGS. 2 and 3 may be the different initial and final arrow directions and first and second fixed and free layer orientations of the MJJ, which in both cases transitions from a π-state, through a zero-state, and back into a π-state. A critical step here, consistent with the illustrative write process shown in FIG. 2, is to transition into a zero-state before transitioning back into a π-state, which can be accomplished by an anti-parallel arrangement of the magnetic layers. Note, that the end state of the MJJ in FIG. 2 (i.e., at the completion of the write operation of the MJJ) is the same as the beginning state of the MJJ in FIG. 3, and vice versa. The process can also work starting with the sequence depicted in FIG. 3 and then the one depicted in FIG. 2. Two writes to the same MJJ returns the orientations of the layers of the MJJ to their same (original) direction. Each individual write results in a stored and readable state in the memory circuit 100.

The writing of the MJJ, which has both a hard (fixed) and a soft (free) magnetic layer, is accomplished in a similar fashion to the existing cell design with a few significant changes. Different here is the change of the MJJ from a π-state, through the zero-state, to a π-state, using easy axis fields, within the write cycle; and an application of a clockwise or counter-clockwise (a positive or negative) seed current to establish a clockwise or counter-clockwise (a positive or negative) π-state current in the memory circuit. This seed current need only bias the cell towards the desired circulating current state. As the rotation of the layers completes, the local minimum of the energy well will result in a circulating current state without any externally applied field. The strength of the seed current need only be strong enough to overcome any noise in the system and drive the desired circulating current state into the lowest energy state available.

Figure 4:
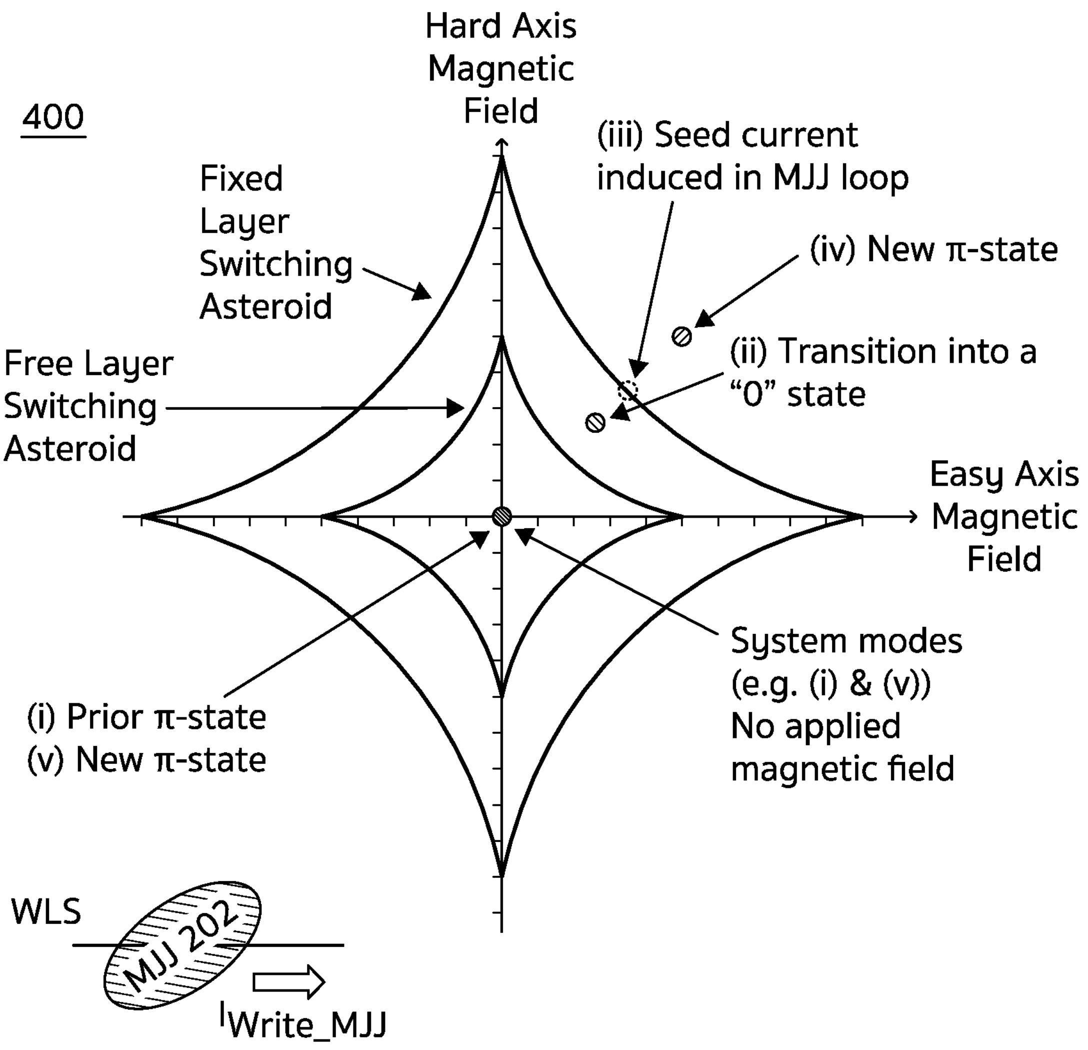
FIG. 4 is a graph (i) that depicts magnetic layer switching thresholds and applied fields as a function of easy and hard axis fields for the first write operation of the first write method depicted in FIG. 2 and (ii) that emphasizes different transitions of the MJJ and the superconducting loop, according to one or more embodiments of the present invention.

FIG. 4 conceptually depicts ideal Stoner-Wohlfarth switching astroids of easy (free) and hard/fixed layers of MJJs in the exemplary MJJ write circuit 100 of FIG. 1 for the exemplary write method described in FIG. 2. The Stoner-Wohlfarth (SW) model may be the simplest model that adequately describes the magnetization reversal of nanoscale systems that are small enough to contain single magnetic domains. In FIG. 4, a hard axis magnetic field is represented by the y-axis (vertical axis), and an easy axis magnetic field is represented by the x-axis (horizontal axis), which are shown normalized to the maximum uniaxial field for the hard/fixed layer. The Stoner-Wohlfarth astroid is essentially a polar plot indicating the reversal magnetic field under the assumption of coherent reversal. With reference to FIG. 4, a smaller free layer switching astroid is shown centered about the origin, and a larger (normalized magnitude±1.0) fixed layer switching astroid is shown centered about the origin and surrounding (i.e., concentric with) the free layer switching astroid. The free layer and fixed layer switching astroids shown in FIG. 4 are simplified in that they ignore any interactions between free and fixed layers of the MJJ, which would otherwise create an offset.

A boundary line of the switching astroid represents magnetic field points on the curve beyond which a domain of a particular MJJ layer can be reversed and the MJJ switch its phase state. The boundaries represent the hysteric boundaries of the layers for switching from one domain orientation to another. Any combination of fields within the boundary of the astroid results in no overall magnetic orientation change after removal of the field. Any combination of fields outside the indicated boundary results in a semi-permanent change when the field returns to zero if the applied fields opposed the domain orientation.

In the illustration of FIG. 4, without loss of generality, it may be assumed that the MJJ is in a π-state and the fixed and free layers of the MJJ both point to the left. Expressed here is a process applying a magnetic field at an angle (e.g., along a 45 degree line, although embodiments of the invention are not limited to any specific angle of the applied field relative to the MJJ) with respect to the easy axis of the MJJ. (Note, that this is along the normalized field strengths and the actual orientation of the junction on a chip will be determined by a ratio of strengths of the actual minimum fields.)

Starting in a "system mode (i)" where readout is possible—at the origin in the figure—an increasing field in both the easy and hard axes is applied such that the magnetic fields applied surpass the soft layer hysteresis limit minimum (i.e., defined by the free layer switching astroid); a point corresponding to a transition zero-state (ii) is realized. At this point, neglecting any dynamic effects, the soft and hard layers of the MJJ are oriented such that they are in opposite directions relative to one another; soft to the right and hard to the left. The junction transitions to a zero-state junction, assuming the MJJ layer thicknesses are designed and manufactured appropriately.

As the applied magnetic field is increased along the same direction, the hard layer then also passes its hysteretic limit and will remain in its newly switched ("right") orientation, along with the soft layer, which also points right, when the field is removed. Concurrently, a seed current is applied (iii) to bias the ground state (labeled (v) new π-state) towards either a clockwise or counter-clockwise (positive or negative) π-state current, as desired. The junction then transitions back to a new π-state (v) and is capable of supporting a persistent current in the loop. The field must still pass the hard (and implicitly, the soft) hysteretic minimum so that the π-state is retained when the field is removed. This point corresponds to the seed current induced in the MJJ loop (iii). A clockwise or counter-clockwise (a positive or negative) seed current may be supplied through the MJJ to split the degenerate energy states of the inductive loop containing the MJJ. Once both layers of the MJJ are oriented in the same direction (right and right in FIGS. 2 and 4), the circulating current state (i.e., positive or negative π-state current) will be maintained in the absence of a driven current. The MJJ switching field can be removed (v) and readout is possible in this "system mode."

Figure 5:
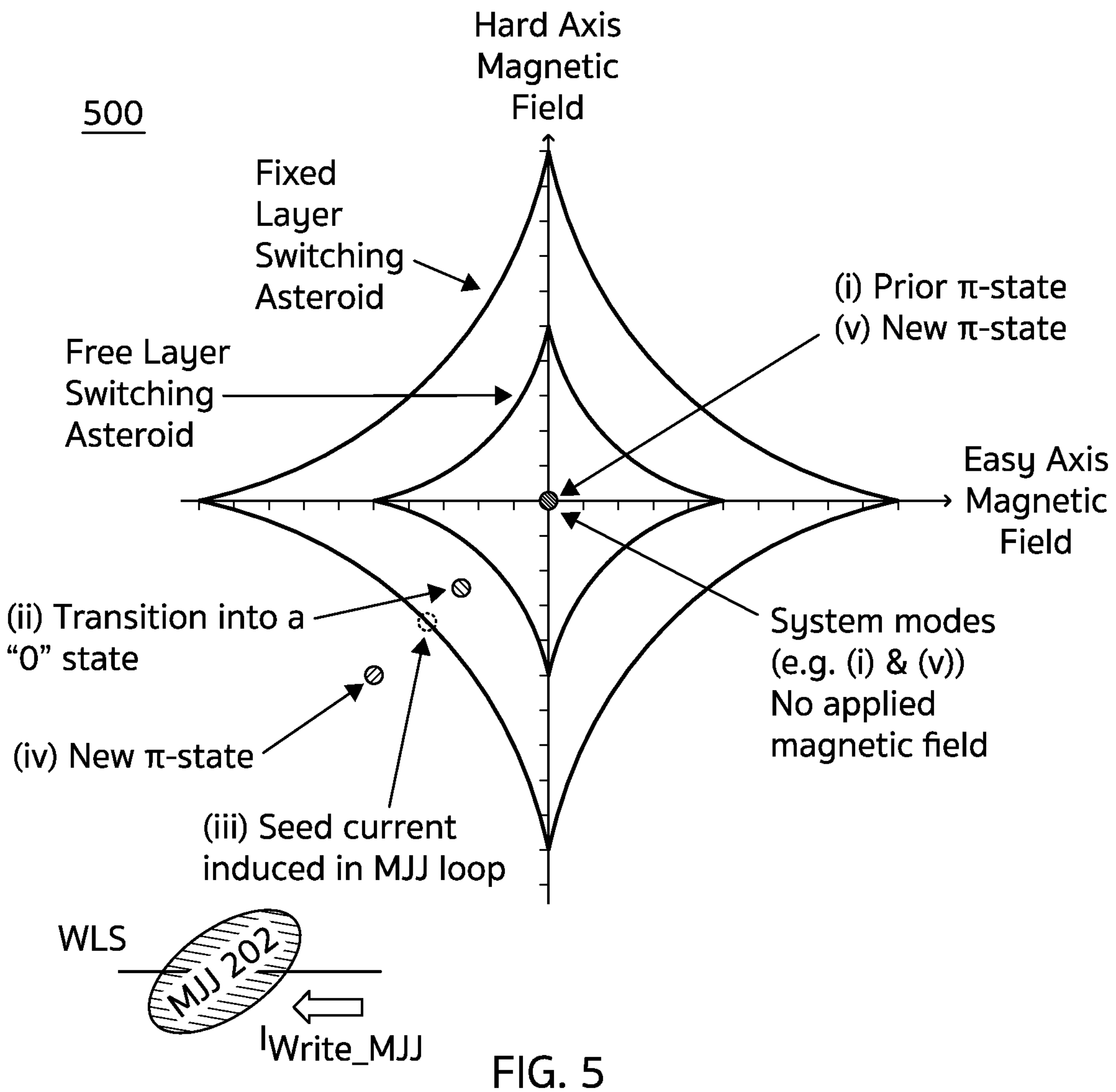
FIG. 5 is a graph (i) that depicts magnetic layer switching thresholds and applied fields as a function of easy and hard axis fields for the second write operation of the first write method depicted in FIG. 3 and (ii) that emphasizes different transitions of the MJJ and the superconducting loop, according to one or more embodiments of the present invention.

FIG. 5 shows the Stoner-Wohlfarth asteroid progression for the exemplary MJJ write operation of FIG. 3. The progression shown in FIG. 5 is essentially the same as the progression shown in FIG. 4 (relating to the illustrative write operation of FIG. 2), except that the magnetic fields and magnetic layer orientations are reversed (i.e., the Stoner-Wohlfarth asteroid progression is essentially a rotation around the origin).

FIG. 1 shows the In_Out_1_π-Phase_Setting and In_Out_2_π-Phase_Setting terminals for the write seed currents described here. Unlike conventional JMRAM write methods, easy axis magnetic field components can be generated by write selection currents passing through the row/word line (formed by the terminals, In_Out_2_Magnetic_Field and In_Out_1_Magnetic_Field), and vice versa. Such a write selection approach can be directed to at least one MJJ. The field selection changes the topography of the potential well representing the circulating current so as to facilitate a reliable setting of the clockwise and counter-clockwise (positive or negative) π-state loop current, which corresponds to the "1" or "0" stored state of the memory circuit, respectively. Moving from left to right in FIG. 2, the direction of the applied magnetic field remains constant, but its magnitude can increase in time.

To reiterate, the writing of the MJJ may be accomplished by: (1) applying a rightward magnetic field, having an easy axis component 210, when the junction is in a left-left (LL) configuration corresponding to a π-state; (2) increasing the magnetic field 210 such that the easy/soft layer changes direction to the right, so that the MJJ is in a right-left (RL) configuration and the MJJ is in a zero-state; (3) under increasing field, switching the direction of the hard layer to a right-right configuration and putting the MJJ into a π-state, while coupling in a π-Phase_Setting current (a write bit line current) in the appropriate direction to create the seed current; (4) removing the magnetic field, leaving the junction in a π-state; and (5) concurrently trapping a circulating current, being simultaneous with step (4), set by the seed current. The circulating current state may indicate the stored logic state (e.g., "1" or "0") within a circuit. The next write operation follows the same process but with right and left magnetic fields and layer orientations swapped; but with the circulating seed current always setting/generating the final circulating current (positive or negative) stored as a result of the MJJ being in a π-state.

By switching both layers during each write operation in accordance with one or more embodiments of the inventive concept, process variations in hard and soft layer thresholds for change of orientation can be mitigated. It is only important that the soft layer (actually a weaker of the two layers in the manufactured product) switches independently of the hard layer to allow a temporary zero-state junction before the hard layer switches and restores the π-state of the junction. Note that the zero-state of the MJJ is purely a transitory state for Boolean write operations and never associated with a particular Boolean logic state ultimately stored as a clockwise or counter-clockwise current circulating in a superconducting loop having an MJJ.

It should be noted that ternary bit storage can be attained (if MJJs are written one at a time). With only a minor modification to the methods 200 and 300 of FIGS. 2 and 3, respectively, ternary writing is enabled, It will be described with respect to the description of FIGS. 22 and 23.

For Boolean writing, while the transition from a zero-state to a π-state occurs, either a clockwise or counter-clockwise (a positive or negative) seed current can be applied to the MJJ to store either a clockwise or counter-clockwise (a positive or negative) π-state current in a superconducting loop having the MJJ. As the MJJ shifts into a π-state, the degenerate energy states can be split to result in a preferred energy state corresponding to the circulating currents (e.g., positive or negative π-state current) within the memory circuit 100, associated with its superconducting loops, which represents a logical state of the circuit.

FIGS. **6*a* through 6*e* are energy profiles showing an exemplary progression of the potential wells of the magnetic junction and inductor loop circuit combination (e.g., formed with the MJJ 110 and secondary winding/wire $L_2$ of the transformer 106 shown in FIG. 1) during a write operation as the circuit combination becomes biased towards a particular circulating current and culminates in a stored state available for both read and retention operations, according to embodiments of the invention. A biasing current ($I_{seed}$_π-Phase induced by a negative or positive π_Phase_Setting current of FIG. 1), which sets the direction, clockwise or counter-clockwise, of the circulating current, can be applied by inductively coupling (e.g., via transformer 106 of FIG. 1**) a current into a superconducting loop containing the MJJ.

Figure 6A:
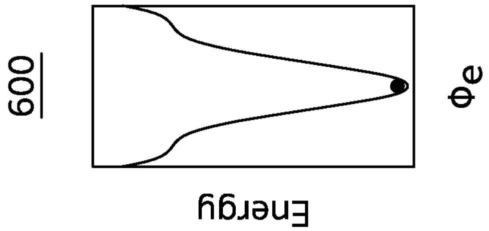
FIGS. 6*a* through 6*e* are graphs depicting the energy profile of the inductive loop as a function of phase (flux) across an MJJ in combination with a positive π-phase-setting current, according to one or more embodiments of the present invention.
Figure 6B:
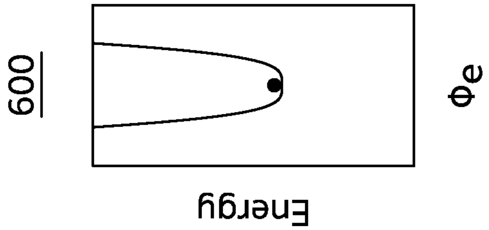
Figure 6C:
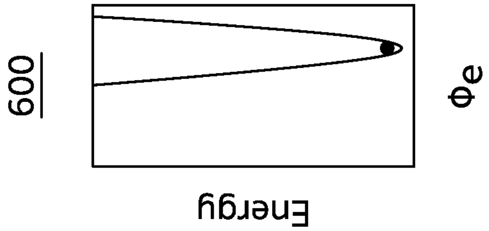
Figure 6D:
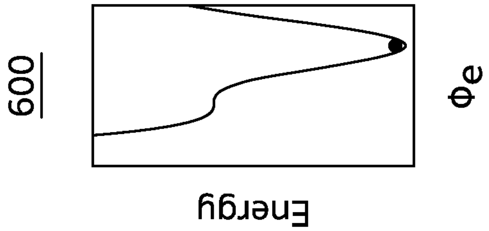
Figure 6E:
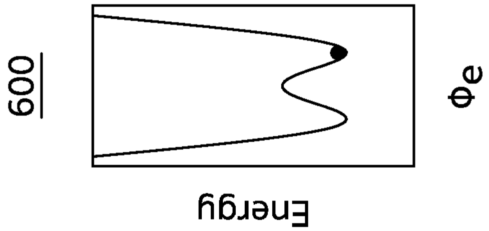

FIG. 6*a* corresponds to step (ii) of FIG. 4 or 5, where the layers of the MJJ have been shifted such that the MJJ behaves as a standard, zero-state junction. There is only a single, global minimum indicated by the black dot. As the applied magnetic field is increased, the critical current decreases, as the junction becomes a T-junction; at low critical current, the energy profile corresponds to FIG. 6*b*, now step (iii) of FIG. 4 or 5. Corresponding to step (iv) of FIG. 4 or 5, FIG. 6*c* illustrates that the applied seed current shifts the energy profile away from a minimum at zero and instead at a non-zero applied eternal phase. Simultaneously (also as part of step (iv) of FIG. 4 or 5), the pi-junction nature of the junction is expressed and the double-well profile begins to appear, as shown in FIG. 6*d*. In the final step (v) of FIG. 4 or 5, the seed current has been removed and the local potential minimum has been selected as the right well, as shown in FIG. 6*e*. Without loss of generality, this process works the same for the left well and a corresponding seed current applied in step (iii).

First Alternative Write Method

Figure 7:
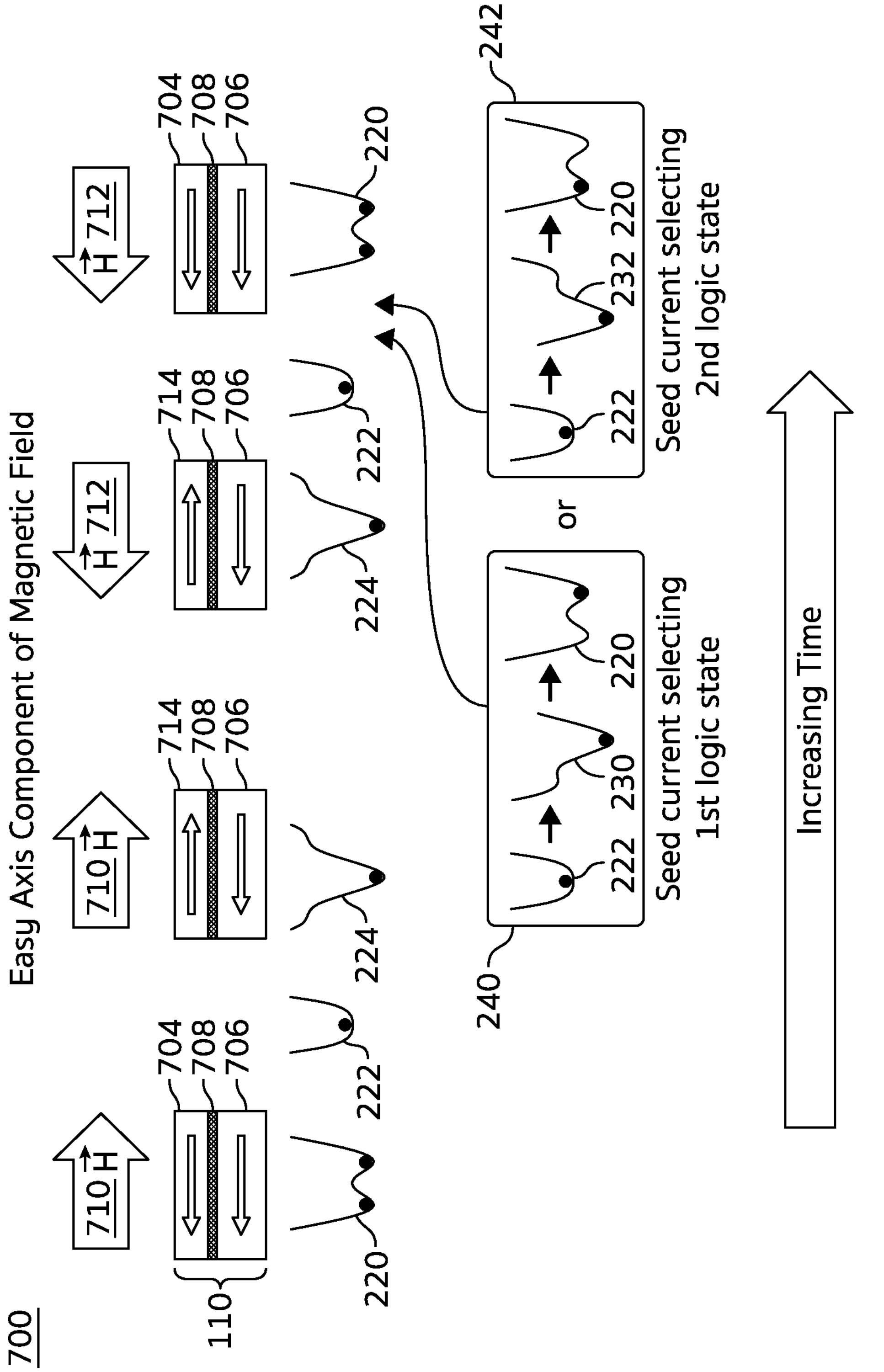
FIG. 7 is a multi-element diagram that describes a second write method for setting a positive or negative π-state current in a superconducting loop having an MJJ, where the sign of the π-state current indicates a state (e.g. Boolean) in a corresponding memory circuit (e.g.

FIG. 7 conceptually depicts at least a portion of an exemplary alternative write method 700 for transitioning an MJJ from a π-state to a zero-state and back to a π-state, according to one or more embodiments. In the write method 700, an initial orientation of the MJJ 702 is notably the same as an ending orientation of the MJJ; in this example, top and bottom layers 704, 706 of the MJJ have beginning and ending magnetic domain orientations that are identical (left-left orientation), unlike previous processes which switched the magnetic domain orientations of both the fixed and free layers of the MJJ within each write cycle.

More particularly, FIG. 7 shows a time progression from left to right, and right to left, of the soft layer of an MJJ and applied magnetic field directions 710, 712 (which may be assumed to vary in strength and direction with time) driving such rotations. Shown below the magnetic field layer configurations are respective lowest energy states 220, 222, 224, 224, 222, 230 (or 232), 220 of the inductive loop containing the MJJ. On the left diagram, which shows the initial orientation 702 of the MJJ, where both top and bottom layers are oriented to the left 704, 706 as the magnetic field 710 begins to be applied. The superconducting loop has two potential wells in this initial π-state, only one of which is occupied with a circulating current, $I_{circ}$ of FIG. 1.

On the middle left diagram, the top layer points right 714 while the magnetic orientation of the bottom layer remains pointing left 706, indicating that the strength of the applied magnetic field is sufficient to switch the soft layer but not the hard layer. As indicated between the left and left middle configuration diagrams, at the top of the diagram, the energy levels of the superconducting loop flatten out. With the MJJ in a zero-state, there is no circulating current energy state without externally applied fields. The field is now reversed in direction so that the soft layer again switches direction and aligns with the hard layer to create an MJJ in a π-state for read and retention operations. Unlike in the exemplary write operation illustrated in FIGS. 2 and 3, however, (i) the magnetic layers start and end in the same parallel direction (left-left 704-706), (ii) the applied magnetic field direction switches direction within a single write process, and (iii) although possible for some MJJs with low switching thresholds in a memory array having MJJs with non-uniform switching thresholds, the fixed layers of all of the MJJs never need to change direction if none in the array have the noted low switching thresholds.

More specifically, in the alternative embodiment of FIG. 7, the magnetic fields are reversed within a single write operation, instead of being opposite in each sequential write as (i.e., across two write operations) in the embodiment described with respect to FIGS. 2 and 3. What remains the same is that the MJJ transitions from a π-state, into a zero-state, and back into a π-state again. However, in this case the starting magnetic domain orientations of the soft and hard layers of the MJJ in the π-state (either right-right (RR) or left-left (LL) configuration) are the same at the beginning and end of the write process for every write cycle. By way of example only and without limitation or loss of generality, assume the MJJ is initially in the LL configuration (i.e., magnetic domains of the top layer 704 and bottom layer 706 pointing left). The writing of the MJJ may be accomplished by: (1) applying a rightward magnetic field 710 (the easy axis field component) when the junction is in an LL configuration corresponding to a π-state; (2) increasing the magnetic field such that the easy/soft 714 and hard/fixed 706 layers changes direction into a right-left (RL) configuration corresponding to a zero-state; (3) removing the rightward magnetic field 710; and (4) applying a leftward magnetic field 712 such that the soft/easy layer changes the MJJ from a right easy layer 714 and left hard layer 706 into an LL configuration, where the soft layer 704 points left, and hard layer 706 points left, leaving the junction in a π-state identical to the one it started in; and (5) the concurrent trapping of clockwise or counter-clockwise current circulations, being concurrent with step (4), set by the "seed" current to the superconducting loops containing the MJJ. The "seed" current can be induced by a negative or positive π-Phase_Setting current, which can be driven through transformer 106 of FIG. 1. The final clockwise or counter-clockwise π-state current can be used to indicate the stored logic state (e.g., "1" or "0") within a memory circuit (e.g., 100 of FIG. 1).

Second Alternative Write Method

Figure 8:
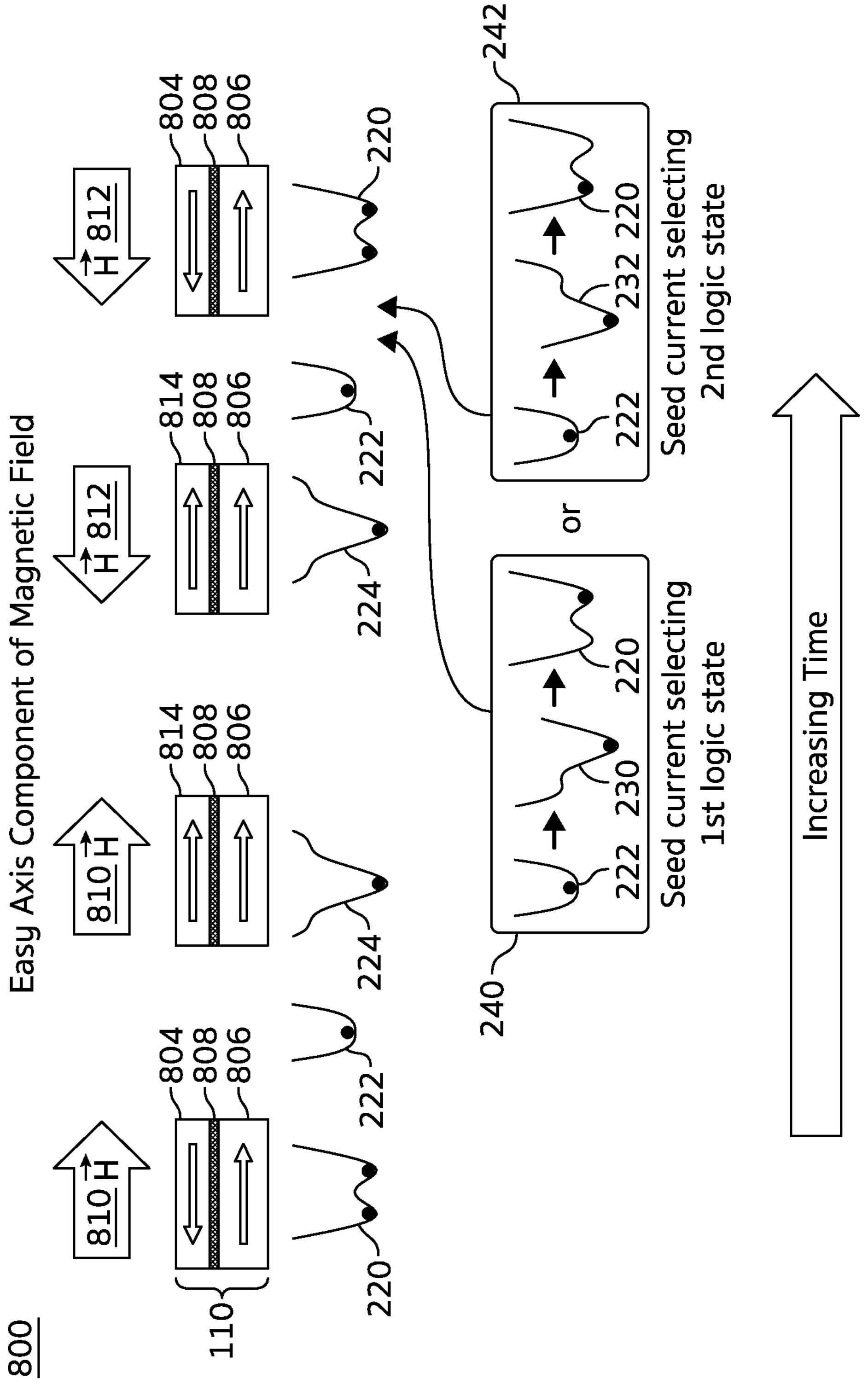
FIG. 8 is a multi-element diagram that describes a third write method for setting a positive or negative π-state current in a superconducting loop having an MJJ, where the sign of the π-state current indicates a state (e.g. Boolean) in a corresponding memory circuit (e.g.

Principle distinctions between the first alternative embodiment of FIG. 7 and the second alternative embodiment of FIG. 8 include the following: (i) the π-state for the MJJ of FIG. 7 is a parallel magnetic orientation of soft (free) and hard (fixed) layers whereas the π-state for the MJJ of FIG. 8 is designed to be an anti-parallel orientation of soft and hard layers, by choice of the MJJ materials and their associated thicknesses; and conversely (ii) the zero-state for the MJJ of FIG. 7 is an anti-parallel magnetic orientation of soft (free) and hard (fixed) layers whereas the zero-state for the MJJ of FIG. 8 is a parallel orientation of soft and hard layers. MJJ state, either T-state or zero-state, may be set as a function of one or more characteristics of the MJJ, including material type/properties, material thicknesses, and fixed and free layer relative orientations.

In an alternative embodiment, the write process for the MJJ follows a similar process with the MJJ layers in alternative orientations. As previously noted, the thicknesses of the ferromagnetic layers 804, 806 can be configured such that the overall phase across the junction is 0 when soft and fixed layers are aligned parallel, and the overall phase across the junction is π when the layers are anti-parallel. FIG. 8 shows an alternative process of transitioning from a π-state to a zero-state and back to a π-state, with the magnetic domains of the layers beginning and ending in a left-right orientation, according to one or more embodiments. Specifically, FIG. 8 shows an illustrative time progression of the magnetic layers of an MJJ from anti-parallel, to parallel, to anti-parallel. The associated applied magnetic field directions 810, 812 drive the magnetic layer progression. The magnetic fields can vary in strength and direction with time. Shown below the magnetic field layer configurations are their respective lowest energy states 220, 222, 224, 230, 232 of the superconducting (inductive) loop containing the MJJ.

Referring to FIG. 8, on the left diagram 802, the layers are oriented left/right (soft layer 804 and fixed layer 806, respectively) as a magnetic field 810 is initially applied (oriented to the right). The MJJ has two potential wells 220, one (but not both) of which will be occupied with a circulating current. In the middle configuration(s), both the soft layer 814 and hard layer 806 are oriented pointing right, indicating that the field strength is sufficient to switch the soft layer. As indicated between the left and middle configurations, at the top of the diagram, the energy levels of the inductive loop flatten out (222 and 224). With the MJJ in a zero-state, there can be no circulating current energy state without externally applied fields. The applied magnetic field is now reversed in direction 812 so that the soft layer again switches direction, from 814 to 804, and becomes anti-parallel with the hard layer 806 to set the MJJ in a π-state. Unlike in FIGS. 2 and 3, (i) here the magnetic layers start and end in the original anti-parallel directions, (ii) the applied magnetic field direction switches direction within a single write process, and (iii) the fixed layer does not change direction throughout the changes in state (from π-state, to zero-state, and back to π-state) of the MJJ, but rather remains in the same orientation 806. During a read operation or during standby, the MJJ is again always in a π-state with two possible energy states (positive and negative π-states); which one is occupied may be determined by the circulating current passing through the MJJ (e.g., MJJ 110 of FIG. 1).

π-Junction Write Method

While a coherent rotation of an entire magnetic layer may preclude a π-junction from transitioning through a zero-state, according to the theory of Stoner-Wohlfarth, individual domain wall rotation in a multidomain-wall π-junction may not preclude such a zero-state transition.

Figure 9:
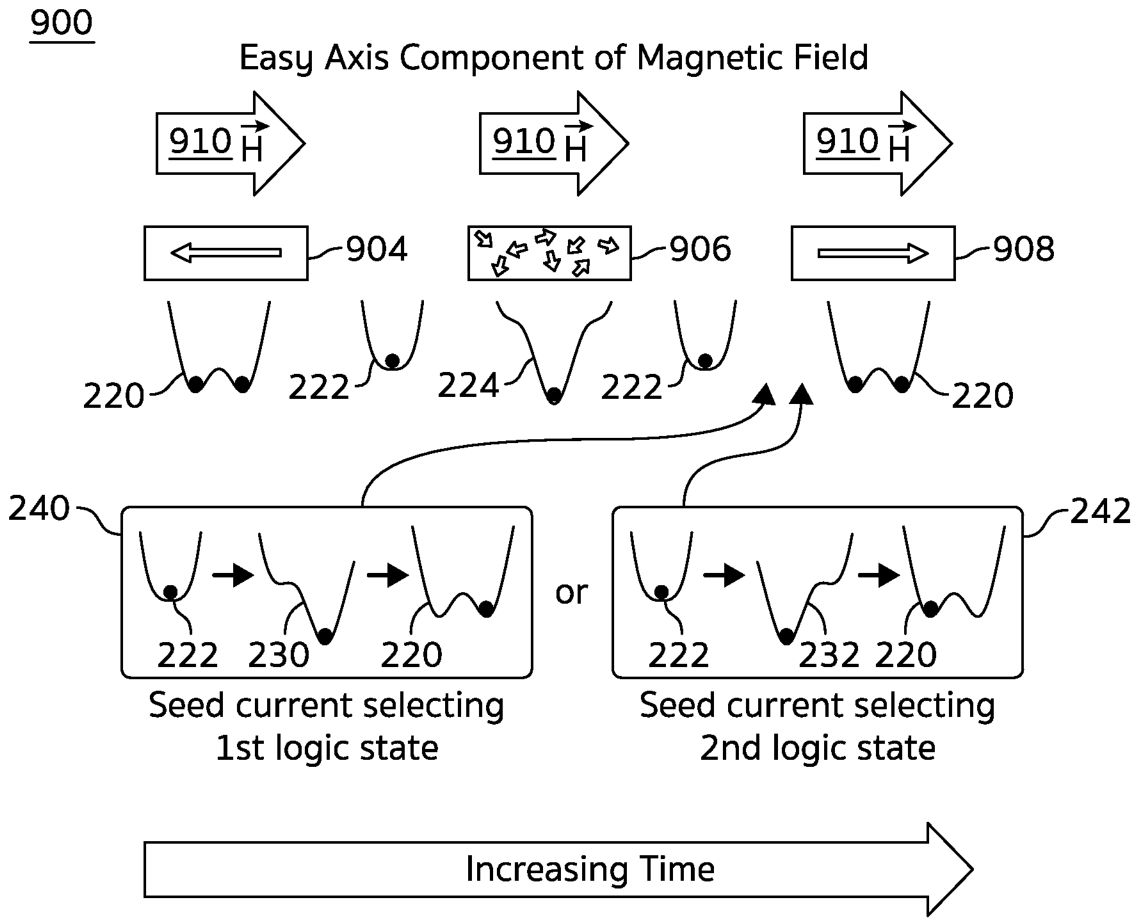
FIG. 9 is a multi-element diagram that describes a first write operation of a fourth write method for setting a positive or negative π-state current in a superconducting loop having a multi-domain MJJ, where the sign of the π-state current indicates a state (e.g., Boolean) in a corresponding memory circuit (e.g., FIG. 1), according to one or more embodiments of the present invention.

FIG. 9 conceptually shows an exemplary write method 900 for an MJJ with a ferromagnetic layer having (i.e., composed of) multiple domains, according to one or more embodiments. The write method 900 is described in FIG. 9 by way of a time progression from left to right of the ferromagnetic layer of the MJJ having domain orientations 904, 906, 908 and an applied magnetic field direction 910 which is assumed to vary in strength (but not direction) with time. Shown below the magnetic field layer configurations are respective lowest energy states 220, 222, 224, 230, 232 of the inductive loop containing the MJJ. On the initial left diagram, the layer orientation 904 points to the left as the magnetic field 910 is applied. The inductive loop has two potential wells in this state, only one of which is occupied with a circulating current.

In the middle diagram, the layer configuration 906 contains some domains pointing to the left and others pointing to the right. This can, if the MJJ and layer are configured having certain properties (some of which are described below), result in a collective spin-valve Cooper pair phase shift of zero, driving the MJJ into a zero-state. As indicated between the middle configuration 906 and right configuration 908, the energy levels 222 of the inductive loop flatten out. With the MJJ in a zero-state for the configuration 906, there can be no circulating current energy state without externally applied fields. As the applied magnetic field 910 is further increased, the right configuration 908 shows all domains aligned and pointing to the right. In the right configuration 908, the MJJ is again in a π-state with two possible energy states (e.g., two possible circulating currents). The energy state that is occupied may be determined by the circulating current through the MJJ in the layer orientation 908.

Like other write processes described within the present disclosure, a goal of this illustrative write process may be to remove a barrier between circulating currents by entering a temporary zero-state of the MJJ, thus creating a single low-energy state with zero circulating current before transitioning back into a π-state. Such a single-layer, multi-domain magnetic junction may accomplish this objective if it has one or more of the following preferred properties: the layer can contain multiple domains, including domains which are stacked upon each other along the direction of current flow; these domains can individually align in opposing directions (e.g., left or right) when under no applied magnetic field; these domains can switch under varying field strengths such that their cumulative phase shift at a repeatable field strength is zero (that is, the junction becomes a standard junction); and these domains can retain their orientation over sufficiently long time scales while under no field. The ferromagnetic layer can be fabricated such that a thickness (cross section) of the layer contains sufficient domains to accomplish the prior recommended properties and produce an overall π-phase shift across the junction when all domains are aligned. Note, that in this approach, the zero-state of the junction need only be available when placed under an appropriate magnetic field. This configuration need not be available under zero applied field.

Write Method Summary and Abstraction

Figure 10:
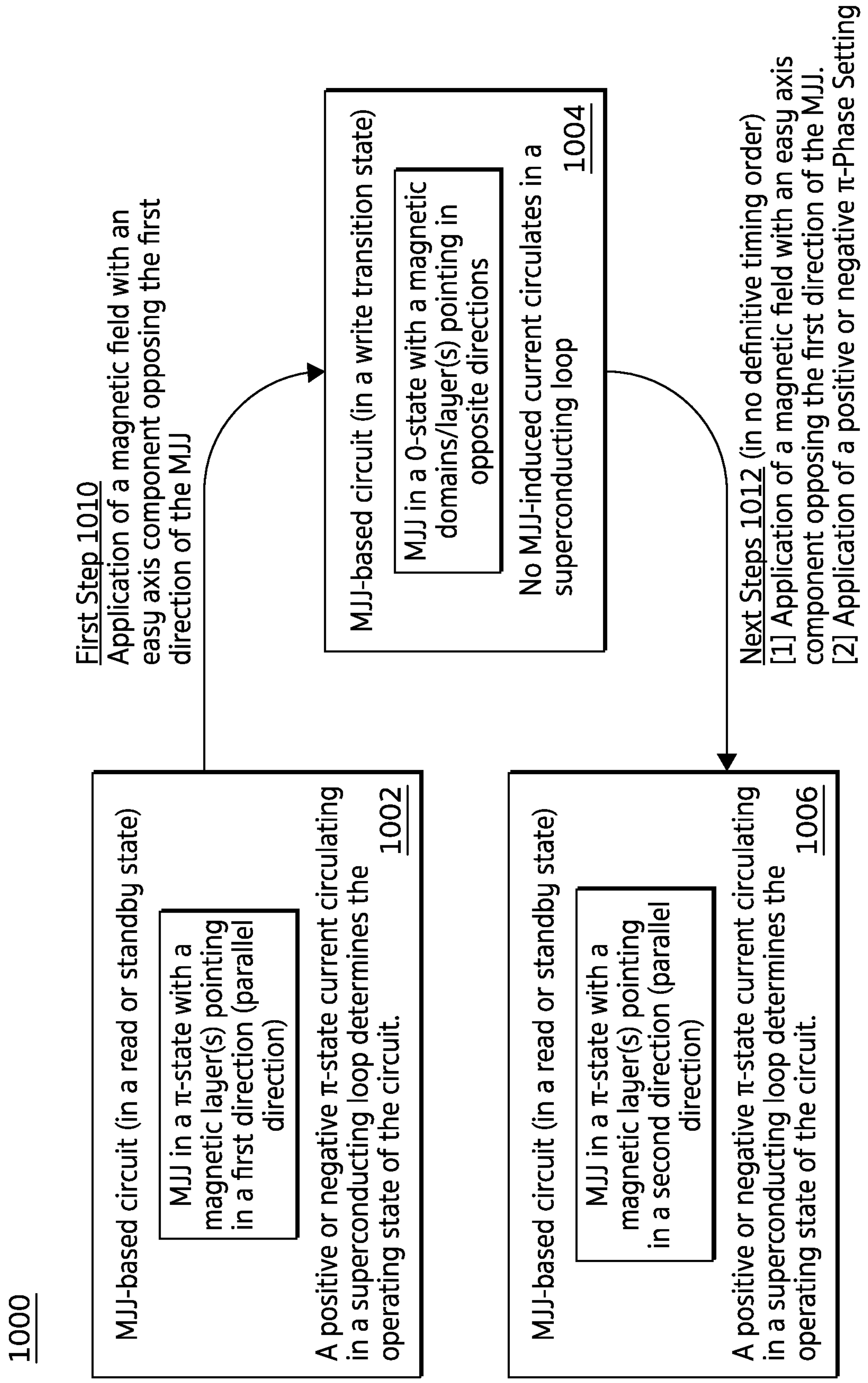
FIGS. 10 through 14 are diagrams that generalize the methods associated with write operations directed to magnetic memory circuits, according to various embodiments of the invention.
Figure 11:
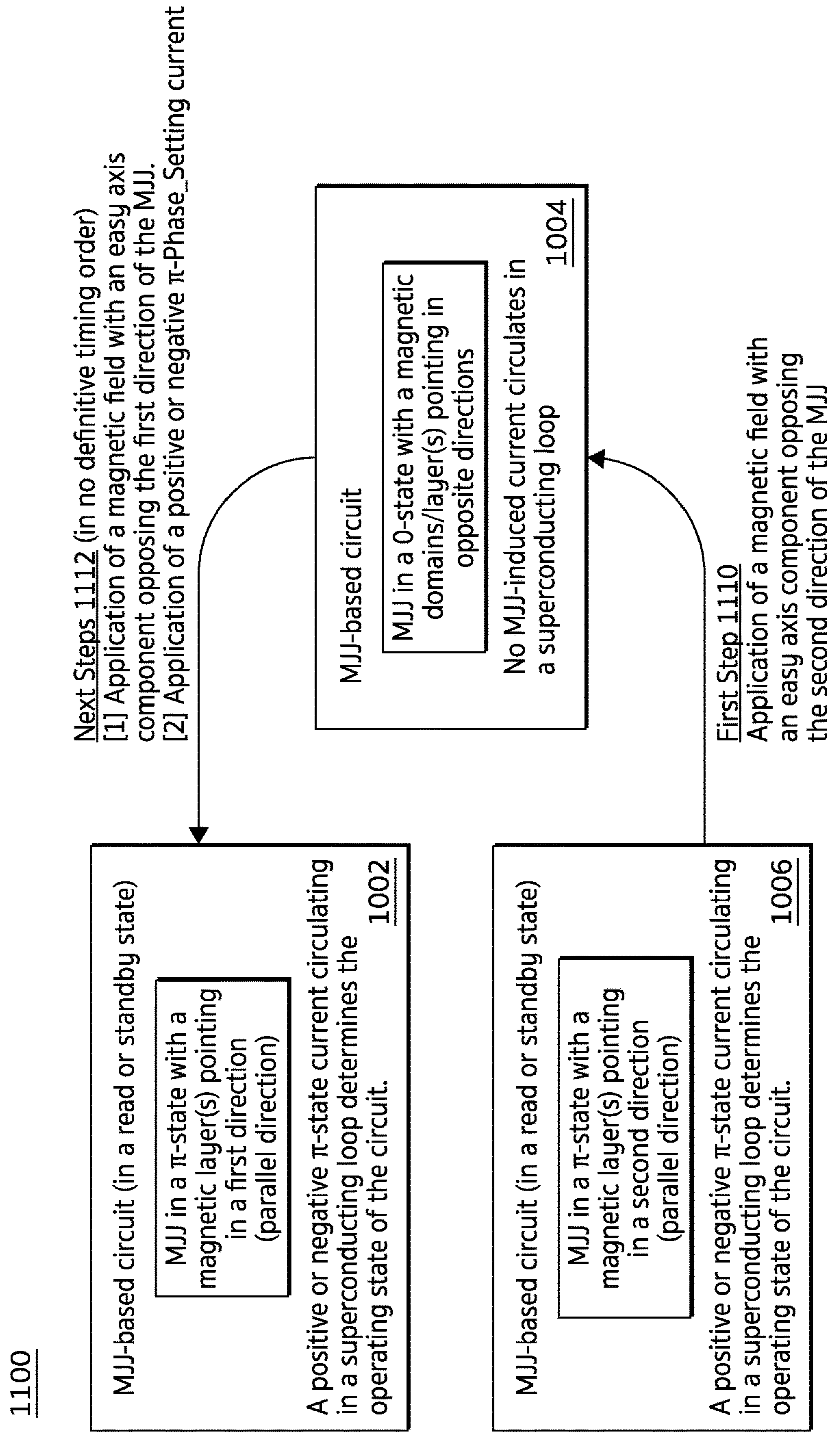

FIGS. 10 through 14 are flow diagrams depicting at least portions of exemplary write operations, according to embodiments of the inventive concept. As shown in FIGS. 10 and 11, write operations 1000 and 1100 are coupled/paired (N and N+1) for the illustrative embodiments depicted in FIGS. 2 and 3, respectively, and the π-junction write embodiment, depicted FIG. 9, because the orientation of the MJJ in these embodiments is configured to switch to an orientation opposite its initial orientation after each write operation. FIGS. 12A and 12B depict write operations 1200 and 1250 directed to a half-selected (i.e., partially selected) MJJ that does not receive an applied magnetic field and only receives a coupled flux in its associated superconducting loop (e.g., an exemplary loop that includes secondary winding/wire $L_2$ of transformer 106 and MJJ 110 of FIG. 1) from a π-Phase_Setting current. The coupled flux does not update its clockwise, or counter-clockwise, circulating current since the barrier dividing the two possible degenerate energy states is too high, statistically speaking, to permit such a change.

With reference to FIG. 10, it is important to note the three MJJ configurations associated with the first write operation 1000 and also to note their order: (i) MJJ configuration 1002 (π-state, magnetic soft and hard layers pointing in a first direction); (ii) MJJ configuration 1004 (zero-state, magnetic soft and hard layers pointing in opposite directions); and (iii) MJJ configuration 1006 (π-state, magnetic soft and hard layers pointing in a second direction).

Referring to FIG. 11, it is important to note the three MJJ configurations associated with the second write operation 1100 and also to note their order: (i) MJJ configuration 1006 (π-state, magnetic soft and hard layers pointing in a second direction); (ii) MJJ configuration 1004 (zero-state, magnetic soft and hard layers pointing in opposite directions); and (iii)

MJJ configuration 1002 (π-state, magnetic soft and hard layers pointing in a first direction). A progression of the write operation 1100 in FIG. 11 through the configurations is reversed with respect to the exemplary write operation 1000 of FIG. 10. Also notable, "opposite" configuration 1002 may abstractly represent both anti-parallel configurations, LR (e.g., for FIG. 10) and RL (e.g., for FIG. 11).

The transitions among configurations 1002, 1004, and 1006 may be facilitated by the application of a magnetic field (having an easy axis component). In transition from configurations 1004 to 1006, a concurrent π-Phase_Setting current to define a final state for the memory circuit 100 shown in FIG. 1.

By way of example only and without limitation, for the illustrative write method 1000 shown in FIG. 10, actions may include the following:

(i) First step 1010 involves the application of a magnetic field with an easy axis field component opposing the first direction of the MJJ to transition from configuration 1002 to configuration 1004; and (ii) Next steps 1012 involve [1] the application of a magnetic field with an easy axis field component pointing in the same direction as the first step 1010 of the MJJ, and [2] the application of a positive or negative π-Phase_Setting current in the transition of the MJJ from configuration 1004 to configuration 1006.

Figure 12A:
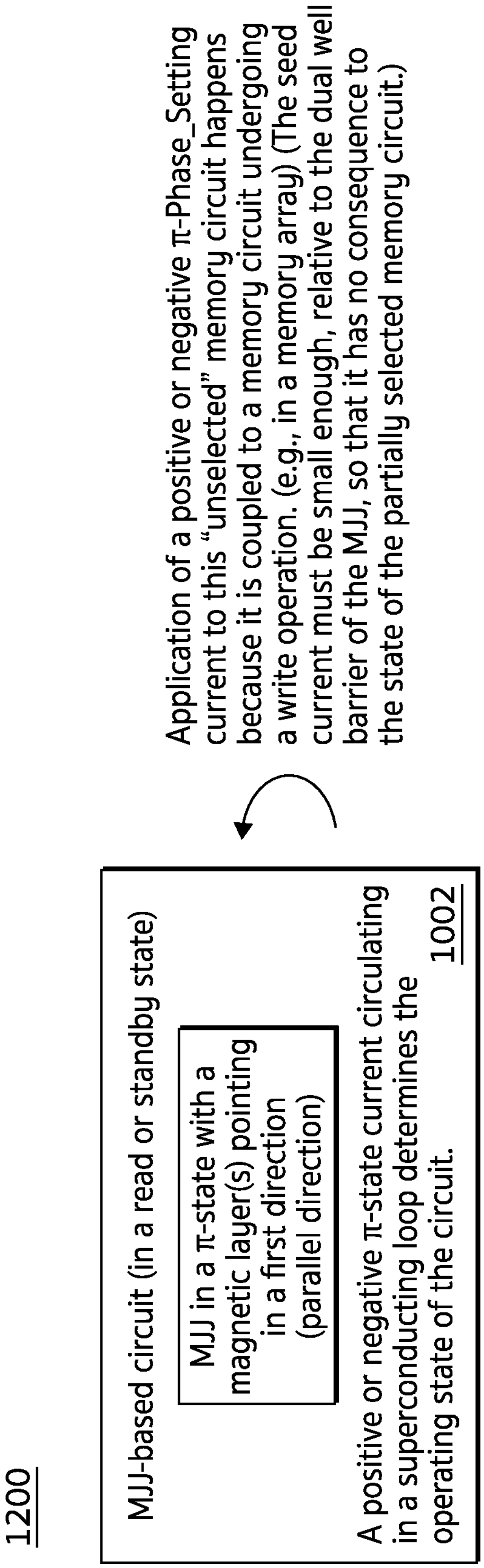
Figure 12B:
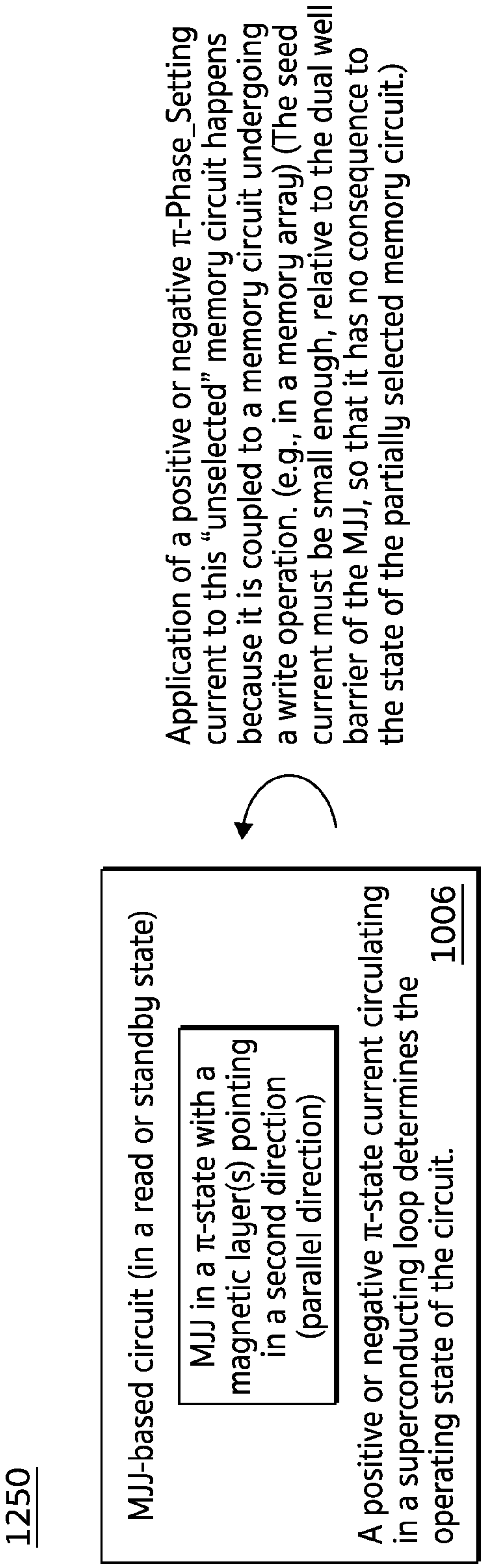

As represented by FIGS. 12A and 12B, half-selected write operations 1200, 1250, involving the application of π-Phase_Setting current exclusively, with no application of a magnetic field on the MJJ of the "half-selected" memory circuit, do not change the state of the circulating current (which represents a Boolean state) of the "half-selected" memory circuits, coupled to the fully selected memory circuit via a write column line, for the exemplary embodiments depicted in FIGS. 2 and 3 and the T-junction write embodiment depicted in FIG. 9.

Figure 13:
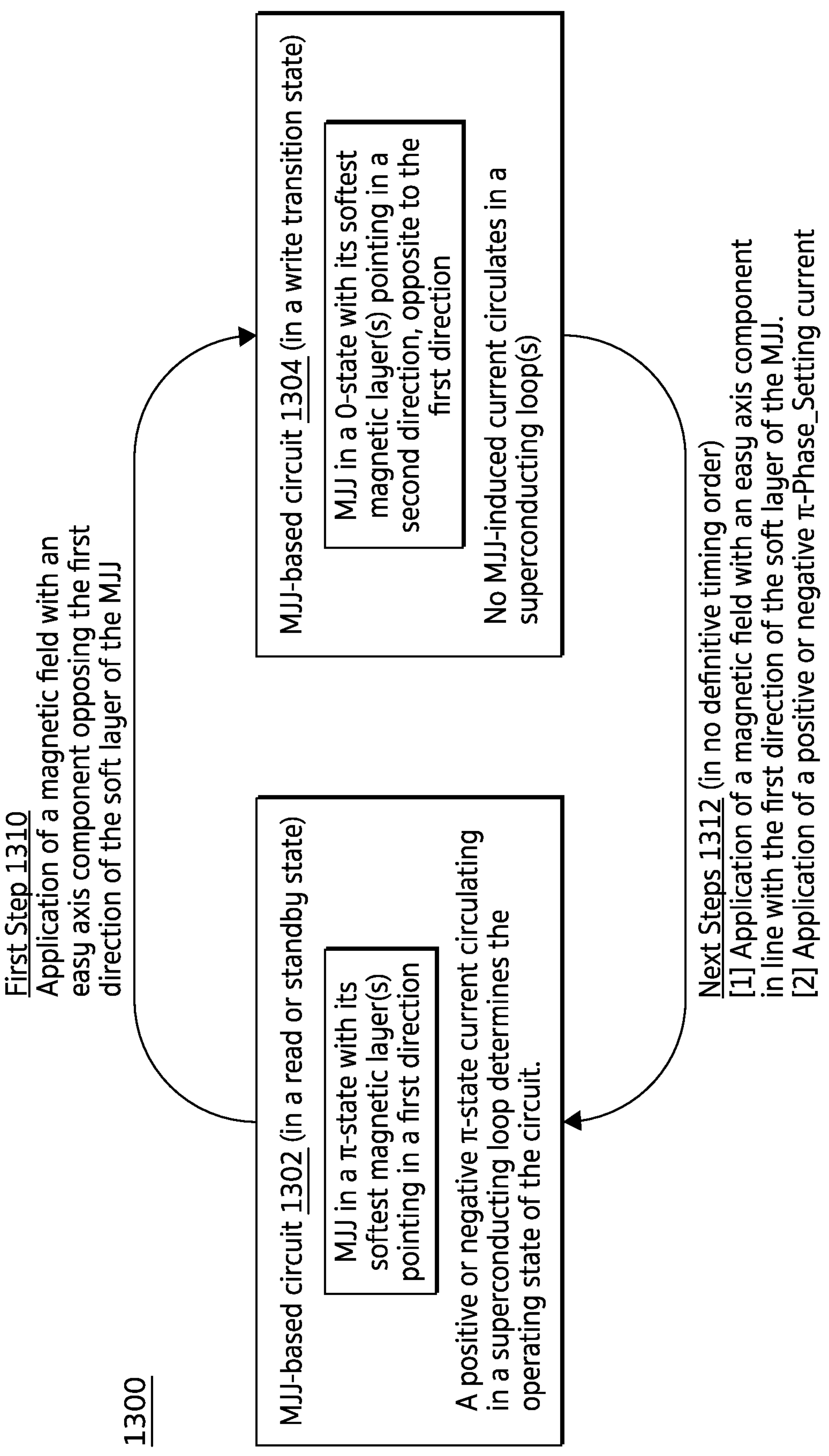

FIG. 13 illustrates an exemplary write method 1300 including write operations for the first and second alternative embodiments depicted in FIGS. 7 and 8, wherein the orientations of the soft and hard layers of the MJJ are notably the same before and after each write operation. To facilitate MJJ transitions from a π-state, through a zero-state, and back to a π-state, like the write operations 1000 and 1100 of FIGS. 10 and 11, respectively, the applied magnetic field has to be reversed notably in the middle of the write operation 1300.

With reference to FIG. 13, it is important to note the sequence of three MJJ configurations associated with the write operation 1300, according to one or more embodiments, as follows: (i) MJJ configuration 1302 (π-state, magnetic soft and hard layers pointing in a first direction); (ii) MJJ configuration 1304 (zero-state, magnetic soft and hard layers pointing in opposite directions); and (iii) MJJ configuration 1302 (π-state, magnetic soft and hard layers pointing in the first direction). Notably, beginning and ending configurations are the same (i.e., MJJ configuration 1302).

The transitions between configurations 1302 and 1304 may be facilitated by the application of a magnetic field (having an easy axis component). Writing may also require a π-Phase_Setting current to define a final state for a memory circuit 100 of FIG. 1.

For the write method 1300 depicted in FIG. 13, actions according to one or more embodiments may include the following:

(i) First step 1310 involves the application of a magnetic field with an easy axis field component opposing the first direction of the MJJ to transition from configuration 1002 to configuration 1004; and (ii) Next steps 1312 involve [1] the application of a magnetic field with an easy axis field component pointing in line with the first direction of the soft layer of the MJJ, and [2] the application of a positive or negative π-Phase_Setting current in the transition of the MJJ from configuration 1004 to configuration 1002.

Figure 14:
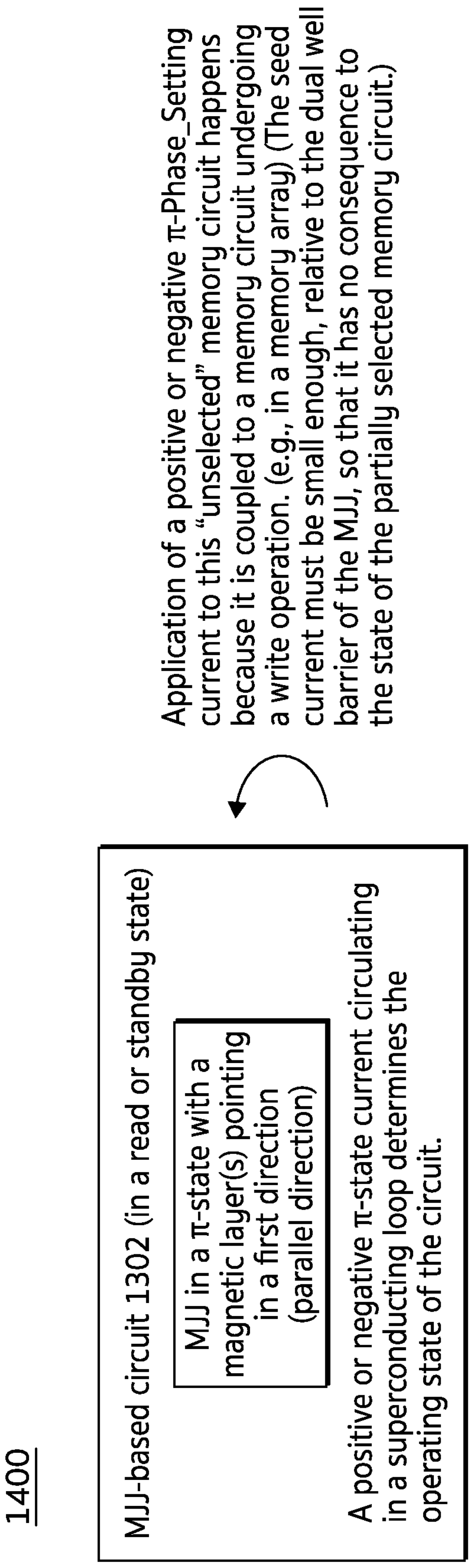

FIG. 14 depicts an exemplary write method 1400 involving "half-select" write operations according to one or more embodiments that, by definition, do not change the state of their corresponding partially selected (i.e., half-selected) memory circuits because their MJJs do not receive a magnetic field. The partially selected memory circuits may be connected to the fully selected memory circuit via a write column line, which conveys a positive or negative π-Phase_Setting current, for the first and second alternative embodiments depicted in FIGS. 7 and 8.

It should be understood that the write operation corresponding to FIG. 8 can be abstracted almost identically with respect to that of FIG. 7, which is abstracted by FIGS. 13 and 14, identical initial and final magnetic domain orientations of the soft and hard layers of the MJJ are anti-parallel for FIG. 8 rather than being parallel for FIG. 7. Also, the zero-state of FIG. 8 is notably anti-parallel whereas it is parallel for FIG. 7.

Memory Circuit Read Margin Advantage

FIG. 15 conceptually illustrates an advantage of increased read margin of a memory circuit, such as the memory circuit 100 shown in FIG. 1, which can be written according to one or more embodiments of the invention. The effective critical current $I_C$ of the memory inductive loop (superconducting loop of memory circuit 100 containing series connected elements 102, 104, 108, and 110) is shown as a function of applied flux, which in this design includes both flux applied via currents and transformers as well as effective flux applied via the Cooper pair phase advance generated by the MJJ. In this diagram, the applied flux 1502, 1506, 1510 and effective flux 1504, 1508 are shown shifting the effective critical current applied along the column line CL (or read bit line) of FIG. 1. A negative circulating current (one opposing the direction of circulating current induced by the read-out flux application) due to the effective flux drives the state to the left from zero (left-facing arrow 1508). A positive circulating current (again due to the π-state of the MJJ) drives the state to the right from zero (right-facing arrow 1504). The readout flux is represented by the three right-pointing arrows. When added to a positive circulating current (from arrow 1504), the readout flux adds the obtuse arrow 1502, and results in a flux marked by the line 1520. When added from zero MJJ flux, the readout flux is represented by the obtuse arrow 1506, and results in a flux marked by line 1522. These two resulting effective $I_C$ values are shown with a difference by double-headed arrow 1532. These two states are the prior art operating states and shift the critical current $I_C$ between the values marked by the "0" and "+π" horizontal lines. In this invention, the negative effective flux represented by the negative circulating current state is shown by arrow 1508. When the readout flux is added, it is shown as obtuse arrow 1510, resulting in a total flux along the vertical line 1524. The corresponding $I_C$ value is represented at the "+π" level, and the difference in margin is shown by the (larger) double-headed arrow 1530 (as opposed to the (smaller) double-headed arrow 1532 of the viable prior art schemes). The vertical lines in the figure indicate the resulting effective critical current, marked by the horizontal lines labeled +π and −π. For reference, a design utilizing zero effective flux (circulating current), is shown as the bottom most rightward facing obtuse arrow 1506, with corresponding $I_C$ shown as the 0-labeled horizontal line. While the absolute critical current threshold for readout for one Boolean state (here the $+\pi$ configuration, in both cases with a positive circulating current state) is the same, the effective critical current readout threshold for the other logical state is much higher in the present approach (at the $-\pi$ level in this design and at the 0 level in earlier designs), providing an increased readout margin budget for the applied readout flux and readout current.

For the original design, the 0 horizontal dashed line indicates the effective critical current during readout. For the $\pi$-to-$\pi$ design, the $-\pi$ horizontal dashed line indicates the effective critical current during readout. Though not a doubling in margin, the difference could be appreciable and overcome variations in readout pulse strength or coupling, or variations in JJ device properties, all of which can degrade the read margin budget.

Write Circuit Alternatives to Assist in Generating Alternating Positive and Negative Magnetic Fields Necessary to Support Embodiments of the Inventive Concept There may be many alternatives contemplated by the inventive concept for generating and driving alternating positive and negative currents (row currents for RAMs), which are required for the generation of the corresponding alternating positive and negative magnetic fields that drive the $\pi$-0-$\pi$ transitions of the MJJ(s) of the present disclosure across, or within, one or more write operations to the MJJ(s). In general, the alternative write operations according to embodiments of the present invention can require bi-directional current applications for magnetic field generation and/or for seed current generation(s).

Superconducting alternatives can exploit flux shuttles to generate, store, and release flux quanta in the process of generating required alternating positive and negative currents, essentially the released flux quanta. Although the prior art may describe (Bi)CMOS-based alternatives that can directly provide positive and negative currents, it does not describe the need for applying, and capability to apply, alternating positive and negative currents along a particular write row line across a single or sequential write operation. Additional alternatives having enhancements required for embodiments of the present invention will be described below in sections entitled "Superconducting Magnetic Field Driver" and "(Bi)CMOS Magnetic Field Driver Integrated Into a RAM."

Superconducting Magnetic Field Driver

For the purpose of applying magnetic fields to magnetic Josephson junctions within at least one superconducting circuit, a store-then-release method, in which flux (current) is built up and stored in a superconducting loop and then released quickly, may be used to apply the highest possible currents to a series of junctions, in sequence. An exemplary circuit, which enables such function, is generally known as a "flux shuttle."

More particularly, according to one or more embodiments of the present invention, a driver is described that incorporates a flux shuttle to direct an opposite current(s) to perform $\pi$-0-$\pi$ state transitions of the MJJ(s) across, or within, one or more write operations to the MJJ(s). In contrast to the flux-shuttle-based driver, a (Bi)CMOS circuit injects current to ground, and thus the current is effectively lost and power dissipated. The term "(Bi)CMOS" as used herein is intended to broadly refer to a circuit and/or circuit element that is non-superconducting. For some applications, as when only one current direction is of interest, sinking current to ground may be preferred for both a flux-shuttle-based driver and a (Bi)CMOS driver. However, with a back-and-forth current required in some embodiments, an opportunity may exist to re-capture the current used in one write cycle and apply such recaptured current for the next write cycle. The flux quanta of the large multi-flux current pulse can be captured instead of lost as described by one or more embodiments of the present invention.

One possible arrangement of a general row circuit is to couple the end of the write row line to the storage inductor of the flux shuttle via mutual inductance and capacitance to drive current through the pump and storage loop in the desired direction. A capturing of flux will artificially cause junctions in the pump to spontaneously flip, generating extra flux in the storage inductor of a flux shuttle within a single clock cycle. This arrangement may require two write row lines. By running one above and one below the MJJ, for example, the desired opposing magnetic fields can be applied. Running the write row lines back to the same side permits control to be done from one side only. Also, to be discussed, with appropriate choice of coupling and termination values, a single write row line can be shared by superconducting flux-shuttle-based drivers disposed on two sides of a memory array for launch and recovery of write currents, using the non-linear nature of junctions to redirect current.

As known in the art, superconducting solutions for generating stored flux as a DC current exist, such as a linear flux shuttle (see, e.g., U.S. Pat. No. 11,476,842; "Superconducting current source system," the disclosure of which is incorporated by reference herein in its entirety) or a flux-shuttle loop (see, e.g., U.S. Pat. No. 9,174,840; "Josephson AC/DC converter systems and method," the disclosure of which is incorporated by reference herein in its entirety).

In some embodiments of the present invention, however, a write driver circuit is described which not only incorporates pairs of flux shuttles, but such a write driver circuit may also include a specialize flip-flop for assessing and asserting opposing current deliveries as required by one or more embodiments of the invention. According to embodiments of the invention, the storage loops of the flux shuttles are configured to connect to write row lines, each write row line passing proximate the row of MJJs so that the write current that it carries during a write operation can generate a local magnetic field(s) that can be coupled into the row of MJJs. The termination of write row lines (write word lines, abbreviated WRLs, for RAMs) can be coupled to the storage inductor (capacitively and/or inductively) to transfer the flux pulses to the storage inductor. Both flux shuttles can be triggered as commonly done to source the write current (write flux).

Figure 16A:
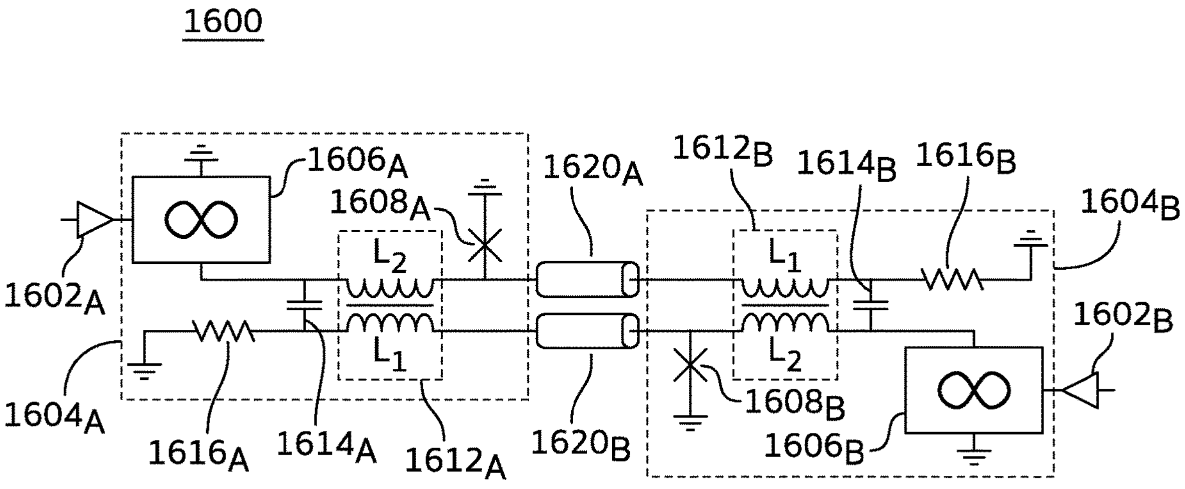
FIGS. 16A through 16C are schematic diagrams of alternative flux shuttle and transmission line arrangements that scavenge energy (flux quanta) expended in one write operation for a next write operation, according to one or more embodiments of the present invention.

FIG. 16A is a schematic diagram depicting at least a portion of an exemplary superconducting alternating current system (write circuit) 1600, according to one or more embodiments of the invention. The superconducting write circuit 1600, when engaged, can drive negative and positive currents, circulating them back and forth through interconnect/transmission lines, in this exemplary application, to generate magnetic fields in the vicinity of MJJs for the purpose of selecting them for a write operation. The superconducting write circuit 1600 includes at least a first JTL $1602_A$, at least a first flux shuttle $1606_A$, at least a first JJ $1608_A$, at least one coupling device (e.g. at least a first transformer $1612_A$, or at least a first capacitor $1614_A$), at least at least a first matched impedance (e.g. a resistor) $1616_A$, a first write row line (transmission line) $1620_A$, at least a second JTL $1602_B$, at least a second flux shuttle $1606_B$, at least a second JJ $1608_B$, at least a second coupling device (e.g. at least a second transformer $1612_B$, and/or at least a second capacitor $1614_B$), at least a second matched impedance $1616_B$, a second write row line (transmission line) $1620_B$, wherein the flux shuttle $1606_A$, coupling element, $1612_A$ or $1614_A$, the impedance matching element 1616, and the Josephson junction $1608_A$ collectively form the current launch and recovery circuit (or "superconducting alternating current circuit") $1604_A$, which can both generate a DC current in the first write row line $1620_A$ and recover current from the second write row line $1620_B$, and the second flux shuttle $1606_B$, the second coupling element, $1612_B$ or $1614_B$, the second impedance matching element $1616_B$, and the Josephson junction $1608_B$ collectively form a second current launch and recovery circuit $1604_B$ for driving and receiving current pulses back and forth in an alternating sequence on transmission lines $1620_A$ and $1620_B$.

The prior art describes flux shuttles, one of which is a JTL-ring-based flux shuttle. Any such flux shuttle, however, can be used in the embodiments of the present invention. The only assumption is that the current is built up within a storage inductor (e.g., the secondary inductor $L_2$ of transformer $1612_A$ in FIG. 16A), but any sufficiently large inductor in series and forming a loop with flux shuttle $1606_A$ and Josephson junction $1608_A$ and then released onto a passive transmission line will work.

A JTL $1602_A$, $1602_B$ can initiate the storage of flux within the flux shuttle. Note that this design is by necessity symmetric from each end, and the operation of the circuit from the A half to the B half works exactly the same as in the opposite direction. After the initial triggering single flux quantum trigger (positive SFQ, or negative SFQ to stop the pump), the flux shuttle runs and generates stored flux in the storage inductor $L_2$ of transformer $1612_A$ (or $1612_B$, when appropriate), grounding through a large control junction $1608_A$ (or $1608_B$, when appropriate) and galvanically coupled to a write row line $1620_A$. (or $1620_B$, when appropriate). To recapture current/flux on the receiving end of the first write row line, the other end of the second write row line $1620_B$ (or $1620_A$, when appropriate) is connected to a transformer $1612_B$, (or $1612_A$, when appropriate) which allows the incoming current in $L_1$ of transformer $1612_B$ (or $1612_A$, when appropriate) to couple into the storage inductor $L_2$ in transformer $1612_B$ (or $1612_A$, when appropriate) of the other flux shuttle $1606_B$. (or $1606_A$, when appropriate). They can be capacitively coupled to increase efficiency and tune impedance. The end termination impedance matching provided by the inductor $L_1$ in transformer $1612_B$, capacitor $1614_B$, and resistor $1616_B$ uses the current of the one write line $1620_A$ (or $1620_B$, as appropriate) to "overdrive" the other flux shuttle $1606_B$ (or $1606_A$, as appropriate) and load up the storage inductor faster than the flux shuttle (e.g., $1606_B$) would on its own.

Figure 16B:
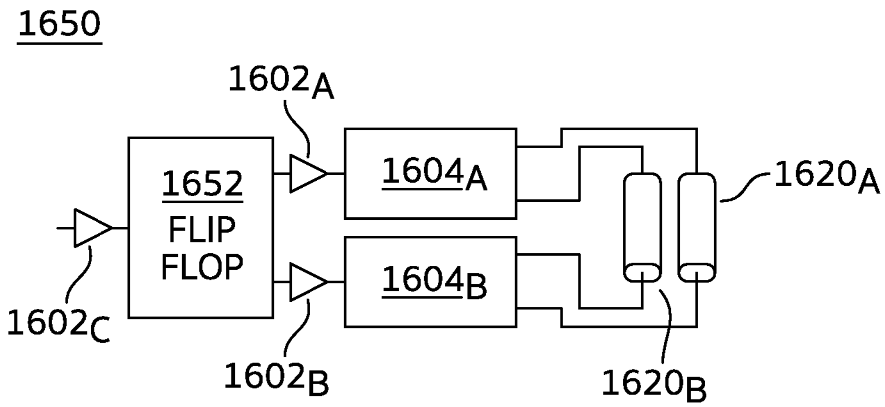

FIG. 16B is a block diagram depicting an exemplary write circuit 1650, according to one or more embodiments. The write circuit 1650 is a simplified version of the exemplary write circuit shown in FIG. 16A to highlight the symmetry of the arrangement and to add in an additional flip-flop element 1652. Specifically, the superconducting write circuit 1650 may include at least a first launch and recovery circuit $1604_A$ (including a flux shuttle $1606_A$), at least a second launch and recovery circuit $1604_B$, at least a first JTL $1602_A$, at least a second JTL $1602_B$, at least a first write row line (transmission line) $1620_A$, at least a second write row line (transmission line) $1620_B$, at least a third JTL $1602_C$, and at least a first flip-flop element 1652, which can both generate a DC current in the first write row line $1620_A$ and recover current from the second write row line $1620_B$, for driving and receiving current pulses back and forth in an alternating sequence on transmission lines $1620_A$ and $1620_B$. FIG. 16B shows an alternative layout wherein the launch and recovery circuits (or "superconducting write circuit") are located proximate to each other and thus the write row lines $1620_A$, $1620_B$ must return to the same proximate location, likely the same side of an array. The flip-flop element 1652 may be used to activate one flux shuttle $1604_A$ and then the other flux shuttle $1604_B$ in alternating write cycles. This is one example of a mechanism to control the flux shuttles and/or to release the stored current. Other variations of these principal embodiments are contemplated and may be better suited depending on the control logic and data encoding in a particular application.

As previously stated, FIG. 16B shows a simplified version of the write circuit 1650. For example, the logic function of the flip-flop element 1652, in practice, may be more complex than is otherwise depicted in FIG. 16B. In one or more embodiments, the flip-flop element 1652 may include not only a traditional flip-flop, but also an output gating (enable) function corresponding with row selection, as explained further with reference to FIGS. 17A, 17B, 17C, and 18, which depict an entire (Bi)CMOS write row system for an MJJ-based RAM.

Figure 16C:
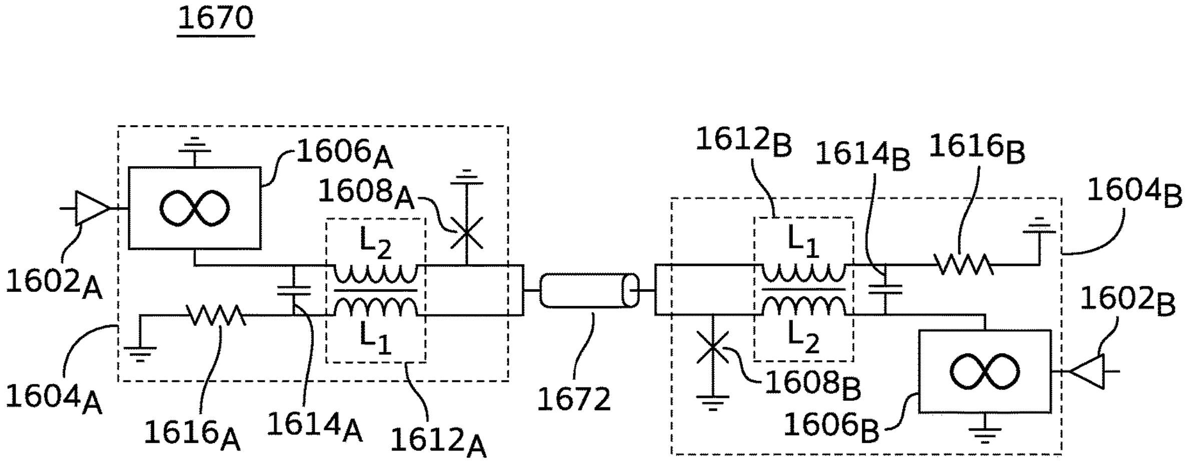

FIG. 16C shows an alternative embodiment of a read-or-write-enabling circuit 1670 having a single write row line 1672 shared for both launch and recovery, according to one or more embodiments. The superconducting read-or-write-enabling circuit 1670 includes at least a first JTL $1602_A$, at least a first flux shuttle $1606_A$, at least a first JJ $1608_A$, at least one coupling device (e.g., at least a first transformer $1612_A$, or at least a first capacitor $1614_A$), at least a first matched impedance (e.g., a resistor) $1616_A$, a write row line (transmission line) 1672, at least a second JTL $1602_B$, at least a second flux shuttle $1606_B$, at least a second JJ $1608_B$, at least a second coupling device (e.g., at least a second transformer $1612_B$, and/or at least a second capacitor $1614_B$), at least a second matched impedance $1616_B$, wherein the flux shuttle $1606_A$, the coupling element, $1612_A$ or $1614_A$, the impedance matching element 1616, and the Josephson junction $1608_A$ collectively form the current launch and recovery circuit (or "superconducting alternating current circuit") $1604_A$, which can both generate a DC current in the write row line $1620_A$. Likewise, the second flux shuttle $1606_B$, the second coupling element, $1612_B$ or $1614_B$, the second impedance matching element $1616_B$, and the Josephson junction $1608_B$ collectively form a second current launch and recovery circuit $1604_B$ for driving and receiving current pulses, where transmission of current pulses occurs back and forth in an alternating sequence of operations overseen by JTLs $1602_A$, $16002_B$ on transmission line 1672. Common circuit elements such as the coupling capacitors $1614_A$, $1614_B$ and transformers $1612_A$, $1612_B$ are shown in a similar configuration. With an appropriate choice of element parameters, the impedance can be matched, or energy capture prioritized. The escape junctions (JJs $1608_A$, $1608_B$) will increase in inductance as current comes in from transmission line 1672, redirecting current towards $L_1$ and thereby pulling current through $L_2$ in the opposite direction, "charging up" the current in the storage loop without relying on the flux shuttle $1606_A$, $1606_B$. In all figures, additional termination resistors may be included to dissipate rather than reflect power.

A read use case for the superconducting read-or-write-enabling circuit 1670 will be described with respect to FIG. 22A.

(Bi)CMOS Magnetic Field Driver Integrated into a RAM

Figure 17A:
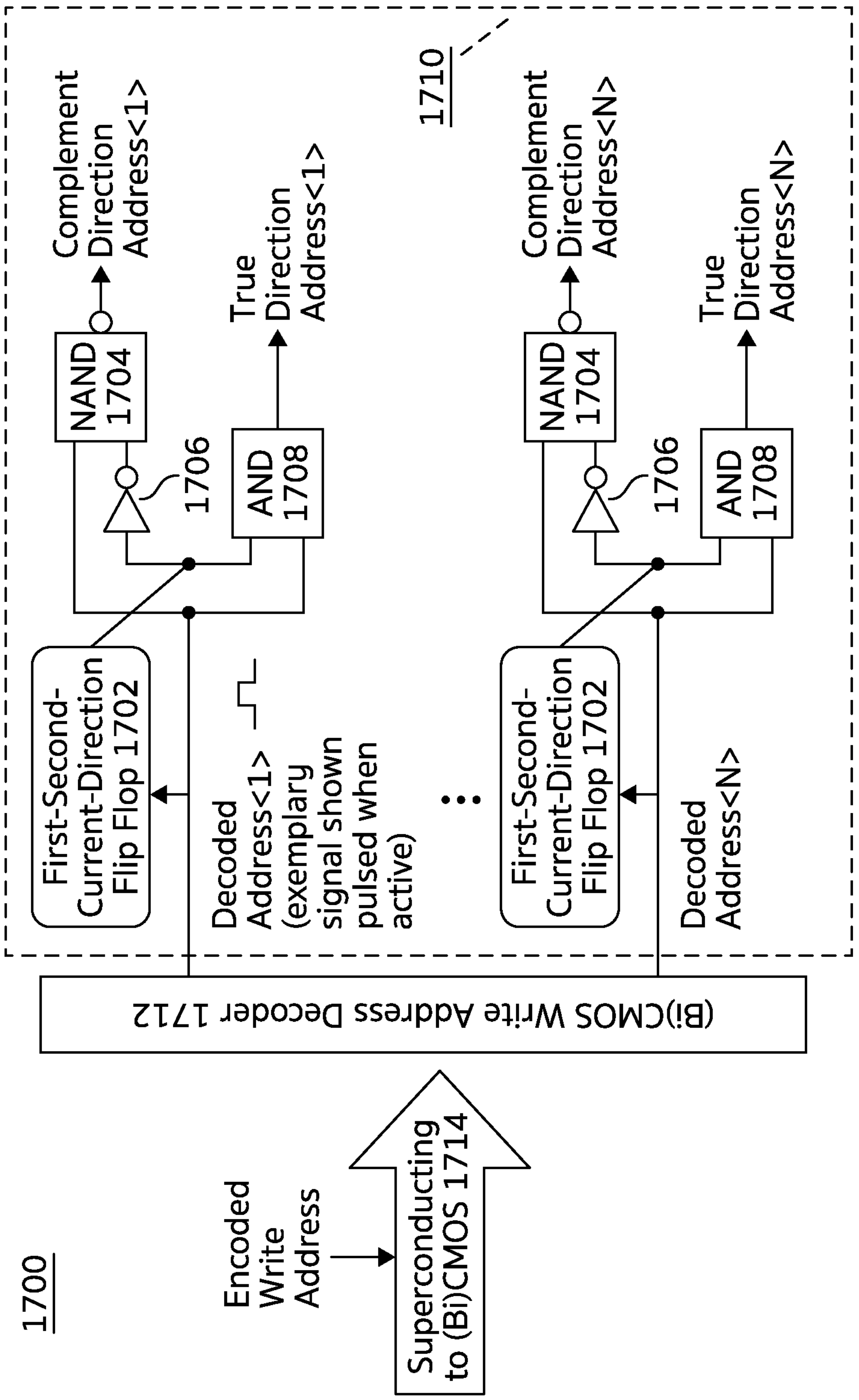
FIGS. 17A and 17B are schematic diagrams, which collectively describe a write row circuit, according to one or more embodiments of the present invention.
Figure 17B:
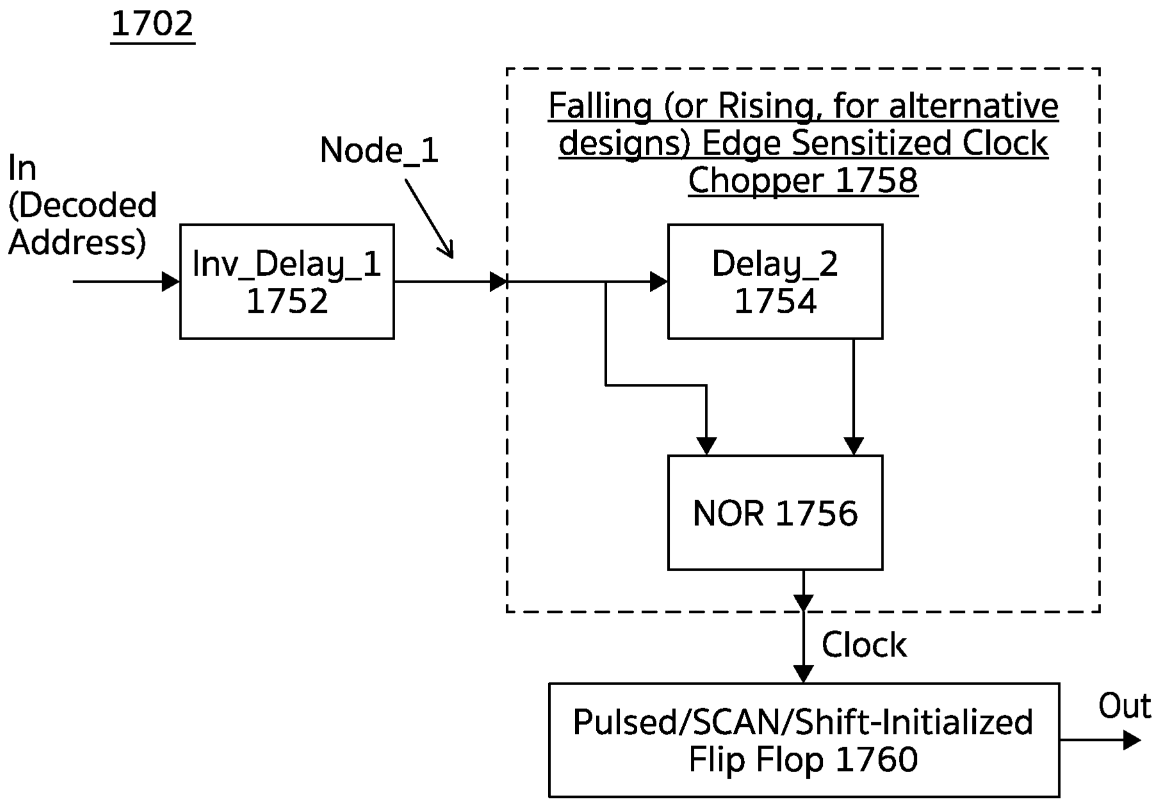

By way of example only and without limitation or loss of generality, FIGS. 17A and 17B are schematic diagrams depicting exemplary circuits suitable for use in connection with a RAM write circuit (an embodiment of which will be discussed with reference to FIG. 18), in accordance with one or more embodiments of the invention. These exemplary circuits are directed to implementing the illustrative write operation described in conjunction with FIGS. 2 through 6 and FIGS. 10 through 12B. It should be understood, however, that modifications to these exemplary circuits can enable any of the write operations described herein and are within the scope of embodiments of the present inventive concept.

FIG. 17A is a schematic depicting at least of an exemplary hybrid superconducting and (Bi)CMOS write address decoder 1700 featuring current reversal control, according to one or more embodiments. The superconducting and (Bi) CMOS write address decoder 1700 may include a (Bi) CMOS write address decoder 1712, conversion circuitry 1714 configured to convert superconducting signals to (Bi) CMOS signals suitable for use with the (Bi)CMOS write address decoder 1712, and a current reversal control circuit 1710 operatively connected to the (Bi)CMOS write address decoder 1712.

Superconducting signals (labelled "Encoded Write Address") can be converted to (Bi)CMOS signals with the aid of Suzuki stacks or other conversion circuitry that may be included in the conversion circuitry 1714, according to one or more embodiments. Interfacing directly with the (Bi)CMOS write address decoder 1712 (and/or (Bi)CMOS row write circuits 1804 to be discussed with reference to FIG. 18), such converted (Bi)CMOS signals may include, for example, (i) write timing triggers, which may be configured to shape the write row line current $I_{WRL}$ into a pulse, (ii) write timing triggers, which may be configured to enable the write row line current $I_{WRL}$ with respect to other signals (e.g., a pulse associated with the write column line currents $I_{WCL\_1}$ and $I_{WCL\_M}$), and (iii) address signals for selecting a particular row in a memory circuit. Optionally, address signals may be "encoded," as noted in FIG. 17A, to decrease a size of the conversion circuitry 1714.

Address and time triggers (clock signals) associated with the write operation can be transferred through the conversion circuitry 1714 which, in one or more embodiments, may provide bit conversions ranging from substantially serial to substantially parallel conversions. Substantially serial bit conversions may notably reduce the superconducting die area associated with the Suzuki stacks, while substantially parallel bit conversions may be employed in applications where increased conversion speed is favored.

The current reversal control circuit 1710 may include, for each bit (1 through N, where N is an integer greater than 1) of the decoded write address, at least one first-second-current-direction flip-flop 1702, at least one NAND gate 1704, at least one invertor gate 1706, and at least one AND gate 1708, wherein a flow of current in a first or second direction through a selected row may be determined by a logic state stored in the first-second-current-direction flip-flop 1702 corresponding to each of the rows in the memory circuit.

Specifically, each bit 1 through N of at least a subset of the bits in the decoded address signal is supplied to an input of a corresponding flip-flop (first-second-current-direction flip-flop) 1702, and to respective first inputs of a corresponding NAND gate 1704 and AND gate 1708. An output of the first-second-current-direction flip-flop 1702 may be connected to a second input of the AND gate 1708 and to an input of the inverter 1706. An output of the inverter 1706 may be supplied to a second input of the NAND gate 1704. An output of the NAND gate 1704 is configured to generate a complement direction address signal, and an output of the AND gate 1708 is configured to generate a true direction address signal. Although the current reversal control circuit 1710 may be described with reference to specific logic gates (e.g., AND 1708, NAND 1704), it is to be appreciated that other arrangements are similarly contemplated using circuit elements that perform equivalent logical functions.

FIG. 17B is a schematic diagram depicting at least a portion of an exemplary first-second-current-direction flip-flop 1702 which may be used in the superconducting and (Bi)CMOS write address decoder 1700 shown in FIG. 17A, according to one or more embodiments. The first-second-current-direction flip-flop 1702 preferably supports the row write circuit of an MJJ-based superconducting RAM. With reference to FIG. 17B, the first-second-current-direction flip-flop 1702 may include a first delay element (Inv_Delay_1) 1752, a falling (or rising, for alternative designs) edge sensitized clock chopper 1758, and a flip-flop 1760 (pulsed/SCAN/shift-initialized flip-flop, or other latch circuit).

More particularly, with reference to FIG. 17B, the first-second-current-direction flip-flop 1702 is adapted to receive, as an input, at least a portion of the decoded address, which is supplied to an input of the first delay element 1752. An output generated by the first delay element 1752 at node 1, which is an inverted and delayed version of the portion of the decoded address input signal In, is supplied to the clock chopper 1758, which may be implemented using a second delay element 1754 and a NOR gate 1756, in some embodiments. Specifically, the output of the first delay element 1752 may be supplied as an input to the second delay element 1754 and to a first input of the NOR gate 1756. An output generated by the second delay element 1754 may be supplied to a second input of the NOR gate 1756 (with the second input essentially being a delayed version of the first input). An output of the NOR gate 1756 may be supplied as a clock signal for triggering the flip-flop 1760. An output of the flip-flop 1760 may form an output (Out) of the first-second-current-direction flip-flop 1702.

A state of the flip-flop 1760 may be inverted after each write operation directed to its corresponding row (to be described in further detail in conjunction with FIG. 18), such that the output (Out) of the flip-flop 1760 drives the logic of the current reversal control circuit 1710 to reverse the current flow in a selected row for subsequent write operations to the row. The first delay circuit 1752 and clock chopper 1758 may be configured to create a trigger (clock) to assure that the current reversal signal is applied at an appropriate time, only after the write operation is complete.

Figure 17C:
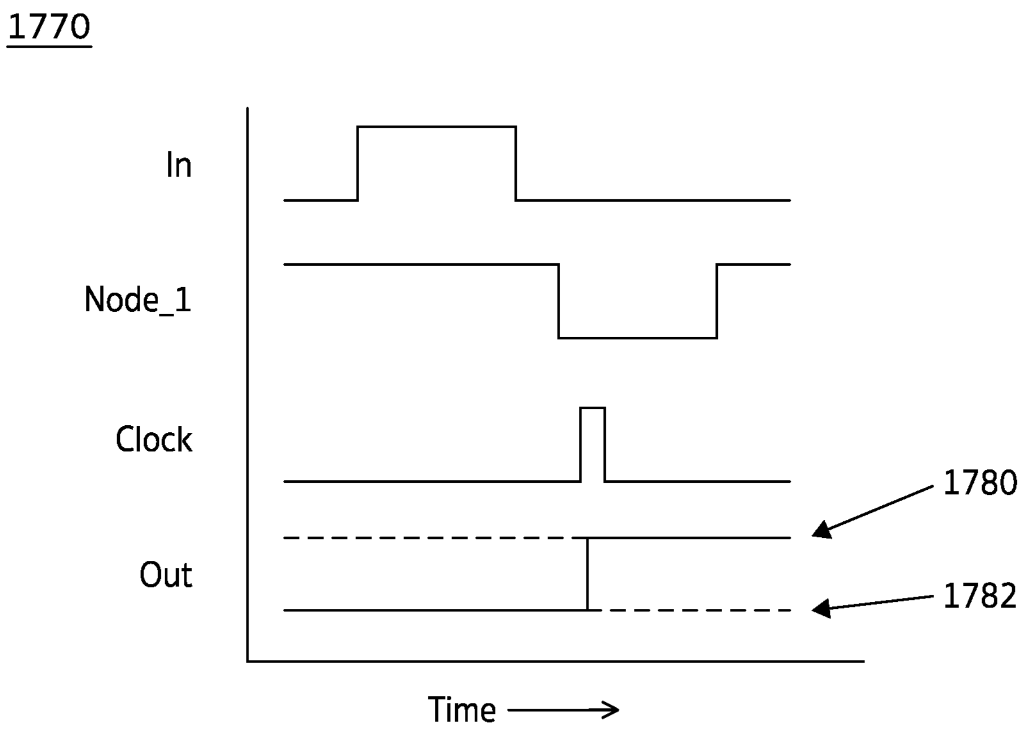
FIG. 17C is a timing diagram, which is used to conceptually describe an internal operation and external function of a first-second-current-direction flip-flop for determining consecutive positive and negative magnetic field applications (e.g., depicted in FIGS. 4 and 5, respectively), according to one or more embodiments of the present invention.

FIG. 17C is an exemplary timing diagram 1770 depicting at least some of the signals generated in the exemplary first-second-current-direction flip-flop 1702 shown in FIG. 17B, which may be useful in describing an internal operation and external function of the first-second-current-direction flip-flop 1702, according to one or more embodiments. The timing diagram 1770 shows a row selection pulse presented at the input ("In") of the first-second-current-direction flip-flop 1702 that may be used to configure the first-second-current-direction flip-flop 1702 for a subsequent row operation by inverting its internal state. The trigger pulse on the clock node (input of flip-flop 1760) preferably assures appropriate timing of events, where the flip-flop 1760 is inverted only after the write operation. Two possibilities of the flip-flop state inversion follow: (i) dashed line 1782

(waveform) indicates a transition of the flip-flop 1760 (or first-second-current-direction flip-flop 1702) from a 1-state to a zero-state; and (ii) solid line 1780 (waveform) indicates a transition of the flip-flop 1760 (or first-second-current-direction flip-flop 1702) from a zero-state to a 1-state.

More generally, a write address decoder for MJJs featuring current reversal control (e.g., circuit 1700 shown in FIG. 17A) may include a write address decoder (e.g., 1712 in FIG. 17A), and a current reversal control circuit (e.g., 1710 in FIG. 17A). Furthermore, as an alternative to the formation of a more local clock (e.g., via the first delay element 1752 and clock chopper 1758 shown in FIG. 17B), it is contemplated that the clocks themselves for triggering the flip-flop(s) 1760 to invert its (their) state can be formed by logically ANDing a global clock with a decoded address (associated with each row).

Figure 18:
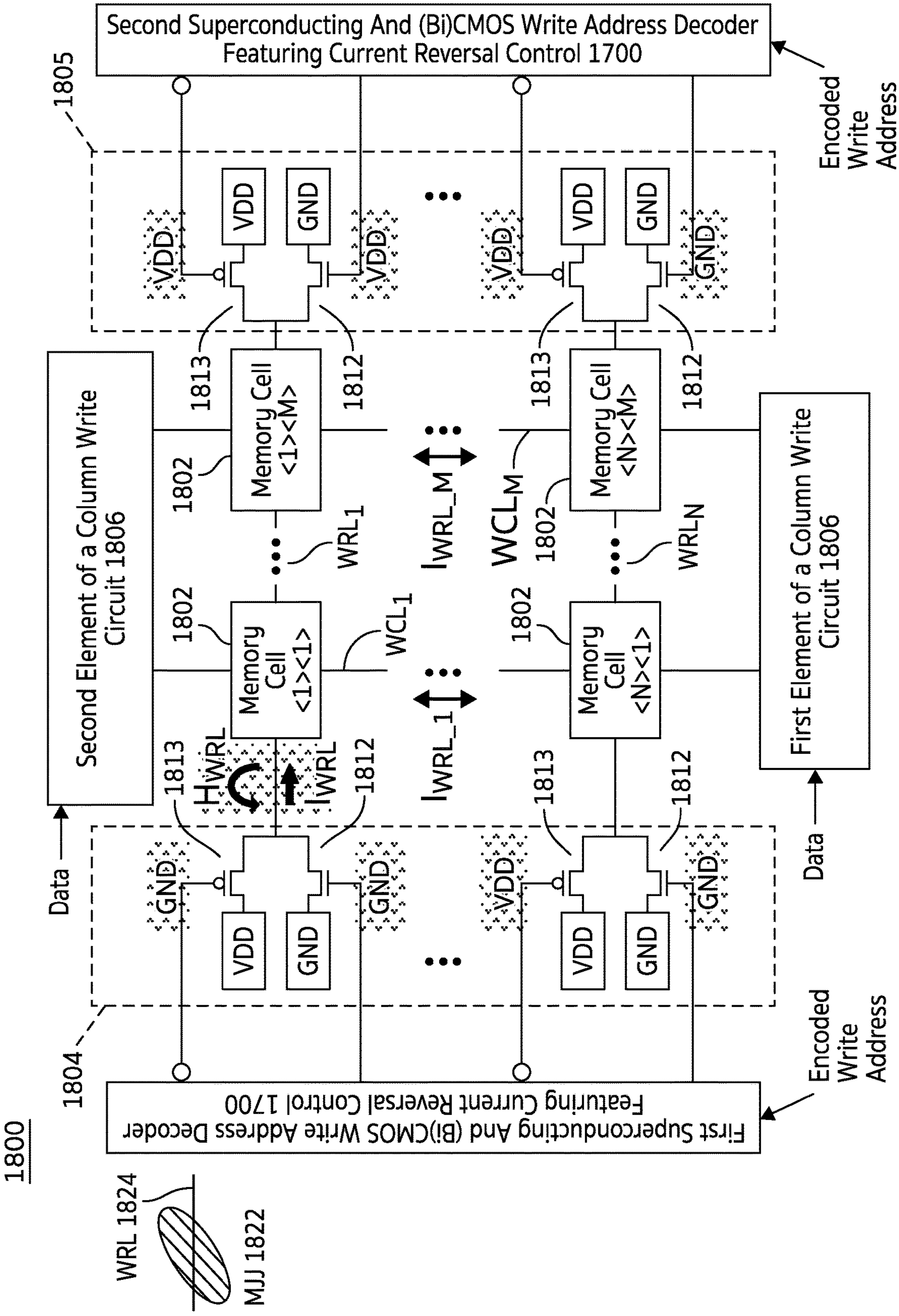
FIG. 18 is a schematic diagram of a write circuit for a random access memory with integrated MJJ-based memory circuits (e.g., FIG. 1), according to one or more embodiments of the present invention.

FIG. 18 is a schematic diagram depicting at least a portion of an exemplary write circuit 1800 for writing MJJs, that may be embedded within superconducting memory cells, using mixed superconducting and (Bi)CMOS write circuits, according to one or more embodiments of the present disclosure. To aid in the comprehension of this illustrative embodiment, conductor currents and exemplary n-channel field-effect transistor (NFET) and p-channel field-effect transistor (PFET) (i.e., FET) gate voltages associated with an active mode of the write circuit 1800 are indicated in FIG. 18 by way of example only and without limitation or loss of generality. Column write line currents generated in the write circuit 1800 can be positive (i.e., first direction) or negative (i.e., second direction) depending on what state is being written into each memory cell in the set of selected memory cells, according to one or more embodiments. It is to be understood, however, that embodiments of the invention are not limited to any particular assignment of current direction and/or polarity.

Moreover, the underlying technology itself used to implement write circuits can be either (Bi)CMOS, superconducting, or a hybrid (combination) of both (Bi)CMOS and superconducting technologies to achieve prescribed necessary applications of magnetic field and flux for writing a superconducting memory cell 1802 having at least one MJJ.

As will be described in further detail below, the write circuit 1800 beneficially enables a clockwise or counter-clockwise application of π-phase setting seed current into superconducting loops of the memory circuit through the MJJ stack of materials via a transformer (e.g., transformer 106 in FIG. 1, the column line connection being formed accordingly) or another coupling element associated with the memory circuit. The write circuit 1800 can be used to "write" or "program" MJJs, which can serve as memory elements in JMRAM and in JMPLAs, as known in the art. Also required for a write operation, the write circuit 1800 generates a bidirectional easy axis field component in a plane of the MJJ.

With continued reference to FIG. 18, the write circuit 1800 preferably includes a plurality of memory cells 1802, memory cell<1><1> through memory cell<N><M>, where N and M are integers (N and M may or may not be the same), at least one (Bi)CMOS row write circuit 1804, a column write circuit 1806 (including first and second elements in this exemplary embodiment), a plurality of write row lines, $WRL_1$ through $WRL_M$, connected to the row write circuit 1804 and preferably arranged in a row (e.g., horizontal) orientation, and a plurality of write column lines, $WCL_1$ through $WCL_M$, connected to the column write circuit 1806 and preferably arranged in a column (e.g., vertical) orientation, perpendicular to the write line rows. In this configuration, wherein each memory cell 1802 to be written may have at least one MJJ, the (Bi)CMOS row write circuit 1804 may be configured to generate a write row line current, $I_{WRL}$, that is conveyed by a selected one of the write row lines $WRL_1$ through $WRL_N$. It is to be understood that the column write circuit 1806 may preferably be superconducting, which would provide a substantial savings in power, but the column write circuit 1806 need not be superconducting; that is, the column write circuit 1806 may be implemented using non-superconducting elements, or a hybrid of superconducting and non-superconducting elements (e.g., depending on a desired trade-off between chip area and power consumption).

A first element of the column write circuit 1806 (which is preferably superconducting to provide substantial power savings, but need not necessarily be superconducting), which may be connected to a bottom end of each of the write column lines $WCL_1$ through $WCL_M$, and a second element of the column write circuit 1806 (which is preferably superconducting, but need not necessarily be superconducting), which may be connected to a top end of each of the write column lines, may be collectively configured to generate a plurality of write column line supercurrents, $I_{WCL\_1}$ through $I_{WCL\_M}$, that are conveyed by the write column lines $WCL_1$ through $WCL_M$, respectively. It is contemplated that more than one write column line may be associated with each column of memory cells 1802; that is, a memory cell 1802 may require more than one column input to complete a write operation, either for selection or for state definition. Likewise, it is contemplated that more than one write row line may be associated with each row of memory cells 1802; that is, a memory cell 1802 may require more than one row input to complete a write operation, either for selection or for state definition.

Each of the write column lines 1 through M ($WCL_1$ through $WCL_M$) may be configured to convey a write column line current, $I_{WCL\_1}$ through $I_{WCL\_M}$, respectively, for writing state into the memory cells 1802, and may be arranged, in some embodiments, to pass through a transformer in each of at least a subset of the memory cells 1802. As previously stated in conjunction with the exemplary memory circuit 100 of FIG. 1, the transformer 106 of the exemplary memory circuit 100 may receive a clockwise or counter-clockwise π-phase setting seed current that induces a proportional secondary current for setting a clockwise or counter-clockwise π-phase current in the superconducting loops of the memory circuit 100. In the exemplary write circuit 1800 of FIG. 18, each of at least a subset of the memory cells 1802 may comprise the exemplary memory write circuit 1800 of FIG. 18, connected in a serial fashion along a given write column line of the write circuit 1800, for example by connecting each second terminal "In_Out_2_π-Phase_Setting" of the memory cell 100 (FIG. 1) to each first terminal "In_Out_1_π-Phase_Setting," except at the ends of the write column line where a column line, thereby formed, of memory cells 1802 connects to a second element of a column write circuit 1806 (which is preferably superconducting, but need not necessarily be superconducting) at a first end, and to a first element of a column write circuit 1806 at a second end along the given write column line WCL for setting a clockwise or counter-clockwise π-phase current in the superconducting loops of each of the memory cells, and in particular, of a "selected" one of the memory cells 1802.

The first and second elements of the column write circuit 1806 can act collectively to control the direction of the write column line currents $I_{WCL\_1}$ through $I_{WCL\_M}$, qualifying each of the column line currents as negative or positive currents, as described in U.S. application Ser. No. 17/993,586 to Reohr, which is incorporated herein by reference in its entirety. Each datum of the data preferably defines a sign (i.e., direction) of the current flowing in a corresponding column. It should be noted that the data is supplied to both the first and second elements of the column write circuit 1806 where it may be used to trigger portions of a superconducting circuit into a voltage state, which diverts and directs currents along a particular path that defines the sign of the current conveyed in each of the respective write column lines $WCL_1$ through $WCL_M$.

In one or more embodiments, column currents can induce clockwise or counter-clockwise π-phase setting seed currents in the superconducting loops of the memory cells 1802. While not identical to a (Bi)CMOS push-pull circuit in its internal function, the superconducting bidirectional driver described in U.S. application Ser. No. 17/993,586 to Reohr performs a similar global function as the push-pull circuit; that is, to drive a positive or negative current (i.e., in a first or second direction) based on an input datum signal.

Alternative (Bi)CMOS and superconducting column write circuits (to 1806) are known in the art and may be configured for use in conjunction with at least some aspects of the present inventive concept. Some of them support write column line currents $I_{WCL}$ that may be sourced by, and returned to, the same superconducting column write circuits. This capability is enabled by the use of wrap-around connections in the write column lines, each wrap-around connection being configured to connect a pair of adjacent even and odd write column lines.

The (Bi)CMOS row write circuit 1804 may comprise a plurality of FET switches (NFET switches 1812 and PFET switches 1813, or alternative switch elements), configured by the superconducting and (Bi)CMOS write address decoder featuring current reversal control 1700 (FIG. 17A) to selectively control which of the write row lines $WRL_1$ through $WRL_N$ will convey the write row line current $I_{WRL}$ for selecting a row of the memory cells 1802<1><1> through <N><M>, and what direction the write row line current $I_{WRL}$ within the selected row will take for a write operation (in different words, negative or positive current), in one or more embodiments. Functioning together, corresponding pairs of FETs (NFET 1812 and PFET 1813) in the first and second (Bi)CMOS row write circuits 1804, 1805 are configured to selectively control which of the write row lines $WRL_1$ through $WRL_N$ will convey the write row line current $I_{WRL}$ for writing the memory cells 1802, and to control a direction of the write row line current.

More particularly, each of the FETs (NFETs 1812 and PFETs 1813) in the first and second (Bi)CMOS row write circuits 1804, 1805 preferably includes a first source/drain connected to a corresponding one of the write row lines, $WRL_1$ through $WRL_N$, a second source/drain connected to a voltage source, which may be programmable, and a gate adapted to receive a corresponding one of a plurality of control signals generated by superconducting and (Bi)CMOS write address decoders featuring current reversal control 1700—a first decoder 1700 configured to generate a first subset of control signals supplied to the first row write circuit 1804, and a second decoder 1700 configured to generate a second subset of control signals supplied to a second row write circuit. The first and second subsets of control signals may function in conjunction with one another to enable or disable a pair of FETs (NFETs 1812 and PFETs 1813) in the first and second row write circuits 1804, 1805 that are associated with the same write row line. In one or more embodiments, the voltage supplied to the second source/drain of each of the NFETs 1812, 1813 may be independently controlled so that an amplitude and direction of the write row line current $I_{WRL}$ can be optimized according to characteristics of the individual MJJs in each of the memory cells 1802 to be written.

By way of example only and without limitation, for two corresponding pairs of FETs 1812, 1813 (a first NFET 1812 and a first PFET 1813; and a second NFET and a second PFET) connected to the same write row line, such as $WRL_1$, when configured such that a source/drain of the FETs 1812, 1813 in the second row write circuit 1805 are connected either ground and VDD, respectively, and a source/drain of the FETs 1812, 1813 in the first row write circuit 1804 are connected to ground and VDD, respectively, a write row line current $I_{WRL}$ will flow in one of two directions depending on the first and second subsets of control signals. Shown in FIG. 18, for example, are the voltages (i) that can induce a write row line current $I_{WRL}$ to flow from the first row write circuit 1804 to the second row write circuit 1805 conveyed through write row line 1, $WRL_1$, and (ii) that can disable all other current paths between write row circuits 1804 and 1805 corresponding to other rows—write row line 2, $WRL_2$, through write row line N, $WRL_N$. Likewise, a different set of voltages can be applied that (i) induce a write row line current $I_{WRL}$ from the second row write circuit 1805 to the first row write circuit 1804 and that (ii) can disable all other current paths between write row circuit 1804 and 1805. Current flow may be managed by control signals to gates of the corresponding FETs (which can be driven to either ground or VDD). As known in the art, a push-pull circuit configuration for each write row line WRL can thus be enabled, which spans write row circuits 1804, 1805 and one of the write row lines, $WRL_1$ through $WRL_N$. In one or more embodiments, only one pair of FET switches is enabled during a given write cycle to direct the write row line current $I_{WRL}$ through a selected write row line and in a specified direction. Regulated voltages can be introduced at points labelled "VDD" to control the magnitude of write row line current in this circuit.

In FIG. 18, an exemplary MJJ 1822 and a segment of an WRL 1824 has been included beside the memory write circuit 1800 to indicate a preferred relative orientation of all MJJs, corresponding to memory cells 1802, with respect to the write row lines, $WRL_1$ through $WRL_N$. Notably below 90 degrees, such preferred orientations reduce the requirements on the magnetic field to drive the magnetic layers of each MJJ in the memory cells 1802 from a first π-state, through a zero-state, to a second π-state, thereby reducing the magnitude of the required write row line current, which generates the magnetic field. This minimum write margin for an MJJ is exhibited in FIG. 4 and labelled "(iv) New π-state."

Schematics for Writing PLAs and FPGAs

Figure 19:
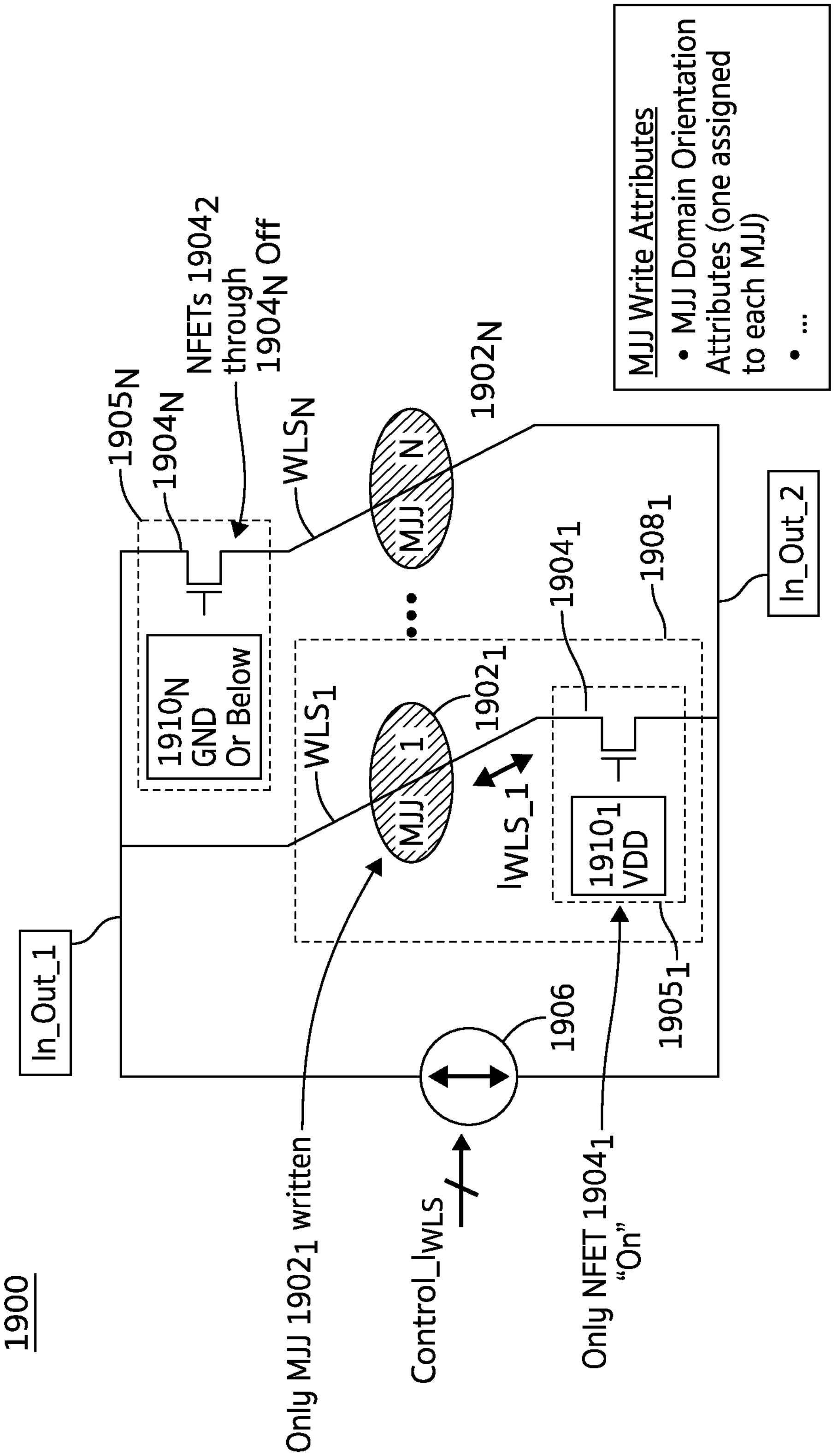
FIG. 19 is a schematic diagram conceptually depicting a magnetic field application portion of an exemplary MJJ write circuit, including integrated write switches and MJJ domain(s) orientation attribute(s)s, according to one or more embodiments of the present invention.
Figure 20:
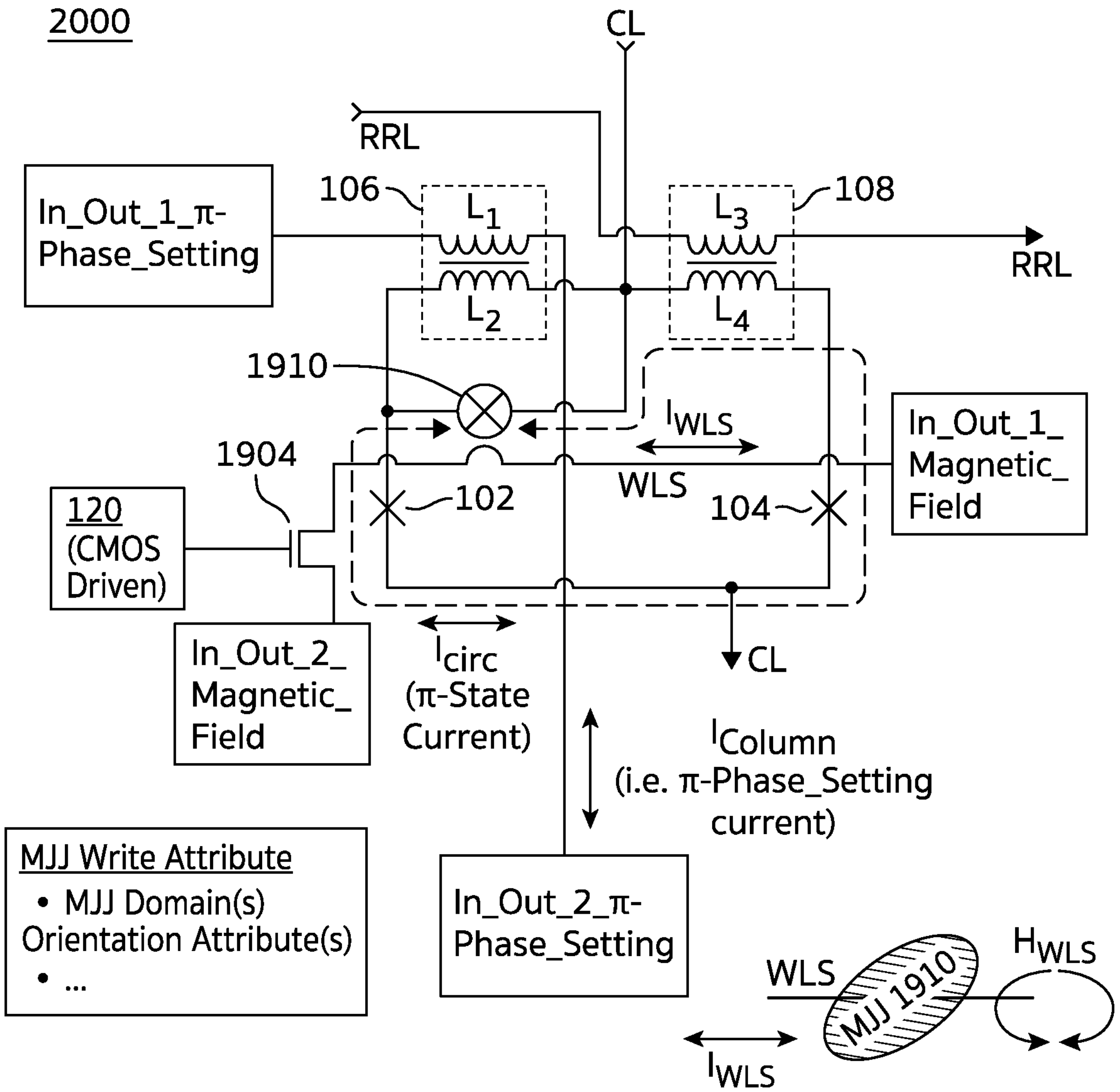
FIG. 20 is a schematic diagram depicting an exemplary MJJ-based memory circuit including at least one integrated write switch and an MJJ domain(s) orientation attribute(s), according to one or more embodiments of the present invention.
Figure 21:
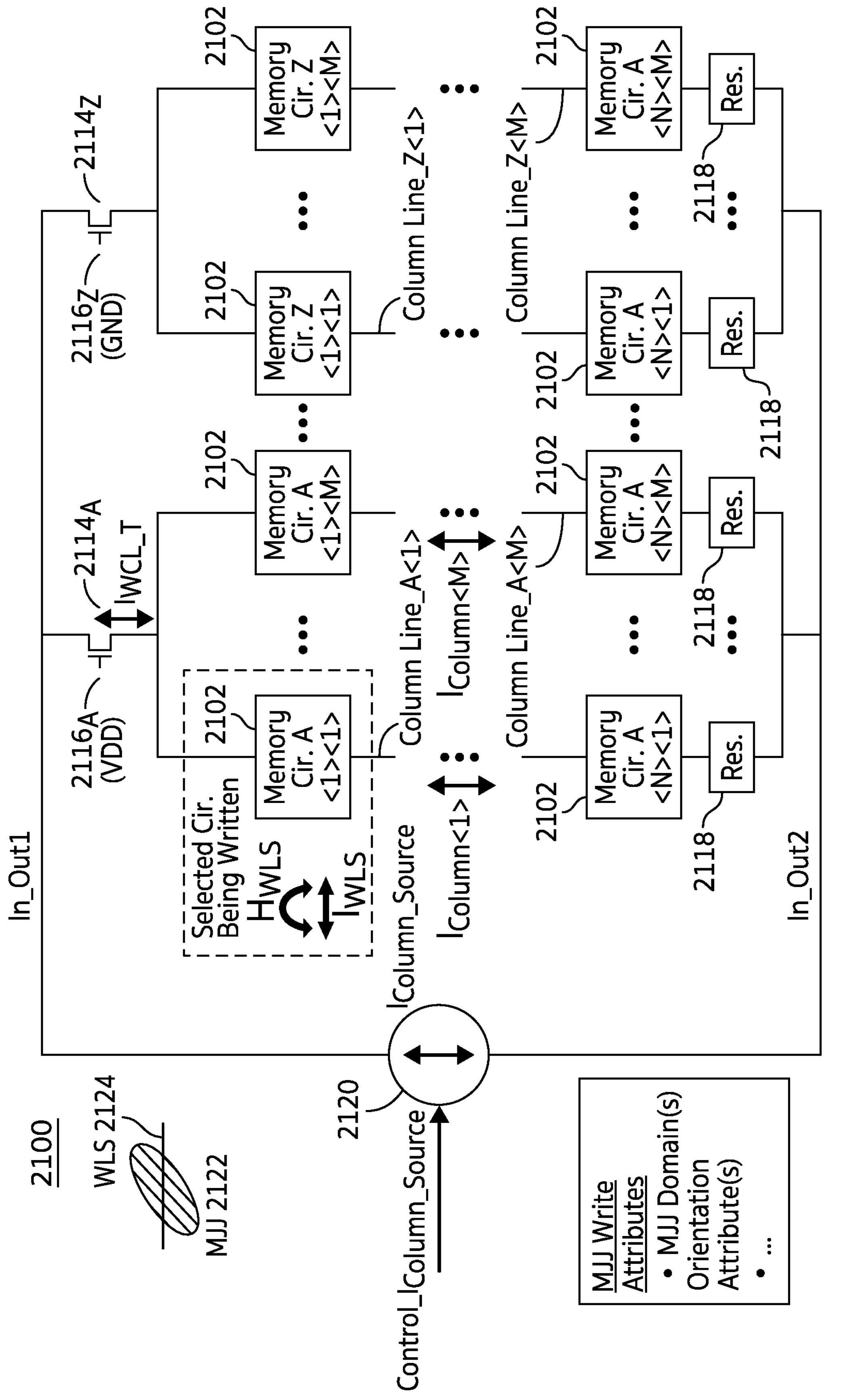
FIG. 21 is a schematic diagram depicting at least a portion of an exemplary circuit for writing MJJs, including, at least, MJJ domain(s) orientation attribute(s)s for each of the MJJs, according to one or more alternative embodiments of the present invention.

By way of example only and without loss of generality, FIGS. 19, 20, and 21 depict exemplary schematics useful in describing techniques for writing a memory circuit, for example, PLA, ROM, and/or FPGA, according to one or more embodiments of the invention. Methodologies for writing the exemplary circuits shown in FIGS. 19-21 are distinguishable over conventional/known approaches, at least by virtue of their additional capability of sourcing alternately reversed applied easy axis magnetic field component(s) required for realizing an easy-axis-based π-0π state transition on at least one MJJ, selected from among a set of MJJs. As noted already in all astroid-based figures, such as FIGS. 4 and 5, an applied magnetic field(s) can include hard axis field component(s) in addition to the easy axis field component(s) to reduce the total field strength required to surmount magnetic switching thresholds of free and fixed layers of an MJJ.

An application of FIGS. 19, 20, and 21 to the preferred write method already described with reference to FIGS. 2, 3, 4, 6, 10, 11, 12, will now be described. Current conveyance can be enabled by the underlying (Bi)CMOS circuits. An advancement to known circuits and methodologies for writing MJJ-based memory circuits, taught in this particular embodiment of the present disclosure, may involve the inclusion of at least one MJJ domain(s) orientation attribute(s), which plays a similar role to that of the first-second-current-direction flip-flop 1702 of FIG. 17A for the (Bi) CMOS write address decoder 1700 featuring current reversal control. The MJJ domain(s) orientation attribute(s) coordinates current reversal between present and next write operations directed to at least one particular MJJ such that an easy-axis-based π-0-π state transition can be realized for both writes. In other words, the magnetic field applied to the MJJ should oppose its soft and hard layer domain orientations.

FIG. 19 is a schematic diagram conceptually depicting a magnetic field application portion of an exemplary MJJ write circuit 1900, according to one or more embodiments of the invention. The MJJ write circuit 1900 beneficially provides a reliable, process variation-resistant mechanism for programming (i.e., writing) the phases (e.g., states) of MJJs in MJJ-based circuits. With reference to FIG. 19, the MJJ write circuit 1900 includes a plurality of MJJs, 19021 through 1902N, each MJJ being associated with a unique corresponding write line segment (WLS) line, $WLS_1$ through $WLS_N$, respectively, where N is an integer greater than one. The WLS associated with a given MJJ is preferably oriented at an angle with respect to a major axis of the MJJ, rather than arranged orthogonally relative to the major axis, as the WLS passes over and proximate to a free (soft) layer of the MJJ. As previously stated, arranging the WLS at an angle to the major axis of the MJJ may reduce the magnetic field requirements necessary to write the MJJ. As will be known by those skilled in the art, an MJJ is generally formed in the shape of an ellipse having a major axis and a minor axis, with the major axis being longer than, and perpendicular to, the minor axis of the ellipse.

Each MJJ-based memory circuit 1908 preferably includes, at least one MJJ, MJJ_1 through MJJ_N, at least one WLS, $WLS_1$ through $WLS_N$, and at least one transistor, which may be an n-channel FET (NFET) device (e.g., an n-channel metal-oxide semiconductor field-effect transistor (MOSFET)), NFET $\mathbf{1904}_1$ through $\mathbf{1904}_N$, respectively, connected in series with the corresponding WLS to selectively connect the WLS to a current source 1906. In one or more embodiments, the current source 1906 is an analog current source programmable to generate positive and negative current (i.e., bidirectional) of a prescribed amplitude, $I_{WLS}$, on successive write cycles to the memory cell, and vice versa, which drive easy-axis-based π-0-π state transitions, through wires into and out of a bus or other interconnect (e.g., In_Out_1, In_Out_2) of the selected WLS and corresponding selected FET $\mathbf{1904}_1$, $\mathbf{1904}_N$.

In one or more alternative embodiments, the current source 1906 may be configured to generate a current in one direction only, and a control circuit, such as an H-bridge or the like, may be employed in conjunction with the current source 1906 to selectively change a direction of the current $I_W$ flowing through the WLS, as will become apparent to those skilled in the art. In some embodiments, an H-bridge circuit may be incorporated into the current source 1906 to form a bidirectional current source. Furthermore, the transistors $\mathbf{1904}_1$ through $\mathbf{1904}_N$ used to selectively connect the WLS lines to the interconnects In_Out_1 and/or In_Out_2 may include a first subset of top transistors (e.g., $\mathbf{1904}_N$), each connecting a first one of the interconnects In_Out_1 to a corresponding WLS, and a second subset of bottom transistors (e.g., $\mathbf{1904}_1$), each connecting a second one of the interconnects In_Out_2 to a corresponding WLS. In other embodiments, a given WLS may include both top and bottom transistors, only top transistors, or only bottom transistors. The dashed lines $\mathbf{1905}_1$ through $\mathbf{1905}_N$ are included to indicate a generalized current switch that can be implemented with (Bi)CMOS circuit elements, such as BJTs or a combination of FETs and BJTs, and may include the first and second subset of transistors along with the corresponding WLS lines in the MJJ-based memory circuit which will be described with reference to FIG. 20. For clarity, only one MJJ write circuit is shown in FIG. 19, although it is to be appreciated that embodiments of the invention are not limited to the specific arrangement shown. When one of the transistors is active (i.e., turned on or enabled), such as transistor $\mathbf{1904}_1$, the remaining N-1 transistors are preferably inactive (i.e., turned off or disabled), such as transistors $\mathbf{1904}_2$ through $\mathbf{1904}_N$.

FIG. 20 is a schematic diagram illustrating an exemplary MJJ-based memory circuit 2000, according to one or more embodiments of the invention. The MJJ-based memory circuit 2000 includes, MJJ-based memory circuit 100 (of FIG. 1), at least one integrated write switch, FET 1904, and an MJJ domain(s) orientation attribute(s) associated with the MJJ 110 (1910 of FIG. 19), wherein the MJJ domain(s) orientation attribute(s) is used to direct the write line segment current, $I_{WLS}$, to generate an easy axis field component which opposes the parallel domain orientations of soft and hard layers of the MJJ 1910 to enable an easy-axis-based π-0-π state transition for both even and odd write selections.

FIG. 21 is a schematic diagram depicting at least a portion of an exemplary write circuit 2100 for writing MJJs, including at least one MJJ domain(s) orientation attribute(s) for each of the MJJs, according to one or more alternative embodiments of the present invention. As will be described in further detail below, the write circuit 2100 beneficially sources a clockwise or counter-clockwise π-phase-setting seed current into superconducting loops of the memory circuit through an MJJ stack of materials via an inductor associated with a memory cell (exemplary details of the memory cell are explicitly shown in FIG. 20, according to some embodiments). The write circuit 2100 may be used to "program" MJJs, which, for example, may serve as a memory element, which acts as a programmable switch in Josephson magnetic programmable logic arrays (JMPLAs), as described, for example, in U.S. Pat. No. 9,595,970 by W. Reohr, et. al., the disclosure of which is incorporated by reference herein in its entirety, and which can serve as a memory element for other programmable circuit functions in superconducting FPGAs, among other applications.

The write circuit 2100 includes a plurality of memory circuits 2102 (e.g., 2000 of FIG. 20) arranged into a plurality of write columns, A through Z, although embodiments of the invention are not limited to any specific number of write columns. The memory circuits 2102 in each of the write columns A through Z may be further divided into one or more write column lines, 1 through M, where M is an integer greater than one, with each write column line including a plurality of memory circuits, 1 through N, where N is an integer greater than one. Each of the memory circuits 2102 may be labeled according to the unique row and write column line with which it is associated. Thus, for example, a memory circuit 2102 in write column A, row 1, write column line 1, may be designated as memory circuit A<1><1>, and a memory circuit in write column A, row N, write column line M, may be designated as memory circuit A<N><M>. Similarly, a memory circuit 2102 in write column Z, row 1, write column line 1, may be designated as memory circuit Z<1><1>, and a memory circuit in write column Z, row N, write column line M, may be designated as memory circuit Z<N><M>.

The write circuit 2100 further includes a plurality of (Bi)CMOS switches, which in one or more embodiments may comprise NFETs $\mathbf{2114}_A$ through $\mathbf{2114}_Z$, each NFET being connected in a corresponding one of the write columns A through Z, respectively. More particularly, each of the NFETs $\mathbf{2114}_A$ through $\mathbf{2114}_Z$ preferably includes a first source/drain connected to a first terminal of a write current source 2120 via a first interconnection, In_Out1, a second source/drain connected to a first end of the plurality of column lines 1 through M associated with a corresponding one of the write columns, and a gate configured to receive a corresponding one of a plurality of control signals, $\mathbf{2116}_A$ through $\mathbf{2116}_Z$, supplied thereto. A second end of each of the write column lines in the respective write columns A through Z is connected, through a series-connected resistor 2118 or other resistive element (e.g., a wire), to a second terminal of the write current source 2120 via a second interconnection, In_Out2. In one or more embodiments, the write current source 2120 is configured to supply a bidirectional write current, $I_{Column_Source}$, for writing state into the plurality of memory circuits 2102.

In this illustrative array-like embodiment shown in FIG. 21, the write circuit 2100 is configured to write only one memory circuit 2102 at a time. By way of example only and without loss of generality, for illustrating an operation of the write circuit 2100, a write operation directed to a selected memory circuit A<1><1> is indicated using a dashed box which surrounds this memory circuit. Also shown in the dashed box is a write line segment current $I_{WLS}$ and a write line segment magnetic field $H_{WLS}$ generated by a write line segment current, which passes through a write line segment WLS 2124, and acts upon an MJJ 2122, of the "selected" memory cell (to generate a magnetic field, having an easy axis field component, in particular). In order to source positive or negative π-Phase_Setting current (Boolean state) for writing memory circuit A<1><1>, NFET $\mathbf{2014}_A$ is activated (i.e., turned on), such as by application of a high voltage (e.g., VDD) control signal $\mathbf{2116}_A$ applied to the gate of the NFET $\mathbf{2114}_A$. A write line segment current, $I_{WLS}$, which may be applied only to memory circuit A<1><1>, preferably generates at least an easy axis magnetic field component which can select the memory cell for a write operation, consistent (i) with the relative orientations of WLS 2124 and MJJ 2122, and (ii) with FIG. 20 (the inclusion of FET 1904, disclosed herein, for selectively writing a memory cell).

Each of the write column lines 1 through M in each of the write columns A through Z is preferably configured to convey a write current for writing state into the memory circuits 2102, and may be arranged, in some embodiments, to pass through a transformer in each of at least a subset of the memory cells 2102. As previously described in connection with the illustrative memory circuit 2000 shown in FIG. 20, the transformer 106 of the exemplary memory circuit 2000 may receive a positive or negative π-phase setting current and induces a proportional secondary seed current for setting a clockwise or counter-clockwise π-state current in the superconducting loops of the memory circuit 2000. In the exemplary write circuit 2100 of FIG. 21, each of at least a subset of the memory circuits 2102 may comprise the exemplary memory circuit 2000 of FIG. 20, connected in a serial fashion along a write column line of the write circuit 2100 by connecting each second terminal "In_Out_2_π-Phase_Setting" of the memory circuit 2000 to each first terminal "In_Out_1_π-Phase_Setting," except at the ends of the write column line, where a column of memory circuits 2102 connects to a FET 2114 at a first end of the write column line WCL and to a resistor 2118 at a second end in the write column line WCL for setting a clockwise or counter-clockwise π-state current in the superconducting loops of the respective memory circuits 2102, and in particular, of a "selected" one of the memory circuits 2102.

It should be understood that this array-like embodiment, and other illustrative embodiments, do not require that the memory circuits 2102 be located at each intersection of a unique row and column pair. Moreover, the terms "row" and "column" lines are used to connote at least intersecting lines which may or may not be orthogonal everywhere. It is also to be appreciated that the terms "row" and "column" are merely intended to convey relative positions. For example, a "row" may become a "column" by rotating the circuit by 90 degrees.

Although not explicitly shown in FIG. 21, each of at least a subset of the memory circuits 2102 in the write circuit 2100 may further include at least one NFET switch 1904 for each memory circuit for controlling a write line segment current, $I_{WLS}$, conveyed by a corresponding write line segment WLS 2124 for writing (in the preferred embodiment, more particularly, for selecting to write) at least one corresponding MJJ 2122 (e.g., MJJ 2010 of FIG. 20), in one or more embodiments. Specifically, a first terminal of a second current source (not explicitly shown in FIG. 20 or 21, but rather shown as current source 1906 of FIG. 19), configured to generate the write line segment current $I_{WLS}$, is connected to first ends of the respective write line segments (e.g., WLS 2024), for example, via In_Out_1 of FIG. 19, associated with memory circuit A<1><1> 2102 through WLS for memory circuit Z<N><M> 2102. The second current source (e.g., current source 1906 of FIG. 19), which may comprise a single current source or a plurality of current sources, is preferably adapted to receive at least one control signal, Control_$I_{WLS}$ of FIG. 19 for enabling and/or controlling an amplitude, sign, and duration of the current $I_{WLS}$ generated by the second current source. Each of the NFET switches associated with the write line segments in the respective memory circuits 2102 has a first source/drain connected to a second end of a corresponding one of the write line segments, a second source/drain connected with a second terminal (e.g., terminal In_Out_2 of FIG. 19) of the second current source, and a gate adapted to receive one or more control signals.

When the second (write line segment) current source (e.g., current source 1906 of FIG. 19, thus not shown) is enabled for a write operation (e.g., by setting control signal Control_$I_{WLS}$ to a "1" (i.e., active) state), a write line segment current $I_{WLS}$ of a prescribed amplitude flow through a selected one of the write line segments, WLS for memory circuit A<1><1> 2102 through WLS for memory circuit Z<N><M> 2102, as enabled by activation of a corresponding one of the write segment line circuits, for example by turning on a corresponding NFET switch (1904 of FIG. 19) of the memory circuits 2102.

When the (global write column line) current source 2120 is enabled for a write operation (e.g., by setting control signal Control_$I_{Column_Source}$ to a "1" (i.e. active) state), which is enabled concurrently (or near concurrently) in time with activation of a second current source (providing the write line segment current $I_{WLS}$, as described in FIG. 19), the total (global) write column line current $I_{WCL\_T}$ divides into substantially equal positive currents (or substantially equal negative currents) within each write column line, associated with an enabled (Bi)CMOS switch/NFET circuit (e.g., NFET 2114$_A$ as appears on FIG. 21). In this regard, it is important to note that positive and negative current magnitudes can be different (because each memory circuit 2102, when preferably written independently of other memory circuits 2102, can be written with different currents sourced by the first and second current sources), which is beneficial to reliable writing of the MJJs within the memory cells 2000/2102 in light of their real, non-ideal magnetic switching characteristics. When the first source 2120 is enabled, currents $I_{Column<1>}$ through $I_{Column<M>}$ will flow through a plurality of their associated column lines, column line<1> through column line<M>, as coordinated by the control signals 2116$_A$ through 21162 of (Bi)CMOS switch/NFET circuits 2114$_A$ through 2114$_Z$ for managing currents that write one magnetic field selected MJJ ($H_{WLS}$) in the single memory circuit 2102 selected for a write operation, here enclosed by the dashed box (i.e., memory circuit<1><1> 2102).

The total column line current, $I_{WCL\_T}$, may be determined using the following expression:

$$I_{WCL\_T} = WCLN \times I_{Column},$$

where WCLN is the number of positive (or negative) flowing write column line currents ($I_{Column}$) associated with each write column (e.g., A through Z), and $I_{Column}$ represents a positive (or negative) π-Phase_Setting current flowing within a write column line (noted as "Column_Line" in FIG. 21). The total column line current $I_{WCL\_T}$ of FIG. 21 is divided into substantially equal column currents, $I_{Column}$ (i.e., one of $I_{Column<1>}$ through $I_{Column<M>}$), by the presence of resistors 2118 (which serve to "divide" the currents equally as known in the art of superconducting electronics). Again, these column currents induce π-Phase_Setting currents through transformer actions (induction) within each memory circuit 2102.

As explained with respect to FIG. 19, one MJJ associated with a corresponding memory circuit 2102 (e.g., the memory circuit 2000) can be selected at a time for a write operation from the entire set of MJJs. In the write circuit 2100 shown in FIG. 21, the gate voltages of each NFET 1904 of each memory circuit 2000 of FIG. 20 and of each NFETs 2114$_A$ through 2114$_Z$ of FIG. 21 can be controlled by shift registers. These gate voltages direct currents to flow where necessary to select a memory cell for a write operation (via $I_{WLS}$) and to deliver its state (via $I_{Column}$), respectively.

Enabling the NFET (e.g., NFET 1904 of FIGS. 19 and 20) of memory circuit A<1><1> by driving its gate high, while all other gates of the NFETs of memory circuits 2102 are held low, causes memory circuit A<1><1> to be write selected; the write circuit 1900 of FIG. 19 directs a write line segment current $I_{WLS}$ (which generates a magnetic field $H_{WLS}$ having at least an easy axis component) to select one of the memory circuits 2102 (shown here as memory circuit A<1><1>) from the entire array of memory circuits 2102 (shown here as memory circuit A<1><1> through memory circuit Z<N><M>) for a write operation by π-0-π transition induced potential energy barrier lowering. The column current $I_{Column}$ (precisely) induces a clockwise or counter-clockwise π-state current in the write selected memory circuit 2102 (e.g., memory circuit A<1><1>), setting its state. It is notable aspect of this embodiment of the invention that $I_{Column}$ flows through other memory circuits 2102 (e.g., memory circuit A<1><1> through memory circuit A<N><M>) without impacting their states.

Use of MJJs in Analog Circuits and to Support Three-State (Ternary) MJJ Superconducting Loops While methods and circuit embodiments have been described herein with respect to exemplary memory cell topologies and methods (e.g., 100 of FIG. 1 and 200 of FIG. 2), these exemplary memory cell topologies and methods are to be understood as illustrative and are not intended to impose limitations on the scope or spirit of the present disclosure.

Not only are Boolean circuits contemplated, but analog circuits are similarly contemplated. These analog circuits can find advantage by exploiting all of a set of ternary circulating currents available within a superconducting loop comprising an MJJ. The ternary currents may include: (i) a clockwise circulating current, enabled by the π-state of the MJJ; (ii) no circulating current (i.e., zero-circulating current or zero-current), characteristic of the zero-state of the MJJ; and (iii) a counter-clockwise circulating current, also enabled by the π-state of the MJJ. As depicted in FIG. 22A, a write circuit can have domain-tracking memory elements (e.g., MJJ domain(s) orientation attribute(s) and MJJ zero-state/zero-circulating current attribute), which can be used to identify all domain orientations and thus oversee/drive write transitions among ternary current levels in the superconducting loop(s).

Figure 22A:
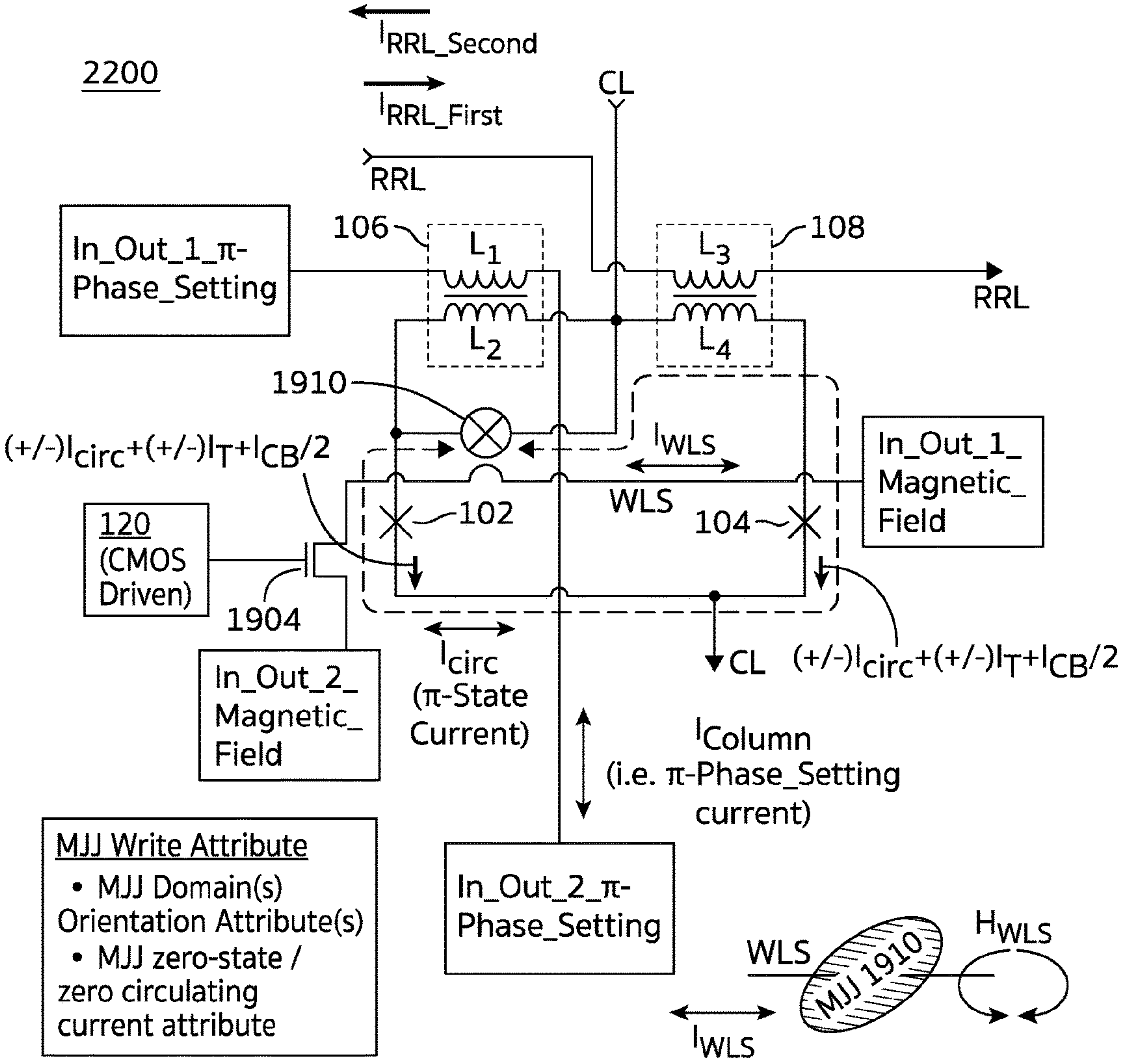
FIG. 22A is a schematic diagram depicting at least a portion of an exemplary MJJ-based memory circuit including at least one integrated write switch and an MJJ domain(s) orientation attribute(s) and an MJJ zero-state/zero circulating current attribute, according to one or more embodiments of the present invention.

FIG. 22A is a schematic diagram depicting at least a portion of an exemplary MJJ-based memory circuit 2200 including at least one integrated write switch and an MJJ domain(s) orientation attribute(s) and an MJJ zero-state/zero circulating current attribute, according to one or more embodiments of the invention. The MJJ-based memory circuit 2200 is similar to the illustrative MJJ-based memory circuit 2000 shown in FIG. 20, only modified to support ternary state operation. A ternary state operation of the memory circuit 2200 exploits the fact that the MJJ-based memory cell can contain at least one superconducting loop having an MJJ, which supports three stable states of circulating current at any given time; namely, a counter-clockwise circulating current, driven by the MJJ in a π-state, a clockwise circulating current, driven by the MJJ in a π-state, and no circulating, when the MJJ is in a zero-state, and each of these circulating current states may be assigned a unique ternary logical state that can be detected during a read operation of the memory circuit/cell.

It should be noted that, in all figures, the list "MJJ Write Attribute" may include write current direction, write current magnitudes, duration of their applications, and write current ramp rates, corresponding to a transition from a first circulating current and associated configuration to a second circulating current and associated configuration.

Specifically, the MJJ-based memory circuit 2200 has been modified to include at least one additional write attribute. In particular, the memory circuit 220, like the memory circuit 2000 shown in FIG. 20, includes an MJJ domain orientation attribute, which identifies which of the π-state configurations the MJJ is in, and further includes an MJJ zero-state (i.e., zero circulating current) attribute, which identifies the MJJ as being in a zero-state.

The read row line RRL can be used to apply a first read row line current, $I_{RRL\_First}$, and a second read row line current, $I_{RRL\_Second}$, opposite to the first read row line current, for performing first and second binary read operations, respectively (to described in further detail below).

Also shown in FIG. 22A is a circulating current loop comprising the Josephson junctions 102 and 104, the MJJ 1910, and the secondary inductor/coil $L_4$ of the transformers 108, respectively. During a read operation, the current circulating in this loop may be a clockwise circulating current, $(-/+)I_{circ}+(-/+)I_T$, a counter-clockwise circulating current, $(+/-)I_{circ}+(+/-)I_T$, or zero circulating current, $(-/+)I_T$, where $I_{circ}$ is the current circulating in the superconducting loop during standby $I_T$ is the current component coupled in through the transformer 108 during a read operation. $I_{CB}$ is a DC column bias current component, which does not circulate. The ternary state of the memory cell relates to the circulating current that is in the memory cell 2200 (i.e., clockwise circulating current, counter-clockwise circulating current, or zero circulating current), which can be detected by a read operation of the memory cell 2200.

Analog circuits exploiting ternary persistent currents (e.g., clockwise current, counter-clockwise current, and zero-current) in the manner described above, according to one or more embodiments of the invention, may be employed in any case in which a persistent bias is of use. Though other methods of coupling (e.g., galvanic) are contemplated and within the scope of embodiments of the invention, a typical case may be to couple the stored persistent current in a superconducting loop, which includes an MJJ and at least one inductor, coupled through a mutual inductance to another superconducting loop within a superconducting circuit. By way of example only and without limitation, one such application is to provide a flux bias to a superconducting quantum interference device (SQUID) loop in order to bias it with either a positive flux, a negative flux, or a zero flux, corresponding to clockwise circulating current, counter-clockwise circulating current, or zero circulating current (emphasis is ternary). SQUIDs are often used as detectors, and the resulting flux delta between the states may shift an operating threshold of the SQUID as desired. That is, the analog control could make the SQUID sensitive, insensitive, or partially sensitive to a signal, as desired.

Figure 22B:
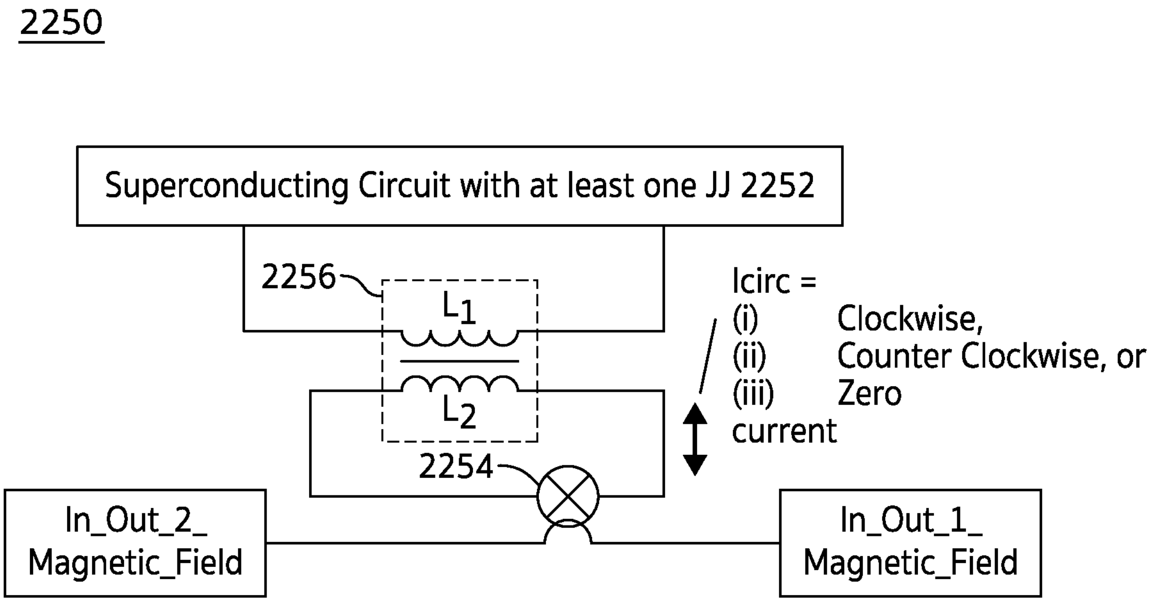
FIG. 22B is a schematic diagram depicting at least a portion of an exemplary MJJ-based memory circuit including an MJJ superconducting loop that induces a flux bias, associated with its three persistent currents defined by its MJJ, into a coupled superconducting circuit, according to one or more embodiments of the present invention.

By way of example only and without limitation, FIG. 22B is a schematic diagram depicting at least a portion of an exemplary MJJ-based memory circuit 2250 wherein a stored ternary persistent current in one superconducting loop is used to control the persistent current circulating in another superconducting loop, according to one or more embodiments of the invention. With reference to FIG. 22B, the MJJ-based memory circuit 2250 may include a first superconducting loop, comprising at least one MJJ 2254 and at least a first inductor, L1, coupled to the at least one MJJ 2254. The MJJ-based memory circuit 2250 may further include a second superconducting loop, comprising at least one Josephson junction (or a superconducting circuit including at least one Josephson junction) 2252 and at least a second inductor, L2, coupled to the at least one Josephson junction 2252. In one or more embodiments, the first and second inductors L1, L2 are included in and form components of a transformer 2256 configured such that there is a mutual inductance between the first and second inductors.

A persistent stored current (e.g., clockwise current, a counter-clockwise current, and a zero-current) circulating in the first superconducting loop can be set by imparting a magnetic field onto the MJJ 2254 using a write row current conveyed by a write row line, proximate to the MJJ 2254, which passes between terminals "In_Out_2_Magnetic_Field" and "In_Out_1_Magnetic_Field" of the memory circuit. At least one of a clockwise current, a counter-clockwise current, and a zero-current circulating in the first superconducting loop may be configured to control a current in the second superconducting loop comprising the second inductor L2 and Josephson junction 2252. The use of three current states (i.e., ternary)—clockwise current, counter-clockwise current, and zero-current—represents an important advantage compared to conventional binary current states, wherein only two differentiable currents exist.

Figure 23:
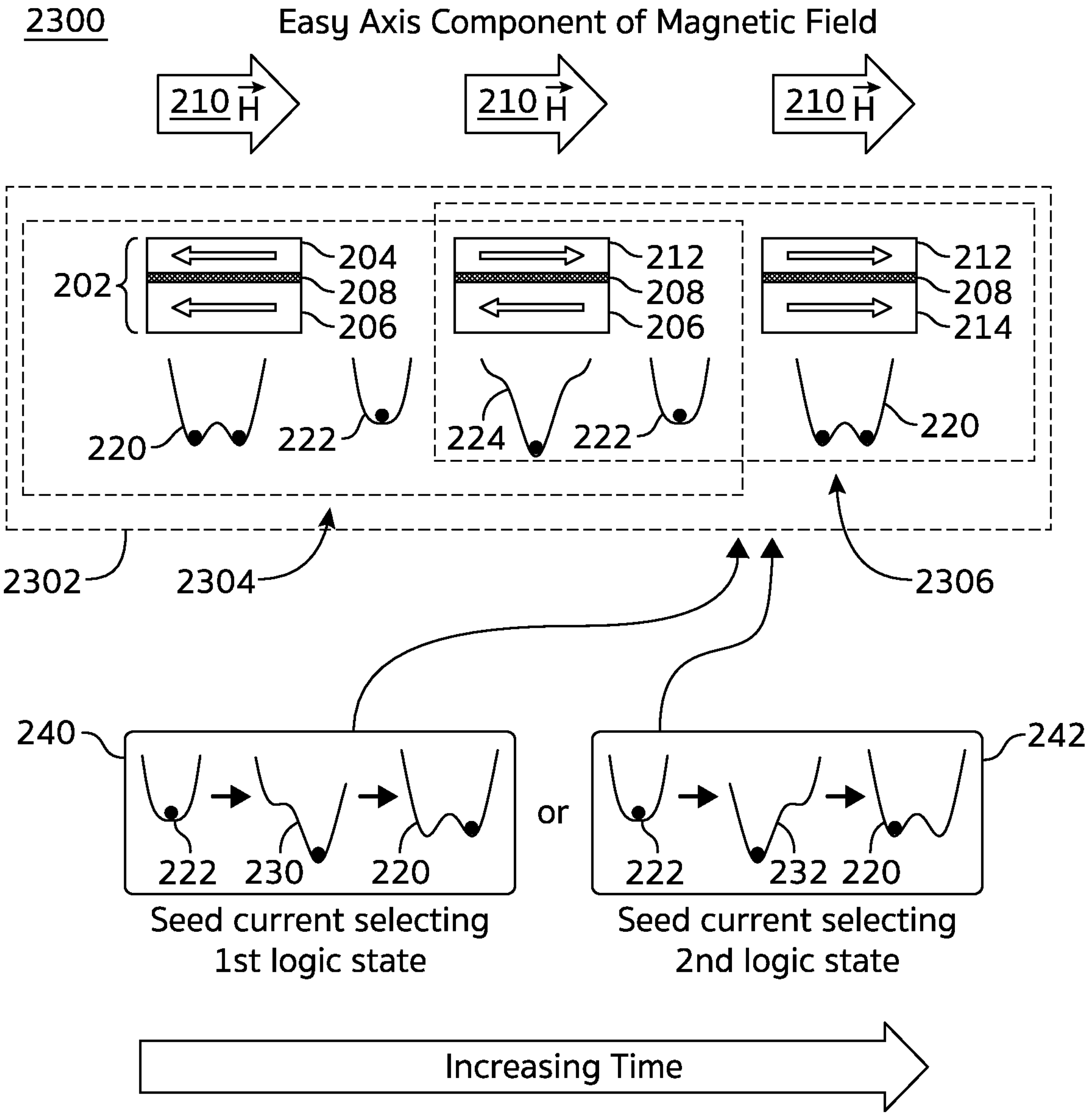
FIG. 23 is a multi-element diagram that describes an exemplary ternary write operation in a corresponding memory circuit (e.g., the illustrative memory circuit shown in FIG. 22A), according to one or more embodiments of the present invention.

FIG. 23 is a multi-element diagram that can be used to conceptually describe an exemplary ternary write operation in a corresponding memory circuit (e.g., the illustrative memory circuits 2200, 2250 shown in FIGS. 22A and 22B, respectively), according to one or more embodiments of the present invention. With reference to FIG. 23, three different configuration transitions of the MJJ are shown which support the writing of a persistent ternary-state memory current in a superconducting loop, for use in analog or digital circuits. The configuration transitions of the MJJ include: (i) a π-0-π configuration transition 2302 for setting a clockwise or counter-clockwise π-state current in a superconducting loop; (ii) a π-0 configuration transition 2304 for setting a zero-state current (i.e., no circulating current) in the superconducting loop from a clockwise or counter-clockwise π-state; and (iii) a 0-π configuration transition 2306 for setting a clockwise or counter-clockwise π-state current in the superconducting loop from a zero-state. The π-0-π configuration transition 2302 has already been described in sufficient detail with reference to the exemplary write method 200 of FIG. 2 and will therefore not be further described herein.

FIG. 23, like FIG. 2, shows an illustrative time progression of the soft (easy) layer, progressing from 204 to 212, and the hard (fixed) layer, progressing from 206 to 214, layers and their orientations of an exemplary spin-valve MJJ and the applied magnetic field (H) direction 210 (which can increase in strength (i.e., magnitude) with time). In FIG. 23, time increases from left to right. It should be understood that, in the illustrative write processes shown in FIG. 23, each view of a two/multilayer MJJ adheres to the following convention: a top layer (e.g., 204) is the soft (easy) layer, and a bottom layer (e.g., 206) is the hard (fixed) layer, with a separating layer 208 therebetween.

Shown below each magnetic field layer configuration is its corresponding lowest associated energy state(s) of an inductive loop containing the MJJ. On the left diagram showing an initial MJJ orientation 202, both layers 204, 206 have magnetic orientations pointing to the left, and a magnetic field 210, which opposes the initial MJJ orientation 202, is starting to be applied. In a stable state, the inductive loop can have two potential wells 220, only one of which can be occupied with a circulating current. As the top layer switches, a critical current $I_C$ goes down and results in a poorly localized minima 222, indicated by a single black dot. In the middle diagram, the soft layer 212 has a magnetic orientation pointing right while the fixed layer 206 does not change its magnetic orientation, indicating that the magnitude of the applied magnetic field 210 is sufficient to switch the soft layer 212 but not the hard layer 206. As indicated between the left and middle configuration diagrams, the energy levels 220, 222, 224 of the inductive loop flatten out. With the MJJ in a zero-state (energy diagram 224), there is no circulating current and there is only a minimum.

A π-0 configuration transition 2304 for setting a zero-state current (i.e., no circulating current) in a superconducting loop may be performed using the following exemplary method. With reference to FIG. 23, with the MJJ initially in a clockwise or counter-clockwise π-state, the writing of the MJJ can be accomplished by: (1) applying a rightward (easy axis) magnetic field 210 when the junction is initially in a left-left (LL) π-state (as shown in FIG. 23) or applying a leftward (easy axis) magnetic field when the junction is in a right-right (RR) π-state; and (2) increasing the magnetic field such that the soft and hard layers switch to a right-left (RL) or left-right (LR) (i.e., anti-parallel) configuration corresponding to a second ternary state; namely, a zero-state. In FIG. 23, only the soft layer switches from 204 to 212 orientations.

A 0-π configuration transition 2306 for setting a clockwise or counter-clockwise π-state current in a superconducting loop will now be described. As in the case for a π-0-π configuration transition 2302 (previously described in conjunction with FIG. 2) an applied easy axis field 210 in combination with an applied seed current (driven through transformer 106 and in the loop containing inductor L2 of transformer 106 and MJJ 1910 (elements of memory cell 2200 of FIG. 22A)) can generate a 0-π configuration transition 2306 corresponding to two of the ternary states of the MJJ. Specifically, assuming the MJJ is initially in a zero-state wherein the soft and hard layers may be anti-parallel (i.e., the soft layer 212 is oriented to the right and the hard layer 206 is oriented to the left, as shown in FIG. 23, or vice versa), the MJJ can be set to have a clockwise or counter-clockwise circulating current in its superconducting loop by: (1) applying an increasing magnetic field oriented rightward when the junction (MJJ) is initially in a right-left (RL) zero-state (as shown in FIG. 23) to switch the direction of the hard layer to a right-right (RR) configuration, or applying an increasing magnetic field oriented leftward when the junction is in a left-right (LR) zero-state to switch the direction of the hard layer to a left-left (LL) configuration, while coupling in a clockwise or counter-clockwise (positive or negative) seed current; (2) removing the magnetic field, leaving the junction in a π-state; and (3) trapping a circulating current, being concurrent with step (2), set by the "seed" current applied by the transformer 106 of FIG. 22A (forming essentially write bit lines) to the superconducting loops containing the MJJ, corresponding to a ternary state (either clockwise or counter-clockwise).

For the 0-π configuration transition for setting a clockwise or counter-clockwise π-state current in the superconducting loop, it is also contemplated that the MJJ can initially be in a zero-state wherein the soft and hard layers may be parallel to each other (i.e., the soft layer 212 and hard layer 206 are oriented to the right, as shown in FIG. 8, or the soft and hard layer 212, 206 are oriented to the left). In this scenario, the methodology for generating a 0-π configuration transition would be similar to that previously described above, but derived from FIG. 8 rather than FIG. 2. Specifically, with the MJJ in a zero-state, there can be no circulating current energy state without externally applied fields. The applied magnetic field is reversed in direction, opposite to the magnetic orientation of the soft and hard layers, so that the soft layer switches direction (e.g., from 814 to 804 as shown in FIG. 8) and becomes anti-parallel with respect to the hard layer, to thereby set the MJJ in a π-state.

It is to be appreciated that ternary write operations are restricted. In one or more embodiments, only one memory cell can be written into ternary states independently at a time due to the fact that $I_{WLS}$ writes the zero-state in any superconducting loops containing associated (i.e., field-coupled) MJJs. If more than one memory cell were selected at a time for a write operation, and one of the memory cells was written with a zero state (no circulating current), all other memory cells would also be written with a zero state. In other words, because of the zero-state writing, driven by the easy axis field, only one MJJ can be written at a time, so the underlying write selectivity enabled by the NFETs 1904 in FIG. 19 may be used. A row of memory cells would all get written to zero-state currents if the WLS were common to the cells in the row.

Ternary Read Operation Example

At the core of an exemplary ternary read operation of a memory circuit, according to one or more embodiments, is two passes of a binary read operation, which will be explained with respect to the illustrative memory circuit 2200 of FIG. 22A. A first binary read operation is configured to determine whether the circulating current, $I_{circ}$, is (i) a counter-clockwise current, or (ii) one of a zero current (i.e., no circulating current) or a clockwise current. A second binary read operation is configured to determine whether the circulating current, $I_{circ}$, is a clockwise current, or one of a zero current or a counter-clockwise current. As known in the art, during the binary read operations, measurements (i.e., determinations) are made by detecting, or not detecting, a transition of a Josephson junction (e.g., either JJ 102 or JJ 104 in FIG. 22A) to a voltage state when (or if) its critical current is exceeded.

To perform the first and second binary read operations, an external read circuit, such as, for example, the illustrative read-or-write-enabling circuit 1670 of FIG. 16C (notably, to achieve energy efficiency, as already explained with respect to the write operation). With reference to FIG. 22A, the write row line 1672 shown in FIG. 16C can be configured as a read row line RRL in the memory circuit 2200 and can be used to apply a first read row line current, $I_{RRL\_First}$, and a second read row line current, $I_{RRL\_Second}$, for performing the first and second binary read operations, respectively.

For detection of a counter-clockwise circulating current ($I_{circ}$) in the memory cell (e.g., included in memory circuit 2200 in FIG. 22A) during the first binary read operation, via driving a Josephson junction (e.g., JJ 102) into its voltage state (which may be arbitrarily associated with a logic "1" state), a positive current through the JJ 102 would be designed to exceed the critical current, $I_C$, of JJ 102 according to the following equation:

$$I_C \text{ (of } JJ\ 102) < |I_{circ}| + |I_T| + |I_{CB}/2|,$$

where $I_{circ}$ is the circulating current in the superconducting loop, $I_{CB}$ is the DC column bias current component, $I_T$ is a transformer current induced by the first read row line current, $I_{RRL\_First}$, and wherein the magnitude symbols "|", along with a mention of the positive current through the JJ 102, express the constituent current's sign/direction in the memory circuit 2200.

For the first binary read operation, if it is determined that the JJ 102 is not driven into a voltage state, either no current (zero-state) or a clockwise current (due to an MJJ in a π-state) is present in the memory cell.

For detection of a clockwise circulating current ($I_{circ}$) in the memory cell during the second binary read operation, via driving the Josephson junction (e.g., JJ 104) into its voltage state (which may be associated with a logic "1" state), a positive current through the JJ 104 would be designed to exceed the critical current, $I_C$, of JJ 104 according to the following equation:

$$I_C \text{ (of } JJ \text{ 104)} < |I_{circ}| + |I_T| + |I_{CB}/2|,$$

where, in a manner consistent with the exemplary case for detecting a counter-clockwise circulating current described above, $I_{circ}$ is the circulating current in the superconducting loop, $I_{CB}$ is the DC column bias current component, $I_T$ is a transformer current induced by the second read row line current, $I_{RRL\_Second}$, and wherein the magnitude symbols "|", along with a mention of the positive current through the JJ 104, express the constituent current's sign/direction in the memory circuit 2200.

For the second binary read operation, if it is determined that the JJ 104 is not driven into a voltage state, either no current (zero-state) or a counter-clockwise current (π-state) is present in the memory cell.

After both read operations, simple Boolean logic can be used to determine ternary states of the memory cell, corresponding to counter-clockwise current, clockwise current, and zero-current, from the binary read operations, according to one or more embodiments of the inventive concept.

Given the prior art, only exemplary embodiments of the inventive concept, which illustrate certain novel aspects of circuits and/or methods, have been described herein. With the embodiments of superconducting circuits and hybrid superconducting and (Bi)CMOS circuits described in the present disclosure, a fundamental novelty of those embodiments—representing a departure from conventional approaches—may relate to mid-cycle, or every other cycle, current direction/polarity reversal for facilitating easy-axis-based π-0-π state transitions, which is expressed in the exemplary circuits and methods. Specifically, a tracking mechanism for current direction/polarity reversal used to induce π-0-π state transitions, by generating at least an easy axis field component on at least one MJJ, has thus been introduced. Write circuits such as those having external current sources which direct currents to the MJJ-memory cells can be devised, as will become apparent to those skilled in the art given the teachings herein. These circuits may require additional memory allocated to track necessary current direction/polarity reversals to implement the write methods according to embodiments of the invention for memory arrays of any kind (e.g., RAM, CAM, PLA, ROM and FPGA).

In the present disclosure, the term "exemplary" is used herein to mean "serving as an example, instance, or illustration." Any embodiment or implementation of the present subject matter described herein as "exemplary" is not necessarily to be construed as preferred or advantageous over other embodiments or implementations.

The terms like "at least one" and "one or more" may be used interchangeably or in combination throughout the description. As may be used herein, the expression "and/or" is intended to include any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Spatially descriptive terms such as "above," "below," "over," "under," "upper" and "lower" may be used herein to indicate a position of elements, structures or features relative to one another as illustrated in the figures, rather than absolute position. Thus, the semiconductor device or die according to embodiments of the invention may be otherwise oriented (e.g., rotated 90 degrees or at other orientations), and the spatially relative descriptions used herein may be interpreted accordingly.

It will also be understood that when an element such as a layer, region or substrate is referred to as being "atop," "above," "on" or "over" another element, it is broadly intended that the element be in direct contact with the other element or intervening elements can also be present. In contrast, when an element is referred to as being "directly on" or "directly over" another element, it is intended that there are no intervening elements present. Likewise, it should be appreciated that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

It will be understood that, although ordinal terms such as "first," "second," etc., may be used herein to describe various elements, these elements should not be limited by such terms. These terms are only used to distinguish one element from another and should not be interpreted as conveying any particular order of the elements with respect to one another. For example, a first element could be termed a second element, and, similarly, a second element could be termed a first element, without departing from the scope of the present disclosure. As may be used herein, the term "and/or" when used in conjunction with an associated list of elements is intended to include any and all combinations of one or more of the associated listed elements. For example, the phrase "A, B and/or C" is intended to include element A alone, element B alone, element C alone, or all combinations and permutations of elements A, B and C.

The terminology used herein is for the purpose of describing particular embodiments of the inventive concepts only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," as used herein, are intended to specify the presence of stated features, integers, steps, operations, elements, and/or components, but do not necessarily preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

While the inventive concept has been particularly shown and described with reference to example embodiments thereof, it will be understood that various changes in form and details may be made therein without departing from the spirit and scope of the appended claims.

What is claimed is:

1. A write circuit for writing state into at least one memory cell in a magnetic Josephson junction (MJJ)-based memory circuit, the write circuit comprising:

a first current source, the first current source configured to generate a first current for imparting an easy axis magnetic field component on an MJJ in at least one selected memory cell among a plurality of memory cells in the memory circuit during a write operation; and a second current source, the second current source configured to generate a second current that induces a third current in the at least one selected memory cell that passes through the MJJ in the at least one selected memory cell during the write operation, the third current being a seed current for setting a π-state current of the MJJ in at least one superconducting loop of the at least one selected memory cell for a subsequent read operation, wherein at least the first current source is configured such that, the MJJ in the at least one selected memory cell, before the write operation, is in a π-state, in which a clockwise or counter-clockwise current circulates in a superconducting loop in the at least one memory cell, transitions, during the write operation, to a zero-state, in which no current circulates in the superconducting loop, and is back in the π-state after the write operation is completed.

2. The write circuit according to claim 1, further comprising a control circuit coupled to at least the first current source, the control circuit being configured to control a direction of the first current to thereby control a direction of the easy axis field component imparted on the MJJ in the at least one selected memory cell.

3. The write circuit according to claim 2, wherein the control circuit is configured to alternate the direction of the first current on alternate write cycles.

4. The write circuit according to claim 2, wherein the control circuit is configured to alternate the direction of the first current within a same write operation.

5. The write circuit according to claim 2, wherein the control circuit is configured to alternate a direction of the first current every other write operation.

6. The write circuit according to claim 2, wherein the control circuit is configured:

to receive at least one of (i) a first attribute indicating a domain orientation of the MJJ in the at least one memory cell when the MJJ is in the π-state, and (ii) a second attribute indicating there is no circulating current when the MJJ is in the zero-state; and to control the direction of the easy axis field component imparted on the MJJ in the at least one selected memory cell as a function of at least one of the first and second attributes.

7. The write circuit according to claim 2, wherein the control circuit is configured to control the second current source to thereby control the third current being a seed current for setting the π-state current during the transition of the MJJ from at least one of (i) the zero-state to the π-state, and (ii) the π-state through the 0-state to the π-state.

8. The write circuit according to claim 2, wherein during the write operation, the control circuit is configured:

to control the first current source to apply the first current in a first direction for applying an easy axis magnetic field to the MJJ in the selected memory cell, the MJJ comprising a soft layer and a hard layer arranged in a stacked structure, the MJJ being configured in the π-state before the write operation, wherein magnetic domain orientations of the soft and hard layers are parallel with respect to each other, to increase a magnitude of the applied first current in the first direction such that the MJJ transitions to the zero-state, wherein the magnetic domain orientation of the soft layer switches in direction from its orientation in the π-state before the write operation of the MJJ;

to control the second current source to couple into the superconducting loop including the MJJ a clockwise or counter-clockwise seed current while concurrently increasing the magnitude of the applied first current in the first direction, such that the MJJ transitions back to the π-state, wherein the magnetic domain orientation of the hard layer switches in direction from its original orientation before the write operation; and to control the first and second current sources to remove the easy axis magnetic field applied to the MJJ in the selected memory cell and to remove the seed current coupled into the superconducting loop, respectively, such that the MJJ remains configured in the π-state, wherein the magnetic domain orientations of the soft and hard layers are aligned with one another, and wherein a circulating current is trapped in the superconducting loop including the MJJ, a direction of the circulating current being a function of a direction of the seed current coupled into the superconducting loop.

9. The write circuit according to claim 8, wherein during the write operation, the control circuit is further configured to control the first and second current sources such that the respective magnetic domain orientations of the soft and hard layers of the MJJ in the π-state before the write operation are opposite the first direction of the applied easy axis magnetic field, and wherein the control circuit is further configured:

to switch a direction of the applied easy axis magnetic field generated by the first current source to a second direction, opposite the first direction, after the MJJ transitions to the zero-state; and to increase the magnitude of the applied easy axis magnetic field in the second direction, while concurrently coupling into the superconducting loop the clockwise or counter-clockwise seed current, until the MJJ transitions back to the π-state, wherein the respective magnetic domain orientations of the soft and hard layers are in a same direction relative to their respective magnetic domain orientations before the write operation.

10. The write circuit according to claim 2, wherein during the write operation, the control circuit is configured to control the first current source such that the respective magnetic domain orientations of soft and hard layers of the MJJ in the π-state after the write operation are opposite relative to the respective magnetic domain orientations of the soft and hard layers of the MJJ in the π-state before the write operation.

11. The write circuit according to claim 1, wherein the control circuit is configured to control the first and second current sources to apply an easy axis magnetic field and a seed current, respectively, to the MJJ in the selected memory cell such that a domain orientation of the MJJ in the π-state prior to the write operation is the same as the domain orientation of the MJJ in the π-state after the write operation has completed.

12. The write circuit according to claim 1, wherein the control circuit is configured to control the first and second current sources to apply an easy axis magnetic field and a seed current, respectively, to the MJJ in the selected memory cell such that a domain orientation of the MJJ in the π-state prior to the write operation is different relative to the domain orientation of the MJJ in the π-state after the write operation has completed.

13. The write circuit according to claim 1, wherein all components in the write circuit are superconducting elements.

14. The write circuit according to claim 1, wherein components in the write circuit are a hybrid combination of superconducting elements and non-superconducting elements.

15. The write circuit according to claim 1, further comprising a control circuit coupled to at least the first current source, the control circuit being configured:

to cause the first current source to apply an easy axis magnetic field oriented in a first direction to the MJJ in the at least one selected memory cell, the MJJ comprising a soft layer and a hard layer arranged in a stacked structure, the selected MJJ being configured in a π-state, in which a clockwise or counter-clockwise current circulates in a superconducting loop including the MJJ, wherein respective magnetic domain orientations of the soft and hard layers are parallel with respect to one another;

to cause the first current source to increase a magnitude of the applied easy axis magnetic field in the first direction such that the MJJ transitions to a zero-state, in which no current circulates in the superconducting loop, wherein the respective magnetic domain orientations of the soft and hard layers are anti-parallel with respect to each other;

to cause the first current source to further increase the magnitude of the applied easy axis magnetic field in the first direction and to concurrently cause the second current source to couple into the superconducting loop a clockwise or counter-clockwise seed current, such that the MJJ transitions back to the π-state, wherein the respective magnetic domain orientations of the soft and hard layers are parallel with respect to each other; and to cause the first current source to remove the applied easy axis magnetic field such that the MJJ remains configured in the π-state, wherein the respective magnetic domain orientations of the soft and hard layers are aligned with one another, wherein a circulating current is trapped in the superconducting loop, a direction of the circulating current being a function of a direction of the seed current coupled into the superconducting loop.

16. A write circuit for writing state into at least one memory cell in a magnetic Josephson junction (MJJ)-based memory circuit, the write circuit comprising:

a first current source, the first current source configured to generate a first current for imparting an easy axis magnetic field component on an MJJ in at least one selected memory cell among a plurality of memory cells in the memory circuit during a write operation;

a second current source, the second current source configured to generate a second current that induces a third current in the at least one selected memory cell that passes through the MJJ in the at least one selected memory cell during the write operation, the third current being a seed current for setting a π-state current of the MJJ in at least one superconducting loop of the at least one selected memory cell for a subsequent read operation; and a control circuit coupled to at least the first current source, the control circuit being configured to control a direction of the first current to thereby control a direction of the easy axis field component imparted on the MJJ in the at least one selected memory cell, wherein at least the first current source is configured such that, during the write operation, the MJJ in the at least one selected memory cell transitions: (i) from a π-state, in which a clockwise or counter-clockwise current circulates in a superconducting loop in the at least one memory cell, to a zero-state, in which no current circulates in the superconducting loop, back to the π-state; or (ii) from the zero-state to the π-state; or (iii) from the π-state to the zero-state, wherein the control circuit comprises one or more flip-flop circuits, each of the flip-flop circuits being associated with at least one of the plurality of memory cells in the memory circuit and configured to receive at least a portion of a decoded write address supplied to the flip-flop circuit and to generate an output control signal supplied to the control circuit, the output control signal being configured such that a change in direction of the easy axis field is triggered after completion of, or within, a write cycle.

17. The write circuit according to claim 16, wherein each of at least a subset of the flip-flop circuits comprises:

a first delay element, the first delay element configured to receive the portion of the decoded write address supplied thereto and to generate a first output signal that is an inverted and delayed version of the portion of the decoded write address;

a second delay element, the second delay element configured to receive the first output signal and to generate a second output signal that is a delayed version of the first output signal;

a NOR gate configured to receive the first output at a first input, to receive the second output signal at a second input, and to generate a third output signal; and a flip-flop configured to receive the third output signal and to generate the output control signal.

18. The write circuit according to claim 16, wherein each of at least a subset of the flip-flop circuits comprises at least one of CMOS circuits and superconducting circuits.

19. A write circuit for writing state into at least one memory cell in a magnetic Josephson junction (MJJ)-based memory circuit, the write circuit comprising:

a first current source, the first current source configured to generate a first current for imparting an easy axis magnetic field component on an MJJ in at least one selected memory cell among a plurality of memory cells in the memory circuit during a write operation;

a second current source, the second current source configured to generate a second current that induces a third current in the at least one selected memory cell that passes through the MJJ in the at least one selected memory cell during the write operation, the third current being a seed current for setting a π-state current of the MJJ in at least one superconducting loop of the at least one selected memory cell for a subsequent read operation; and at least one non-superconducting decoder circuit configured to receive at least a portion of an encoded non-superconducting write address signal and to generate a decoded address signal, wherein at least the first current source is configured such that, during the write operation, the MJJ in the at least one selected memory cell transitions: (i) from a π-state, in which a clockwise or counter-clockwise current circulates in a superconducting loop in the at least one memory cell, to a zero-state, in which no current circulates in the superconducting loop, back to the π-state; or (ii) from the zero-state to the π-state; or (iii) from the π-state to the zero-state.

20. The write circuit according to claim 19, further comprising a conversion circuit configured to receive at least a portion of a superconducting encoded write address signal and to generate the encoded non-superconducting write address signal supplied to the non-superconducting decoder circuit.

* * * * *